United States Patent
Das et al.

(10) Patent No.: US 7,230,964 B2
(45) Date of Patent: Jun. 12, 2007

(54) LITHOGRAPHY LASER WITH BEAM DELIVERY AND BEAM POINTING CONTROL

(75) Inventors: Plash P. Das, Vista, CA (US); R. Kyle Webb, Escondido, CA (US); Marco Giovanardi, Melrose, MA (US); Gregory Francis, Escondido, CA (US); Huckleberry B. Dorn, Boston, MA (US); Kyle P. Erlandsen, Auburndale, MA (US); John W. Nelson, Algodones, NM (US); Richard L. Sandstrom, Encinitas, CA (US); Alexander I. Ershov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/425,361

(22) Filed: Apr. 29, 2003

(65) Prior Publication Data

US 2004/0022291 A1 Feb. 5, 2004

Related U.S. Application Data

(63) Continuation-in-part of application No. 10/255,806, filed on Sep. 25, 2002, now Pat. No. 6,704,340, which (Continued)

(60) Provisional application No. 60/443,673, filed on Jan. 28, 2003.

(51) Int. Cl.
*H01S 3/22* (2006.01)
*G21G 5/00* (2006.01)

(52) U.S. Cl. .................................. 372/55; 250/492.1

(58) Field of Classification Search ............ 372/55–57, 372/109, 23; 355/67, 30; 398/79; 359/487, 359/341.3, 614; 219/121.72, 121.61, 121; 250/205, 492.1

See application file for complete search history.

(56) References Cited

U.S. PATENT DOCUMENTS 4,223,279 A 9/1980 Bradford, Jr. et al. ..... 331/94.5

(Continued)

FOREIGN PATENT DOCUMENTS

| DE | 199603685 | 12/1999 | ..................... 7/20 |
| JP | 410003045 | * 1/1998 | |

*Primary Examiner*—Don Wong
*Assistant Examiner*—Hung Tran Vy
(74) *Attorney, Agent, or Firm*—William C. Cray

(57) ABSTRACT

The present invention provides a modular high repetition rate ultraviolet gas discharge laser light source with a beam delivery to a production line machine. The system includes an enclosed and purged beam path with beam pointing control for delivery the laser beam to a desired location such as the entrance port of the production line machine. Preferred embodiments include equipment for beam attenuation, equipment for automatic feedback beam alignment and equipment for accurate optics module positioning at installation and during maintenance. In preferred embodiments, the production line machine is a lithography machine and two separate discharge chambers are provided, one of which is a part of a master oscillator producing a very narrow band seed beam which is amplified in the second discharge chamber. This MOPA system is capable of output pulse energies approximately double the comparable single chamber laser system with greatly improved beam quality. A pulse stretcher more than doubles the output pulse length resulting in a reduction in pulse power (mJ/ns) as compared to prior art laser systems. This preferred embodiment is capable of providing illumination at a lithography system wafer plane which is approximately constant throughout the operating life of the lithography system, despite substantial degradation of optical components.

8 Claims, 50 Drawing Sheets

Related U.S. Application Data is a continuation-in-part of application No. 10/233,253, filed on Aug. 30, 2002, now Pat. No. 6,704,339, which is a continuation-in-part of application No. 10/141,216, filed on May 7, 2002, now Pat. No. 6,693,939, which is a continuation-in-part of application No. 10/036,727, filed on Dec. 21, 2001, now Pat. No. 6,865,210, which is a continuation-in-part of application No. 10/036,676, filed on Dec. 21, 2001, now Pat. No. 6,882,674, which is a continuation-in-part of application No. 10/006,913, filed on Nov. 29, 2001, now Pat. No. 6,535,531, which is a continuation-in-part of application No. 10/000,991, filed on Nov. 14, 2001, now Pat. No. 6,795,474, which is a continuation-in-part of application No. 09/943,343, filed on Aug. 29, 2001, now Pat. No. 6,567,450, which is a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/837,150, filed on Apr. 18, 2001, now Pat. No. 6,504,860, which is a continuation-in-part of application No. 09/829,475, filed on Apr. 9, 2001, now Pat. No. 6,765,945.

(56) References Cited

U.S. PATENT DOCUMENTS

| | | | | |
|---|---|---|---|---|
| 4,398,806 A | * | 8/1983 | Bennett et al. | 359/487 |
| 4,455,658 A | | 6/1984 | Sutter et al. | 372/38 |
| 4,695,701 A | * | 9/1987 | Monteith et al. | 219/121.79 |
| 4,698,483 A | * | 10/1987 | Marinoni et al. | 219/121.78 |
| 4,959,840 A | | 9/1990 | Akins et al. | 372/57 |
| 5,023,884 A | | 6/1991 | Akins et al. | 372/57 |
| 5,025,445 A | | 6/1991 | Anderson et al. | 372/20 |
| 5,025,446 A | | 6/1991 | Kuizenga | 372/21 |
| 5,189,678 A | | 2/1993 | Ball et al. | 372/28 |
| 5,221,823 A | * | 6/1993 | Usui | 219/121.78 |
| 5,309,456 A | | 5/1994 | Horton | 372/25 |
| 5,313,481 A | | 5/1994 | Cook et al. | 372/37 |
| 5,315,611 A | | 5/1994 | Ball et al. | 372/56 |
| 5,329,350 A | * | 7/1994 | Wright et al. | 356/218 |
| 5,343,489 A | | 8/1994 | Wangler | 372/93 |
| 5,359,620 A | | 10/1994 | Akins | 372/58 |
| 5,448,580 A | | 9/1995 | Birx et al. | 372/38 |
| 5,471,965 A | | 12/1995 | Kapich | 123/565 |
| 5,559,584 A | | 9/1996 | Miyaji et al. | 355/73 |
| 5,661,748 A | | 8/1997 | Zahavi et al. | 372/108 |
| 5,771,258 A | | 6/1998 | Morton et al. | 372/57 |
| 5,771,260 A | * | 6/1998 | Elliott et al. | 372/109 |
| 5,811,753 A | * | 9/1998 | Weick et al. | 219/121.78 |
| 5,852,621 A | | 12/1998 | Sandstrom | 372/25 |
| 5,863,017 A | | 1/1999 | Larson et al. | 248/176.1 |
| 5,953,360 A | | 9/1999 | Vitruk et al. | 372/87 |
| 5,978,394 A | | 11/1999 | Newman et al. | 372/32 |
| 5,982,800 A | | 11/1999 | Ishihara et al. | 372/57 |
| 5,991,324 A | | 11/1999 | Knowles et al. | 372/57 |
| 6,005,879 A | | 12/1999 | Sandstrom et al. | 372/25 |
| 6,014,398 A | | 1/2000 | Hofmann et al. | 372/60 |
| 6,016,325 A | | 1/2000 | Ness et al. | 372/38 |
| 6,018,537 A | | 1/2000 | Hofmann et al. | 372/25 |
| 6,028,880 A | | 2/2000 | Carlesi et al. | 372/58 |
| 6,067,311 A | | 5/2000 | Morton et al. | 372/57 |
| 6,094,448 A | | 7/2000 | Fomenkov et al. | 372/102 |
| 6,104,735 A | | 8/2000 | Webb | 372/37 |
| 6,128,323 A | | 10/2000 | Myers et al. | 372/38 |
| 6,151,349 A | | 11/2000 | Gong et al. | 372/58 |
| 6,163,010 A | * | 12/2000 | Kobsa | 219/121.61 |
| 6,164,116 A | | 12/2000 | Rice et al. | 73/1.72 |
| 6,188,710 B1 | | 2/2001 | Besaucele et al. | 372/60 |
| 6,192,064 B1 | | 2/2001 | Algots et al. | 372/99 |
| 6,208,674 B1 | | 3/2001 | Webb et al. | 372/57 |
| 6,208,675 B1 | | 3/2001 | Webb | 372/58 |
| 6,212,211 B1 | | 4/2001 | Azzola et al. | 372/33 |
| 6,219,368 B1 | | 4/2001 | Govorkov | 372/59 |
| 6,240,117 B1 | | 5/2001 | Gong et al. | 372/58 |
| 6,317,447 B1 | | 11/2001 | Partlo et al. | 372/57 |
| 6,330,261 B1 | | 12/2001 | Ishihara et al. | 372/38.1 |
| 6,359,922 B1 | | 3/2002 | Partlo et al. | 372/58 |
| 6,373,623 B1 | * | 4/2002 | Ohshima et al. | 359/341.3 |
| 6,407,836 B1 | * | 6/2002 | Fukushima | 398/178 |
| 6,414,979 B2 | | 7/2002 | Ujazdowski et al. | 372/87 |
| 6,448,534 B1 | * | 9/2002 | Kobsa | 219/121.72 |
| 6,466,365 B1 | | 10/2002 | Maier et al. | 359/355 |
| 6,477,192 B2 | * | 11/2002 | Govorkov et al. | 372/57 |
| 6,477,193 B2 | | 11/2002 | Oliver et al. | 372/58 |
| 6,497,490 B1 | * | 12/2002 | Miller et al. | 359/614 |
| 6,501,061 B1 | * | 12/2002 | Kitai et al. | 250/205 |
| 6,507,422 B1 | * | 1/2003 | Fukushima | 398/79 |
| 6,538,716 B2 | * | 3/2003 | Mulkens et al. | 355/30 |
| 6,577,380 B1 | * | 6/2003 | Sposili et al. | 355/67 |
| 6,625,191 B2 | | 9/2003 | Knowles et al. | 372/55 |
| 6,735,232 B2 | * | 5/2004 | Schroeder et al. | 372/57 |
| 6,795,456 B2 | * | 9/2004 | Scaggs | 372/23 |
| 6,868,106 B1 | * | 3/2005 | Vogler | 372/57 |
| 6,907,058 B2 | * | 6/2005 | Vogler et al. | 372/55 |
| 2001/0028443 A1 | | 10/2001 | Yabu | 355/30 |
| 2002/0021730 A1 | * | 2/2002 | Schroeder et al. | 372/57 |
| 2002/0021735 A1 | | 2/2002 | Govorkov et al. | 372/105 |
| 2002/0044586 A1 | | 4/2002 | Myers et al. | 372/57 |
| 2002/0051126 A1 | | 5/2002 | Ogata | 355/53 |
| 2002/0105994 A1 | | 8/2002 | Partlo et al. | 372/22 |
| 2003/0058429 A1 | * | 3/2003 | Schriever | 355/133 |
| 2003/0095580 A1 | * | 5/2003 | Govorkov et al. | 372/57 |
| 2004/0160583 A1 | * | 8/2004 | Hubertus Mulkens et al. | 355/30 |

* cited by examiner

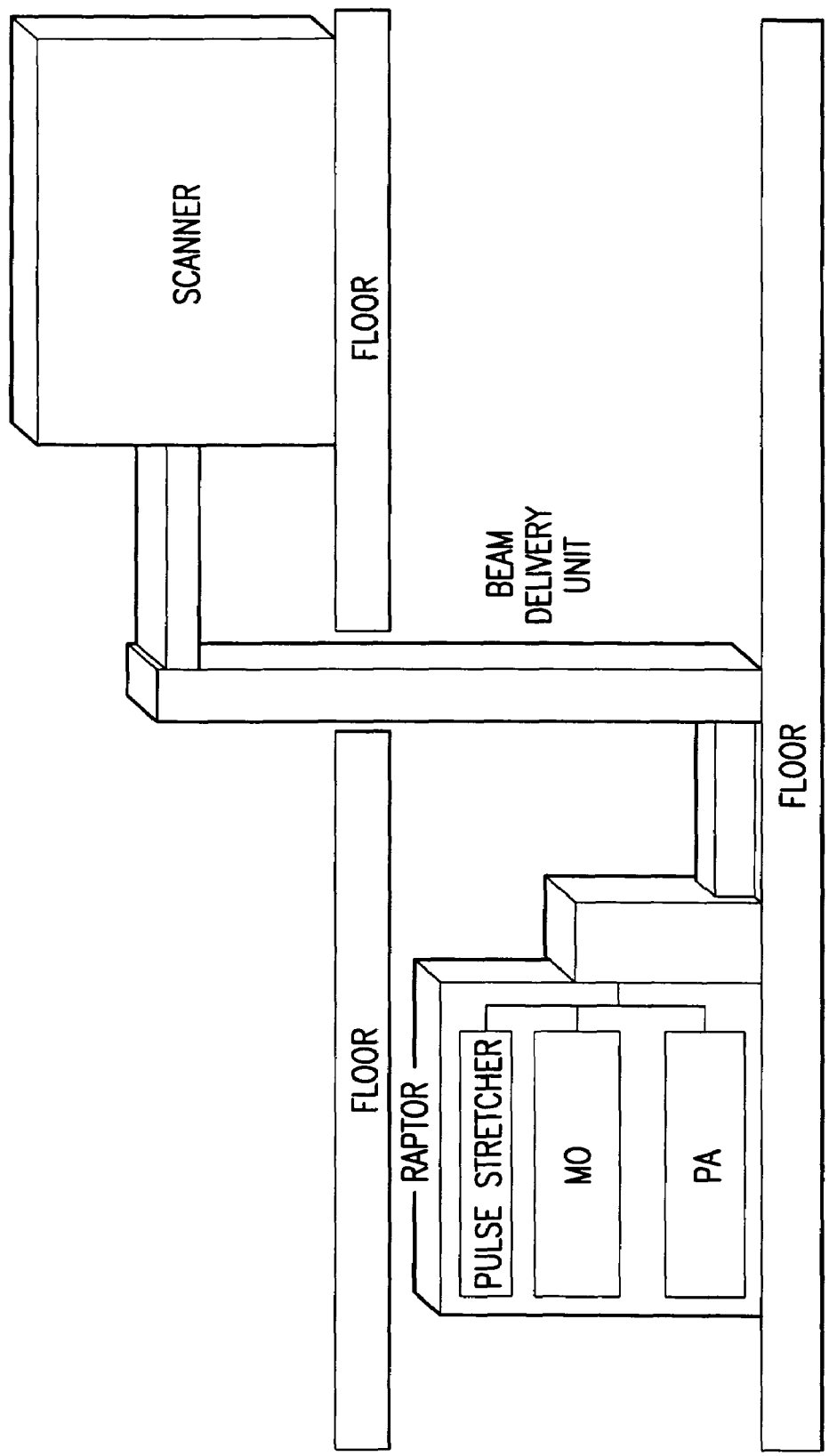

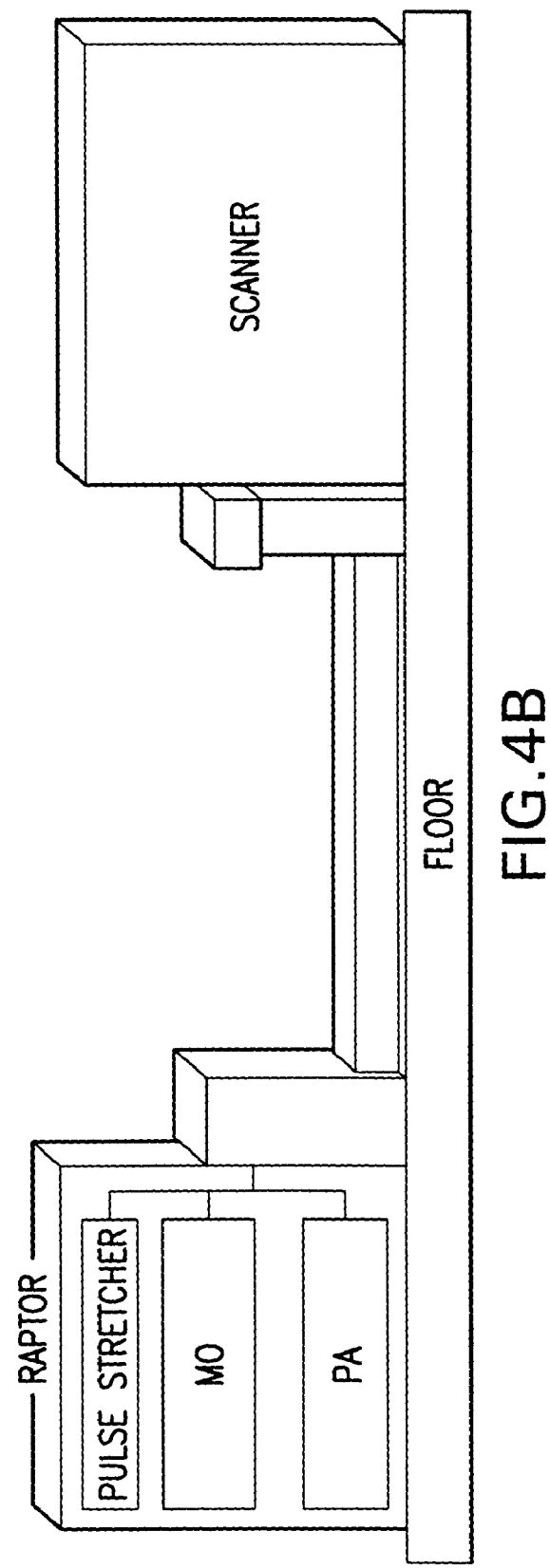

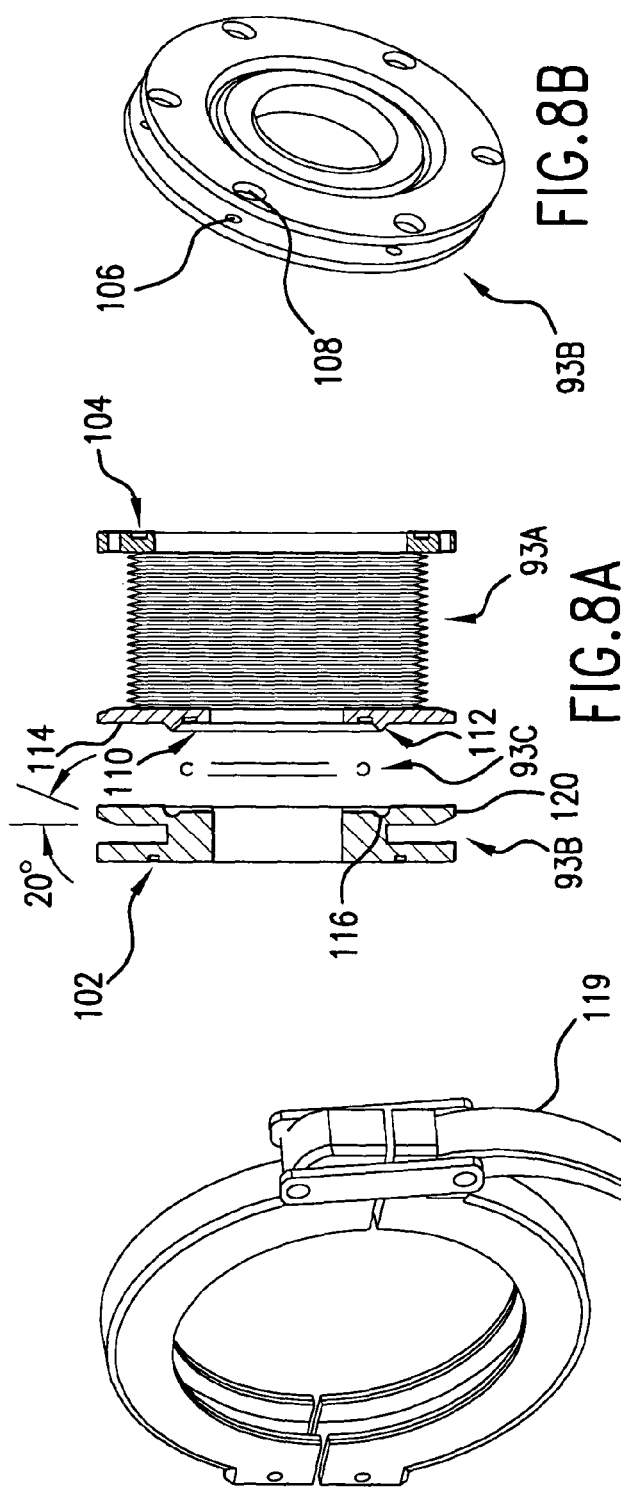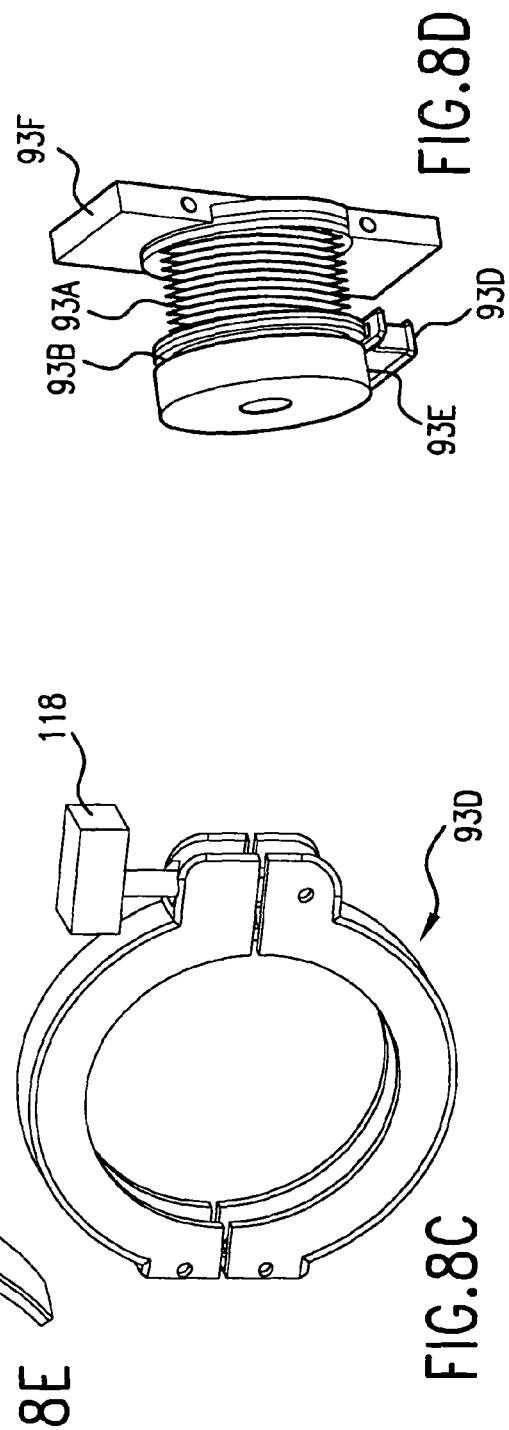

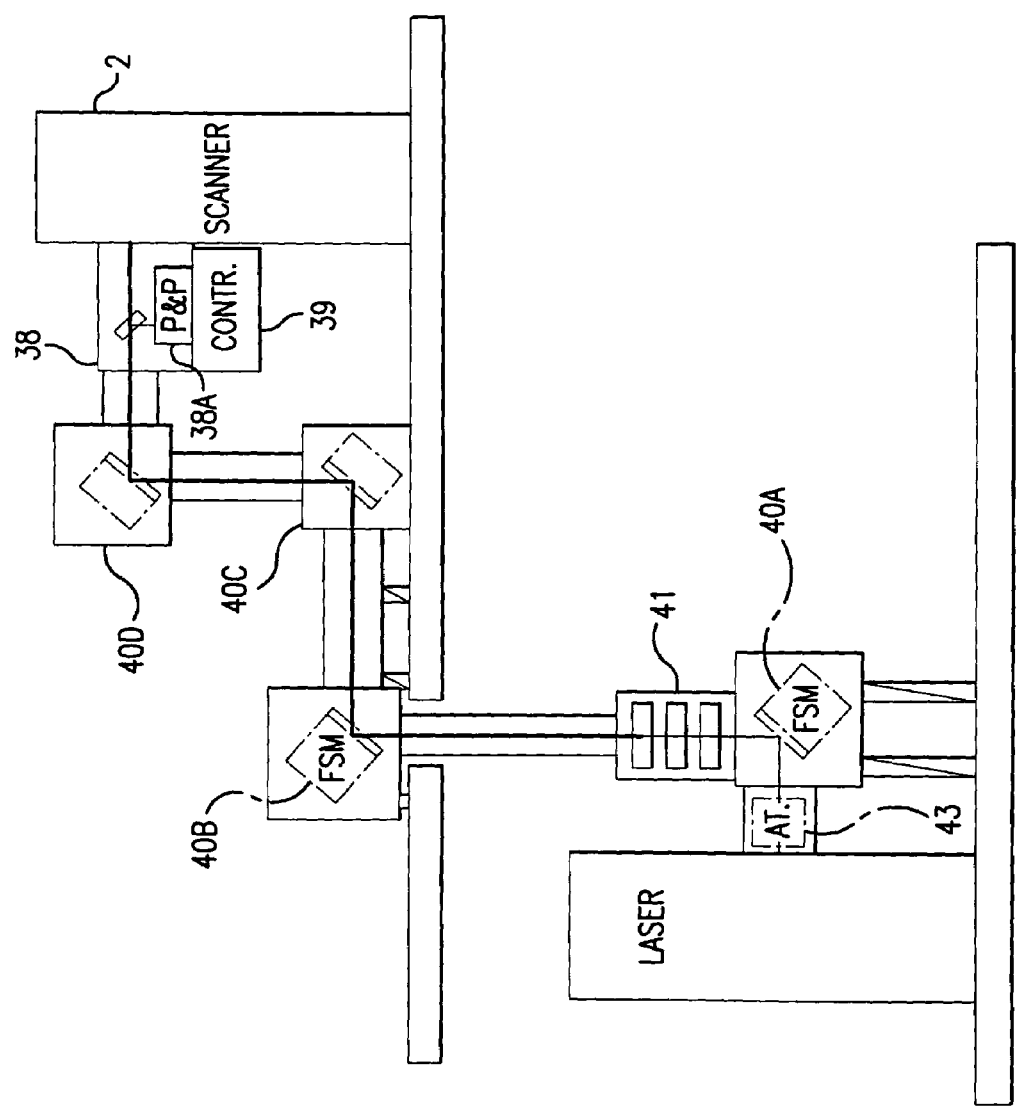

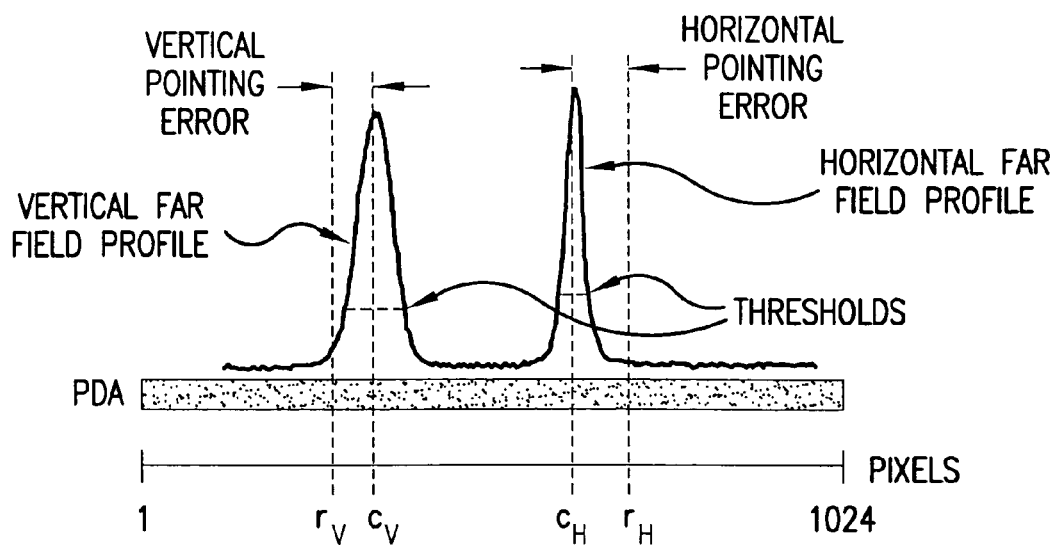
FIG.10C
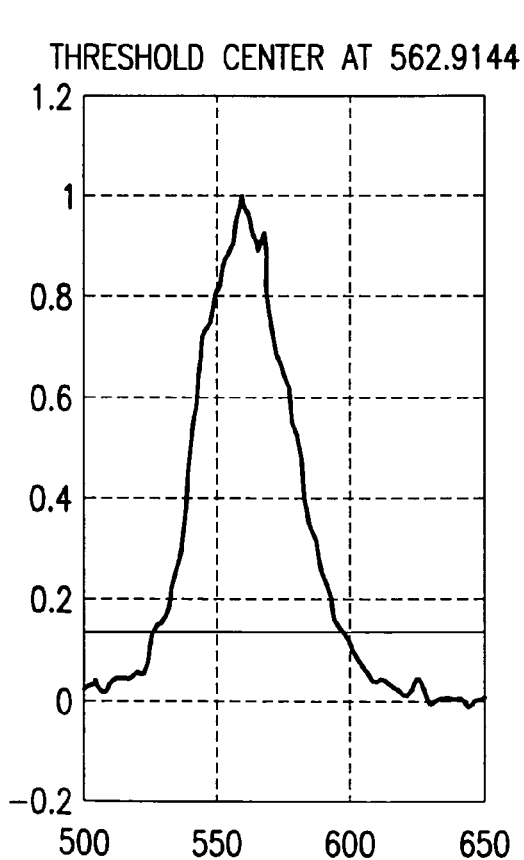
FIG.10D1
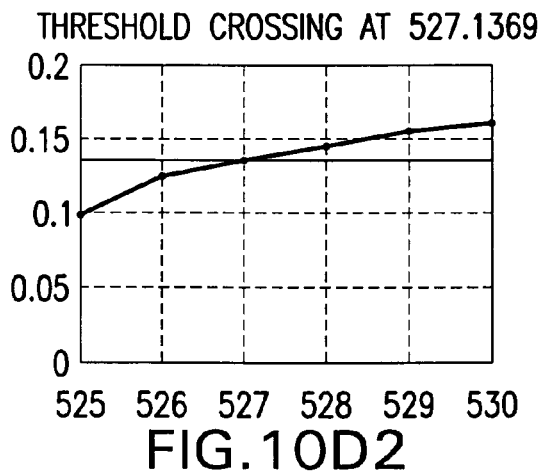
FIG.10D2
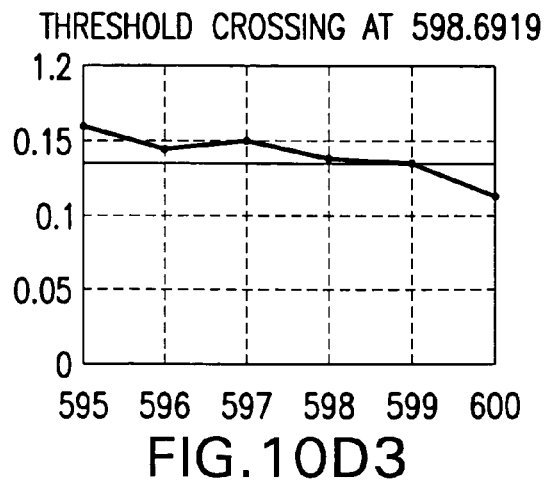
FIG.10D3

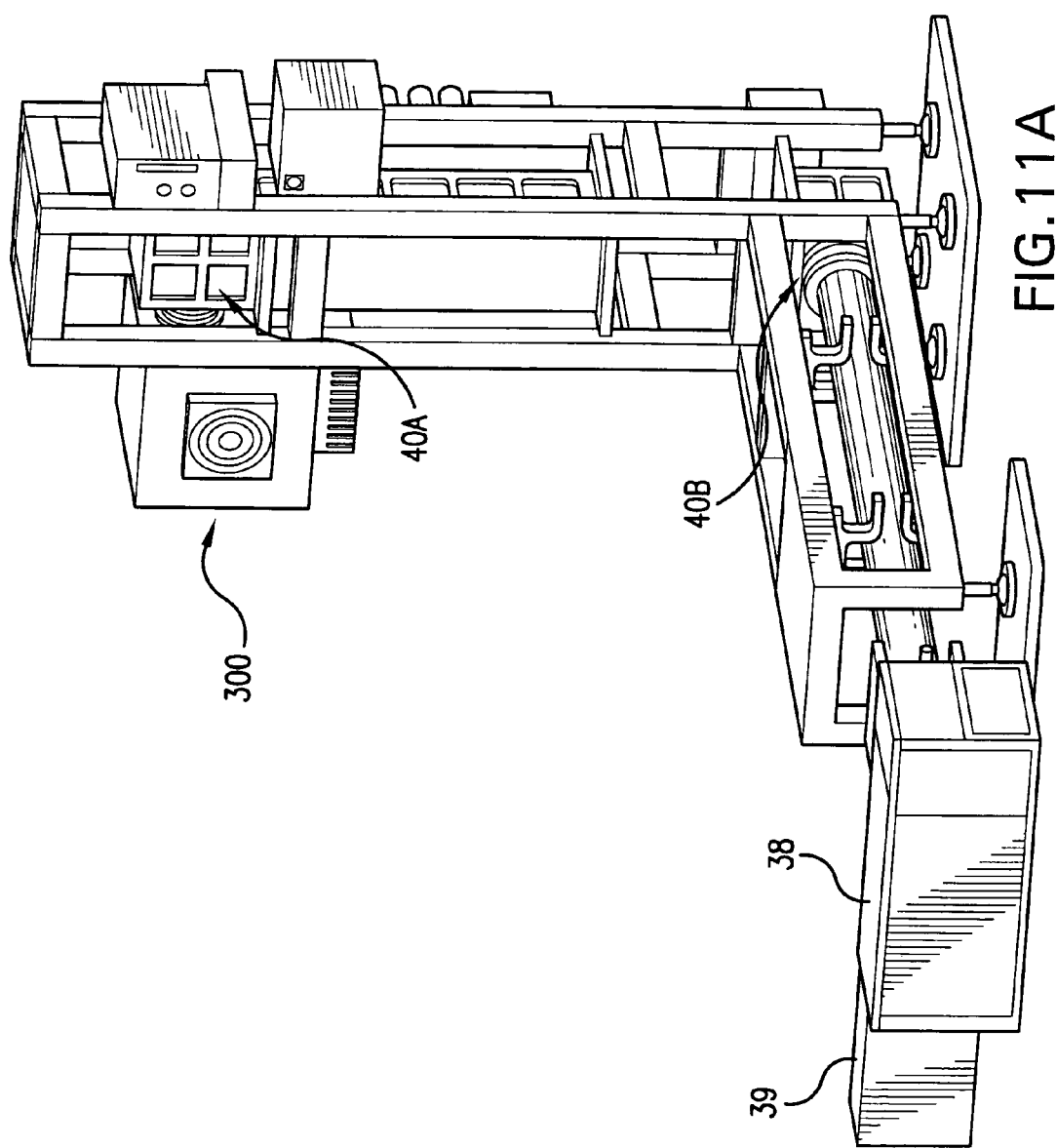

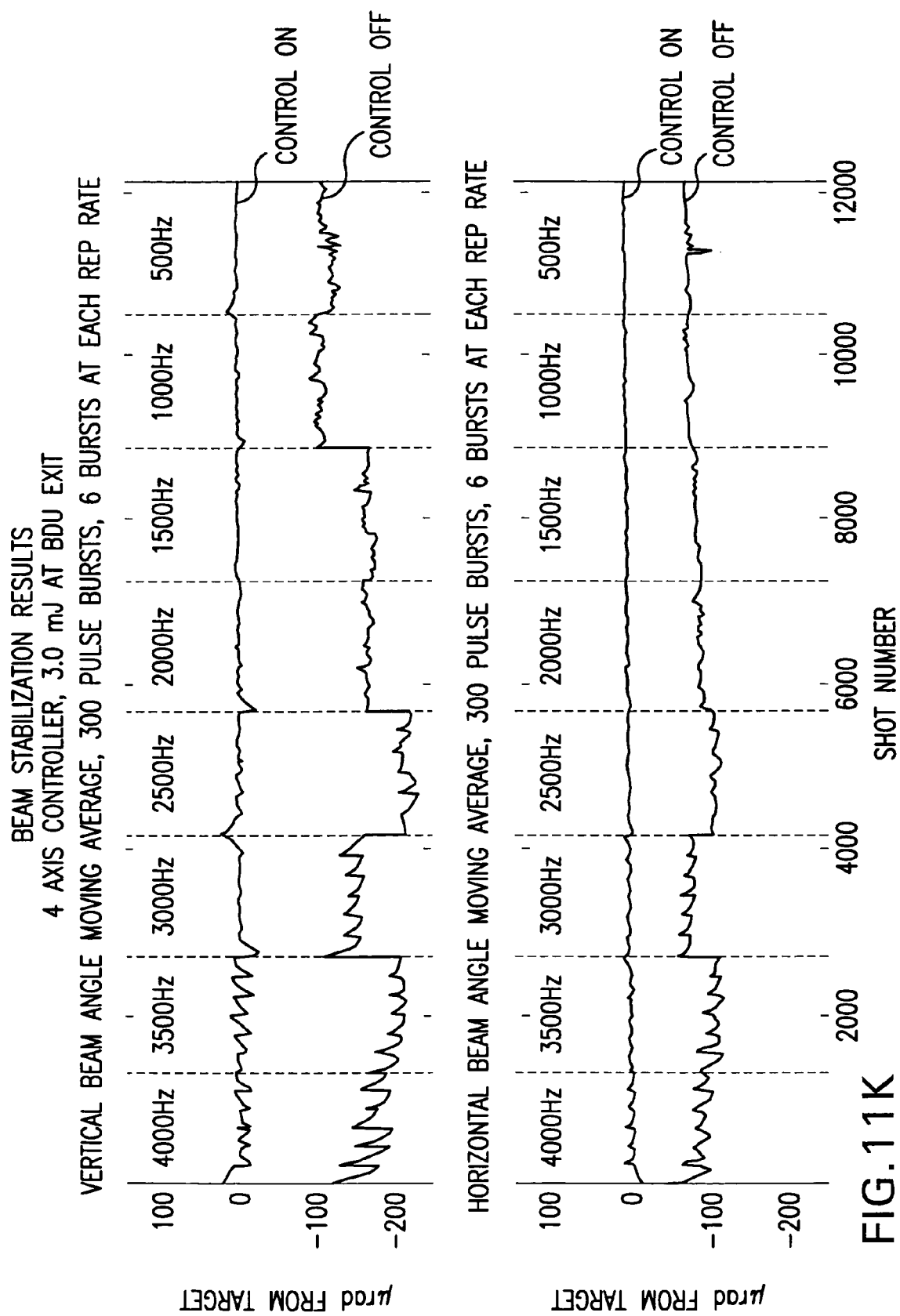

CHANGING INCIDENT ANGLE DOES NOT CHANGE STATE OF POLARIZATION

C-AXIS PERPENDICULAR

C-AXIS

<110> DIRECTION IS
PERPENDICULAR TO PLANE OF DRAWING

US 7,230,964 B2

LITHOGRAPHY LASER WITH BEAM DELIVERY AND BEAM POINTING CONTROL

The present invention is a continuation-in-part of Ser. No. 10/255,806 filed Sep. 25, 2002 now U.S. Pat. No. 6,704,340, Ser. No. 10/233,253 filed Aug. 30, 2002 now U.S. Pat. No. 6,704,339, Ser. No. 10/141/216 filed May 7, 2002 now U.S. Pat. No. 6,693,939, Ser. No. 10/036,676, filed Dec. 21, 2001 now U.S. Pat. No. 6,882,674, Ser. No. 10/036,727 filed Dec. 21, 2001 now U.S. Pat. No. 6,865,210, Ser. No. 10/006,913 filed Nov. 29, 2001, now U.S. Pat. No. 6,535,531, Ser. No. 10/000,991 filed Nov. 14, 2001 now U.S. Pat. No. 6,795,474, Ser. No. 09/943,343, filed Aug. 29, 2001 now U.S. Pat. No. 6,567,450, Ser. No. 09/854,097, filed May 11, 2001 now U.S. Pat. No. 6,757,316, Ser. No. 09/848,043, filed May 3, 2001, now U.S. Pat. No. 6,549,551, Ser. No. 09/837,150 filed Apr. 18, 2001, now U.S. Pat. No. 6,504,860, and Ser. No. 09/829,475 filed Apr. 9, 2001 now U.S. Pat. No. 6,765,945, and claims the benefit of Provisional Ser. No. 60/443,673 filed Jan. 28, 2003, all of which are incorporated herein by reference. This invention relates to lithography light sources for integrate circuit manufacture and especially to gas discharge laser lithography light sources for integrated circuit manufacture.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser.

These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. An excimer laser used for lithography typically must have its output beam reduced in bandwidth to a fraction of a picometer. This "line-narrowing" is typically accomplished in a line narrowing module (called a "line narrowing package" or "LNP" for KrF and ArF lasers) which forms the back of the laser's resonant cavity (A line selection unit "LSU" is used for selecting a narrow spectral band in the $F_2$ laser). The LNP is comprised of delicate optical elements including prisms, mirrors and a grating. Electric discharge gas lasers of the type described in Patent '884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the rouge of about 16,000 volts (or greater) across the electrodes which produce the discharges which lasts about 20 to 50 ns.

Major Advances in Lithography Light Sources

Excimer lasers such as described in the '884 patent have during the period 1989 to 2003 become the primary light source for integrated circuit lithography. More than 2000 of these lasers are currently in use in the most modern integrated circuit fabrication plants. Almost all of these lasers have the basic design features described in the '884 patent. This is:

(1) a single, pulse power system for providing electrical pulses across the electrodes at pulse rates of about 100 to 2500 pulses per second;
(2) a single resonant cavity comprised of a partially reflecting mirror-type output coupler and a line narrowing unit consisting of a prism beam expander, a tuning mirror and a grating;
(3) a single discharge chamber containing a laser gas (either krypton, fluorine and neon for KrF or argon, fluorine and neon for ArF), two elongated electrodes and a tangential fan for circulating the laser gas between the two electrodes fast enough to clear the discharge region between pulses, and
(4) a beam monitor for monitoring pulse energy, wavelength and bandwidth of output pulses with a feedback control system for controlling pulse energy, energy dose and wavelength on a pulse-to-pulse basis.

During the 1989-2001 period, output power of these lasers has increased gradually and beam quality specifications for pulse energy stability, wavelength stability and bandwidth have become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm full width half maximum (FWHM) and pulse energy stability at +/−0.35%.

Injection Seeding

A well-known technique for reducing the bandwidth of gas discharge laser systems (including excimer laser systems) involves the injection of a narrow band "seed" beam into a gain medium. In some of these systems a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems has been limited.

Separation of Lithography Machine from Light Source

For integrated circuit fabrication the lithography machine is typically located separate from the lithography laser light source. The separation is typically 2 to 20 meters. The laser and the lithography machine may be located in separate rooms. A typical practice is to locate the laser in a room one floor below the lithography machine. The laser beam is ultraviolet at wavelengths of about 248 nm for KrF lasers, 193 nm for ArF lasers and 157 nm for $F_2$ lasers. Ultraviolet light especially at the shorter wavelengths of the ArF and $F_2$ lasers is absorbed by oxygen, therefore it is a well known practice to enclose the laser beam path between the laser and the lithography machine and to purge the enclosure with a gas such as nitrogen which provides much lower beam attenuation than air. Included within the enclosure also are a variety of optical components, including mirrors and lenses, for directing the laser beam to a desired beam entrance port in the lithography machine and for providing any needed modification to the beam, such as changes in cross-sectional profile. The equipment for delivering the laser beam to the lithography machine is called a beam delivery unit or "BDU" for short. In the past the BDU has typically been designed and supplied separate from the laser light source.

What is needed is a better laser design for a pulse gas discharge laser for operation at repetition rates in the range of about 4,000 pulses per second or greater, providing laser light at the entrance port of the lithography machine having beam quality parameters including wavelength, bandwidth, pulse energy, beam pointing angle, beam position and cross-sectional profile needed by the lithography machine.

SUMMARY OF THE INVENTION

The present invention provides a modular high repetition rate ultraviolet gas discharge laser light source with a beam delivery to a production line machine. The system includes an enclosed and purged beam path with beam pointing control for delivery the laser beam to a desired location such as the entrance port of the production line machine. Preferred embodiments include equipment for beam attenuation, equipment for automatic feedback beam alignment and equipment for accurate optics module positioning at installation and during maintenance. In preferred embodiments, the production line machine is a lithography machine and two separate discharge chambers are provided, one of which is a part of a master oscillator producing a very narrow band seed beam which is amplified in the second discharge chamber. This MOPA system is capable of output pulse energies approximately double the comparable single chamber laser system with greatly improved beam quality. A pulse stretcher more than doubles the output pulse length resulting in a reduction in pulse power (mJ/ns) as compared to prior art laser systems. This preferred embodiment is capable of providing illumination at a lithography system wafer plane which is approximately constant throughout the operating life of the lithography system, despite substantial degradation of optical components.

BRIEF DESCRIPTION OF THE DRAWINGS

FIGS. 4A, 4B, 4C and 4D show beam delivery configurations.
FIGS. 8A-8E show an easily sealing bellows seal.
FIG. 10A shows a beam delivery unit.
FIGS. 10C and 10D1-3 show techniques for monitoring pointing error.
FIGS. 11A-11J show features of a prototype BDU unit.
FIGS. 11K-11O show test results using the prototype unit.

DETAILED DESCRIPTION OF PREFERRED EMBODIMENTS

First Preferred Embodiment

Figure 1:
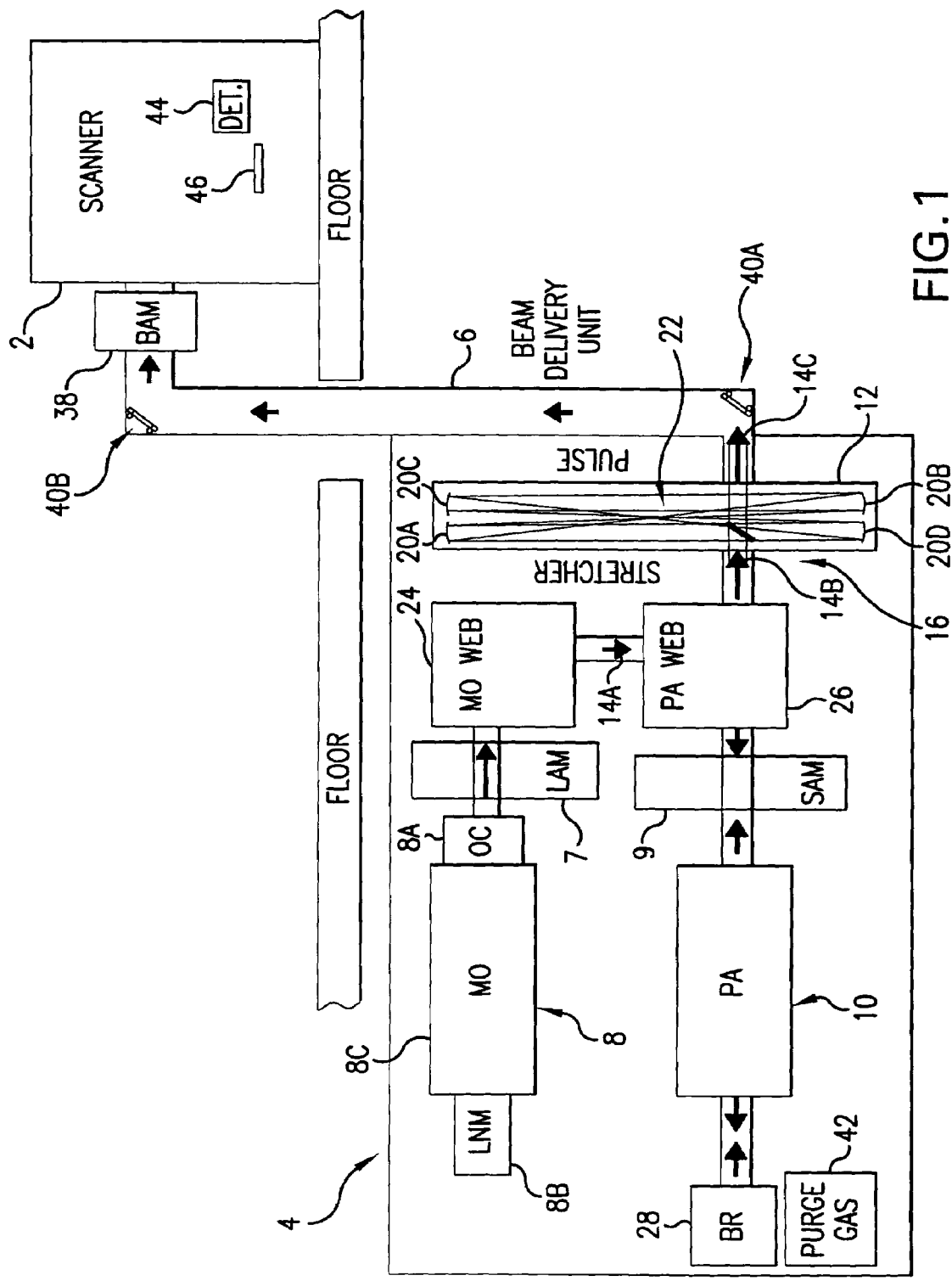
FIG. 1 is a layout of a lithography laser system with a beam delivery unit.

A first preferred embodiment of the present invention is shown in FIG. 1. In this embodiment a 193 nm ultraviolet laser beam is provided at the input port of a scanner lithography machine 2 such as the one of those supplied by Canon or Nikon with facilities in Japan or ASML with facilities in the Netherlands. In this case the main components of the laser system 4 are installed below the deck on which the scanner is installed. This preferred embodiment includes a MOPA laser system with special relay optics, a pulse stretcher and a beam delivery unit 6 which provides an enclosed beam path for delivering the laser beam to the input port of the scanner. The beam delivery unit includes equipment for beam attenuation, automatic beam alignment with feedback control and special alignment features for component alignment during installation and maintenance.

Mopa

This particular laser system includes a master oscillator 8 and a power amplifier 10 and is a type of laser system known as MOPA system. This MOPA arrangement represents an important advancement in integrated circuit light sources over the prior art technique of using a single laser oscillator to provide the laser Light. The master oscillator 8 and the power amplifier 10 each comprise a discharge chamber similar to the discharge chamber of prior art single chamber lithography laser systems. These chambers contain two elongated electrodes, a laser gas, a tangential fan for circulating the gas between the electrodes and water-cooled finned heat exchangers. The master oscillator 8 produces a first laser beam 14A which is amplified by two passes through the power amplifier 10 to produce laser beam 14B. The master oscillator 8 comprises a resonant cavity formed by output coupler 8A and line narrowing package 8B both of which are described generally in the background section and in detail in the referenced prior art patents. The gain medium for master oscillator 8 is produced between two 50-cm tong electrodes contained within master oscillator discharge chamber 8C. Power amplifier 10 is basically a discharge chamber and in this preferred embodiment is almost exactly the same as master oscillator discharge chamber 8C providing a gain medium between two elongated electrodes but it has no resonant cavity and the gas pressure is higher than that of the master oscillator. This MOPA configuration permits the master oscillator to be designed and operated to maximize beam quality parameters such as wavelength stability, and to provide a very narrow bandwidth; whereas the power amplifier is designed and operated to maximize power output. For example, the current state of the art light source available from Cymer, Inc. Applicants' employer, is a 5 mJ per pulse, 4 kHz, ArF laser system. The system shown in FIG. 1 is a 10 mJ per pulse (or mores if desired) easily up in about 30 mJ per pulse, 4 kHz ArF laser system producing at least twice the average ultraviolet power with substantial improvement in beam quality. For this reason the MOPA system represents a much higher quality and much higher power laser light source.

Relay Optics

Beam Path

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, MO WEB, 24, power amplifier wavefront engineering box, PA WEB, 26 and beam reverser, BR, 28. These three modules along with line narrowing module 8B and output coupler 8A are all mounted on a single vertical optical table independent of discharge chamber 8C and the discharge chamber of power amplifier 10. Chamber vibrations caused by acoustic shock and fan rotation must be isolated from the optical components.

Figure 3A:
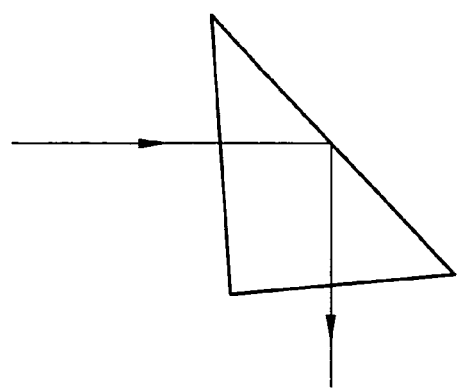
FIGS. 3A, 3B, 3C, 3D, 3E, 3F and 3G show features of a relay optics for the FIG. 1 laser system.

The optical components in the master oscillator line narrowing module 8B and output coupler 8A are in this embodiment substantially the sonic as those of prior art lithography laser light sources referred to in the background section. The line narrowing module 8B includes a three or four prism beam expander, a very fast response tuning mirror and a grating disposed In Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB 24 Contains a total internal reflection (TIR) prism and alignment components for precisely directing the output beam 14A into the PA WEB 26. TIR prisms such as the one shown in FIG. 3A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism.

The PA WEB 26 contains a TIR prism 26A as shown in FIG. 3C-F and alignment components (not shown) for directing laser beam 14A into a first pass through power amplifier gain medium. Alternatively, as above, a first surface mirror with a high reflection coating could he substituted for the TIR prism. The beam reverser module 28 contains a two-reflection beam reversing prism 28A shown in FIGS, 3B-D that like the one-reflection prism shown in FIG. 3A relies on total internal reflection and therefore requires no optical coatings. The face where the P-polarized beam enters and exits the prism 28A is oriented at Brewster's angle to minimize reflection losses, making the prism almost 100% efficient.

Figure 3B:
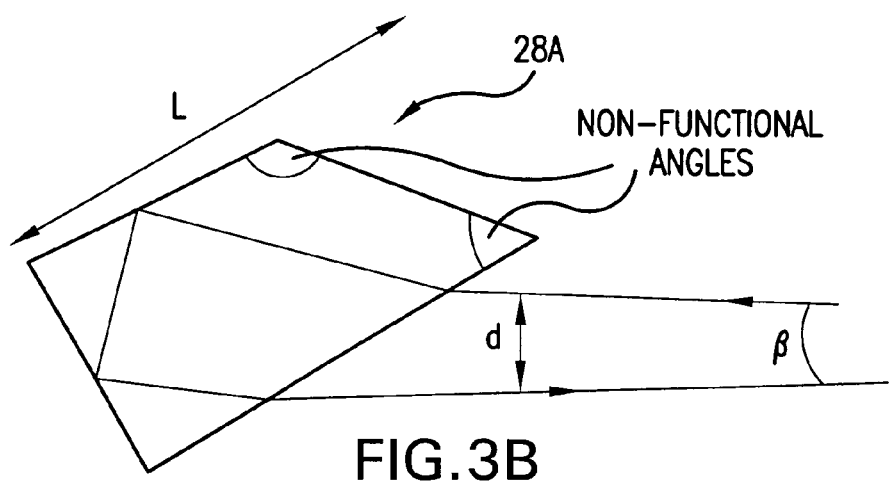
Figure 3C:
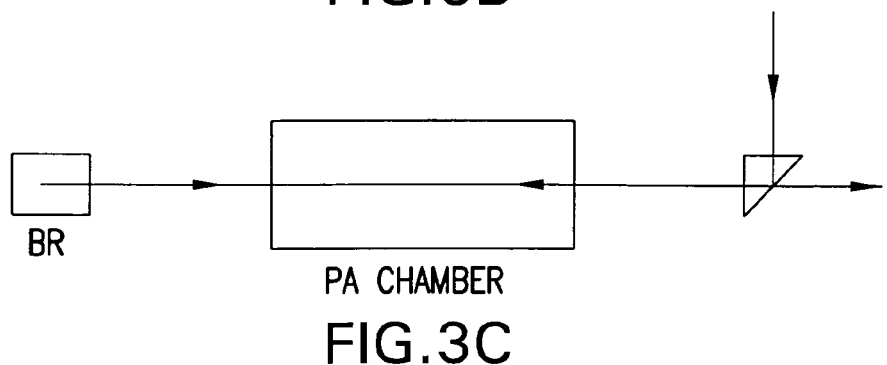
Figure 3D:
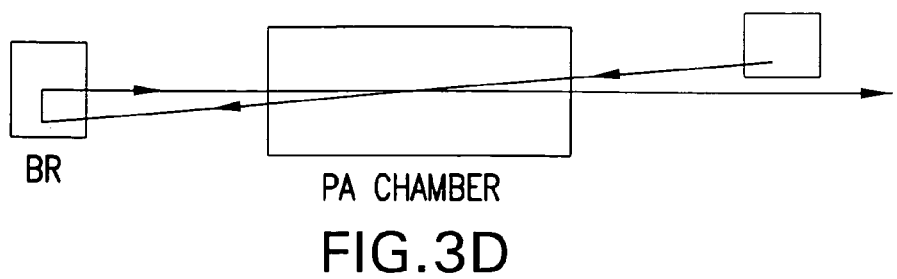

After reversal in the beam reversing module 28, partially amplified beam 14A makes another pass through, the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier 10 discharge chamber. The first pass follows a path at an angle of about 6 milliradians relative to the path of the second pass and the first path of the first pass crosses the center line of the gain medium at a point half way between the two ends of the gain medium. FIGS. 3C and 3D show side and top views of the path of beam 14A through the power amplifier 10. The reader should note that the design and positioning of beam reversing prism 28A must accommodate an angle β and a spatial offset of d as shown in FIG. 3B. In this embodiment β=6 milliradians and d is equal to 5 mm.

Figure 3E:
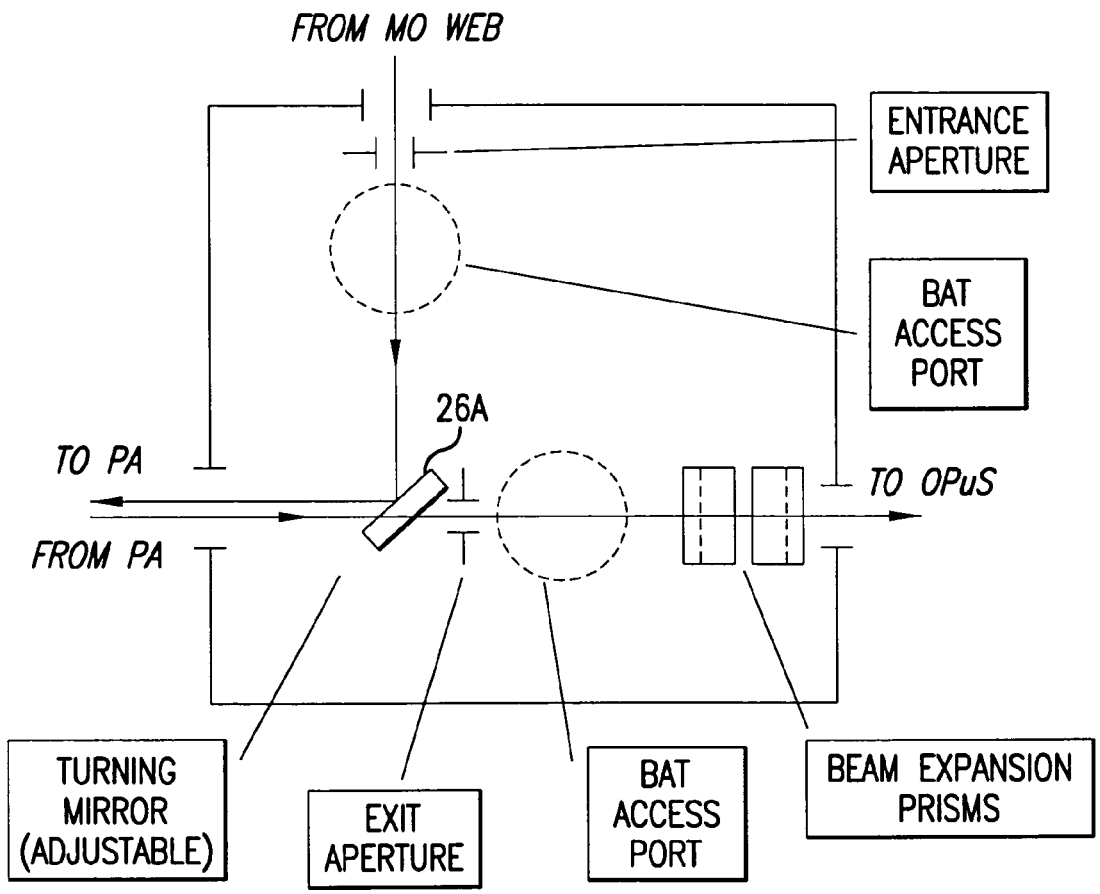
Figure 3F:
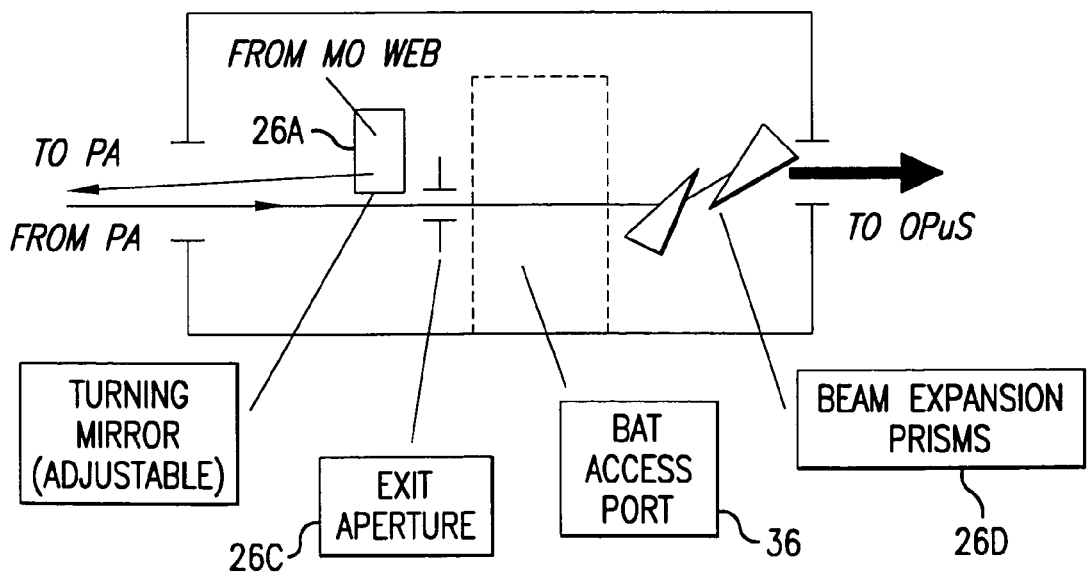

FIGS. 3E (side view) and 3F (top view) show some additional important features of optics in power amplifier WEB module 26. Note that in the side view, the beam "to" the PA is shown above the beam "from" the PA. This is done so that both beams can be shown in the side view drawing. (Actually both beams are at the same elevation so that the "from" beam would block the "to" beam if the from beam were shown at the correct elevation.). As shown in FIG. 3F the from beam passes close to TIR prism 26, passes Through exit aperture 26C, and is expanded by a factor of 4 in the horizontal direction with two beam expanding prisms 26D and exits to pulse stretcher module 22 (called by Applicants' "OPUS", for optical pulse stretcher). Exit aperture 26C as well as other apertures in the relay optics should be considered optional and they may be rep laced by temporary alignment targets.

Other TIR Prism Considerations

TIR prisms in the MO WEB and PA WEB are preferred over dielectric-coated first surface mirrors because they have no optical coatings, which tend to degrade with extended exposure to high fluence UV radiation. One disadvantage of the TIR prisms is unwanted Fresnel reflections that occur at the entrance and exit faces. For calcium fluoride material at 193 nm, each face reflects about 4% of the Incident beam. If the incident beam is normal to the surface, the unwanted reflections will propagate back along the path of the incident beam and re-enter the MO. This could interfere with the stable operation of the MO. The problem is avoided by tilting the entrance and exit faces of the TIP prisms by approximately 1 degree relative to the incident beam. This can be accomplished by rotation of a 45°-45°-90° TIR prism by 1 degree, in which case the deviation angle of the primary beam will change from 90° to either 88° or 92° (depending on the direction of the 1 degree rotation). Alternatively, a 90° deviation angle and 1 tilted faces can be achieved by using a TIR prism with angles 44°-44°-92° or 46°-46°-88° or 44.33°-45.67°-90°.

The TIR prism 26A in the PA WEB 26 is used very close to an edge of each of the three optical faces. The optical faces of these prisms must be accurately polished to within 1 mm or less of the critical edges.

The TIR prisms in the MO WEB 24 and PA WEB 26 will each be alignable in two degrees of freedom (2 rotations, "tip-tilt"). The MO WEB TIR prism is aligned so that the primary reflected beam is directed to the appropriate location in the PA WEB 26. The PA WEB TIR prism is aligned so that the primary reflected beam is directed to the appropriate location in the Beam Reverser 28. Each TIR prism is secured in a mechanical mount which allows the tip-tilt adjustments twin outside the sealed module.

The maximum reflected wavefront error is specified as 0.20 wave peak-valley at 633 nm (i.e., 127 nm) across the clear aperture (13 mm×21 mm). The wavefront error across the much smaller beam will be significantly less, though the exact amount depends on the type of aberrations present. If simple curvature is the dominant error (as it generally is with polished flats), the maximum divergence angle error introduced to a beam would be about 0.02 mrad in the vertical direction (and much less in the horizontal direction).

Figure 3G:
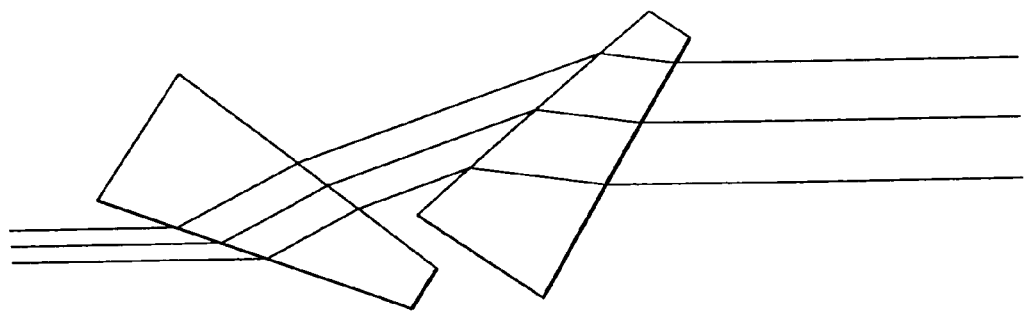

Degradation of the optical coating over life (especially at 193 nm) is a concern for high reflection dielectric coatings that are more damage resistant than partial reflection or AR coatings may be used. Also aiding the goal of long lifetime for this mirror is the fact that the pulse energy is much lower coming out of the MO 8 than coming out of the PA 10. Because the mirror will be used very close to the edge, the coating may be more susceptible than usual to damage. There may be surface roughness or coating irregularities near the edge that contribute to coating failure. The edge of the mirror preferably is tested to avoid these potential problems. FIG. 3G shows the spacing issues. In order to direct the beam to the appropriate location in the Beam Reverser module 28, the turning mirror will be aligned in two degrees of freedom (2 rotations, "tip-tilt"). The minor mount must include adjustments, accessible from outside the sealed module, for aligning the mirror to the required accuracy.

An alternative to the coated mirror 26A is to use an uncoated TIR prism instead of the dielectric-coated mirror. Such a design would eliminate any concern of coating damage over life.

Alignment Features for Relay Optics

For this tilted double-pass geometry, the beams reflecting from the MO WEB 24 end the Beam Reverser 28 are precisely positioned in the PA WEB 26. Alignment features are provided within the PA WEB 26 for proper alignment of the MO WEB 24 mirror and the Beam Reverser 28. The features would need to reference to the edge of the TIR prism. Preferably the alignment features are apertures, one at the entrance to the PA WEB 26 (for alignment the MO WEB prism) and one at the exit (for aligning the beam reverser 28). The apertures might be permanent or removable. The system should be alignable In the field with the beam path sealed. Preferably the location of the beam with respect to the apertures will be made visible with some type of 2-D detector array (digital camera). A Beam Analysis Tool called BAT (perhaps with an aperture built-in) may be inserted into the module to inspect the alignment as shown at 36 in FIG. 3F.

Beam Expansion Prisms

Coming out of the PA 10, the fluence of the beam is higher than anywhere else in the system (due to small beam size and high pulse energy). To avoid having such high fluence incident on the optical coatings in the OPuS module 22, where coating damage could result, beam expansion prisms were designed into the PA WEB 26. By expanding the horizontal beam width by a factor of 4, the fluence is reduced to ¼ its previous level.

The beam expansion is accomplished using a pair of identical prisms with 20° apex angles as shown in FIG. 3G. The orientation of the prisms and beam path is shown FIG. 3G.

The prisms are made of ArF-grade calcium fluoride and are uncoated. By utilizing an incidence angle of 68.6° on each prism, anamorphic magnification of 4.0 is achieved, and the nominal deviation angle of the pair is zero. The total Fresnel reflection loss from the four surfaces is about 12%.

Pulse Stretcher

Figure 2:
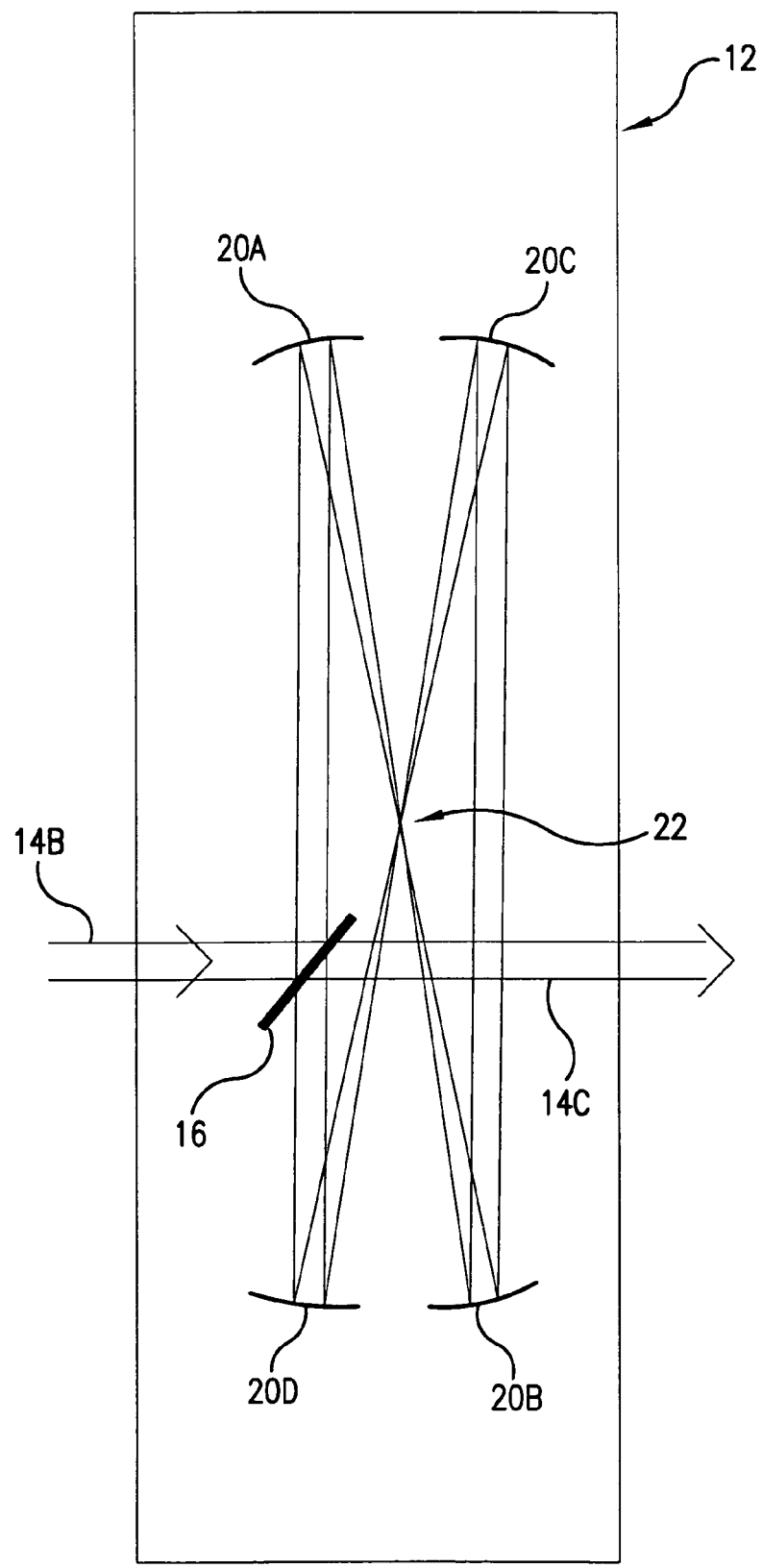
FIGS. 2, 2A and 2B show features of a pulse stretching unit.
Figure 2A:
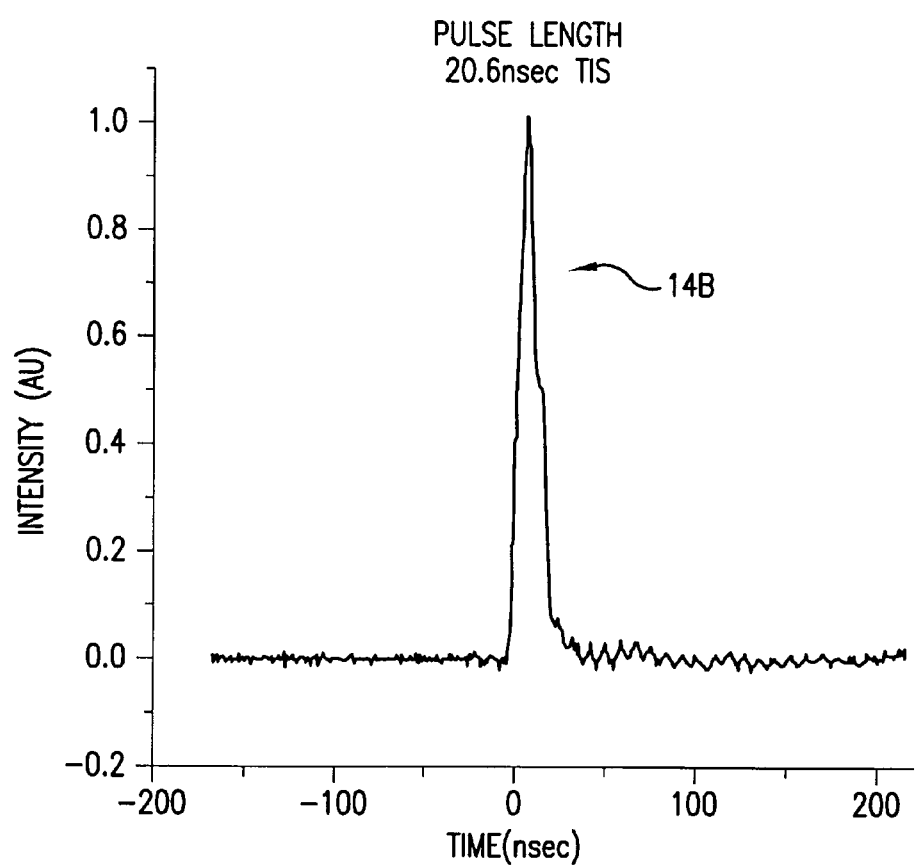
Figure 2B:
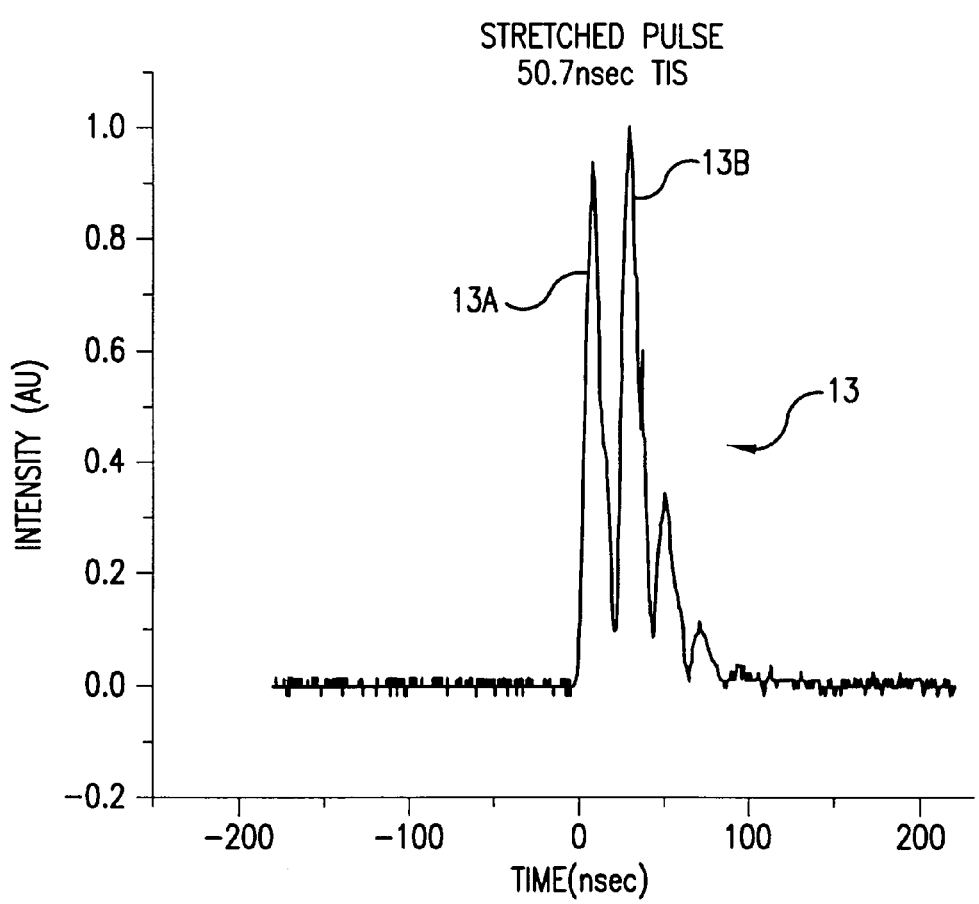

Integrated circuit scanner machines comprise large lenses which are difficult to fabricate and costs millions of dollars. These very expensive optical components are subject to degradation resulting from billions of high intensity and ultraviolet pulses. Optical damage is known to increase with increasing intensity (i.e., light power (energy/time) per $cm^2$ or $mJ/ns/cm^2$) of the laser pulses. The typical pulse length of the laser beam from these lasers is about 20 ns so a 5 mJ beam would have a pulse power intensity of about 0.25 mJ/ns. Increasing the pulse energy to 10 mJ without changing the pulse duration would result a doubling of the power of the pulses to about 0.5 mJ/ns which could significantly shorten the usable lifetime of these expensive optical components. The Applicants have avoided this problem by increasing substantially the pulse length from about 20 ns to more than 50 ns providing a reduction in the rate of scanner optics degradation. This pulse stretching is achieved with pulse stretcher unit 12 as shown in FIG. 1. An enlarged view showing the beam paths though pulse stretcher 12 is shown in FIG. 2. A beam splitter 16 reflects about 60 percent of the power amplifier output 10 beam 14B into a delay path created by four focusing mirrors 20A, 20B, 20C and 20D. The 40 percent transmitted portion of each pulse of beam 14B becomes a first hump 13A of a corresponding stretched pulse 13 shown in FIG. 2B of beam 14C. The stretched beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of hump 13B in pulse 13 as shown in FIG. 2B. The 40 percent of the reflected beam transmits beam splitter 14 and follows exactly the path of the first reflected beam producing additional smaller humps in stretched pulse 13. The result is stretched pulse 14C which is stretched in pulse length from about 20 ns to about 50 ns. The stretched pulse 14C is plotted as intensity vs. time in FIG. 2B and can be compared with the shape of the power amplifier output pulse 14B which is similarly plotted in FIG. 2A.

The stretched pulse shape with this embodiment has two large approximately equal peaks 13A and 13B with smaller diminishing peaks following in time the first two peaks. The shape of the stretched pulse can be modified by using a different beam splitter. Applicants' have determined that a beam splitter reflecting about 60 percent produces the maximum stretching of the pulse as measured by a parameter known as the "time integrated square" pulse length or "$t_{IS}$". Use of this parameter is a technique for determining the effective pulse duration of pulses having oddly shaped power vs. time curves. The $t_{IS}$ defined as:

$$t_{IS} = \frac{\left(\int I(t)dt\right)^2}{\int I^2(t)dt}$$

Where I(t) is the intensity as a function of time.

In order to maintain the beam profile and divergence properties, the minors 20A-D that direct the beam through the delay propagation path must create an imaging relay system that also should act as a unity, magnification, focal telescope. The reason for this is because of the intrinsic divergence of the excimer laser beam. If the beam were directed through a delay path without being imaged, the beam would be a different size than the original beam when it is recombined at the beam splitter. To create the imaging relay and a focal telescope functions of the pulse stretcher 12 the mirrors 20A-D are designed with a specific radius of curvature which is determined by the length of the delay path. The separation between mirrors 20A and 20D is equal to the radius of curvature of the concave surfaces of the mirrors 20A-D and is equal to ¼ the total delay path.

The relative intensities of the first two peaks in the stretched pulse can be modified with the design of the reflectivity of the beam splitter 16. Also, the design of the beam splitter 16 and therefore the output $t_{IS}$ of the pulse stretcher 12 are dependent upon the efficiency of the beam relay system and Therefore the output $t_{IS}$ is also subject to the amount of reflectivity of the imaging relay mirrors 20A-D and the amount of loss at the beam splitter 16. For an imaging relay mirror reflectivity of 97% and a loss of 2% at the beam splitter 16, the maximum $t_{IS}$ magnification occurs when the reflectivity of the beam splitter 16 is 63%.

The alignment of the pulse stretcher 12 requires that two of the four imaging relay mirrors 20A-D be adjustable. Each of the two adjustable mirrors would have tip/tilt adjustment creating a total of four degrees of freedom. It is necessary that the two adjustable mirrors be located at opposite ends of the system because of the confocal design of the system. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher 12. By examining the overlay of the sub-pulses with the original pulse at two planes (near field and far field) one would have the necessary information to automatically adjust the mirrors to produce an output where each of the sub-pulses propagate in a co-linear manner with the original pulse.

Beam Delivery Unit

In this preferred embodiment a pulsed laser beam meeting requirements specified for the scanner machine 2 is furnished at the light input port of the scanner. A beam analysis module as shown at 38 in FIG. 1 called a BAM is provided at the input port of the scanner to monitor the incoming beam and provide feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module 38 on a pulse to pulse basis at pulse rates up to 4,000 Hz using techniques described in U.S. patent application Ser. No. 10/012,002 which has been incorporated herein by reference.

Other beam parameters may also be monitored at any desired frequency. Parameters such as polarization, profile, beam size and beam pointing are relatively stable so users may choose to monitor these parameters much less frequently than the wavelength, bandwidth and pulse energy parameters.

Beam Pointing Control

This particular BDU comprises two beam-pointing mirrors 40A and 40B one or both of which may be controlled to provide tip and tilt correction for variations in beam pointing. Beam pointing may be monitored in the BAM 38 providing feedback control of the pointing of one or both of the pointing mirrors. In a preferred embodiment piezoelectric drivers are provided to provide pointing response of less than 7 milliseconds.

Figure 10B:
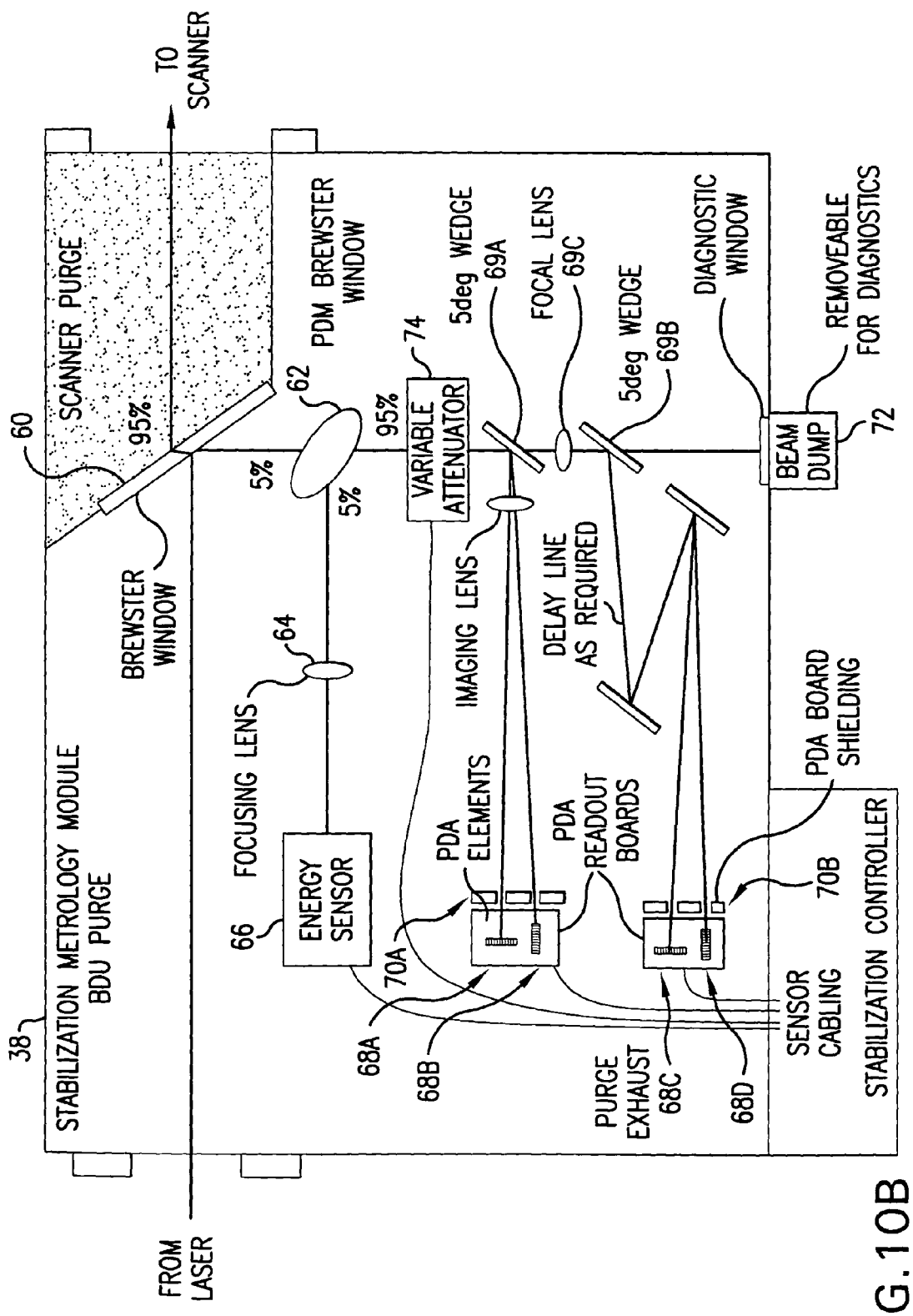
FIG. 10B shows details of a metrology monitor for monitoring beam angle and beam position.

A preferred beam pointing control technique can be described by reference to FIG. 10A. A beam analysis module (BAM) 38 is located at the BDU exit. Module 38 has sensors 38A that measure the beam pointing and position errors as they enter the scanner. The error signals are sent to a stabilization controller 39 located adjacent to module 38 that processes the raw sensor data and generates commands to drive fast steering turning mirrors 40A and 40B. These two fast steering turning mirrors 40A-B, each with 2 axes of control, are placed upstream of the beam BAM 38. The turning mirrors 40A-B are each mounted to a fast steering motor. The motor actuates the mirror angle in two axes and thus redirects the path of the laser beam. Two motors with 2 axes of control enable the BDU stabilization controller to independently regulate the vertical and horizontal beam pointing and position errors. The control system corrects for the beam errors from pulse-to-pulse. Namely, the beam errors from each laser pulse are fed to a feedback control system to generate commands for the steering motors. The electronics used to run the feedback control system are located in the Stabilization Controller module 39. This BDU also includes two static turning mirror modules 40C and 40D, a beam expander module 41 and a beam intensity attenuator module 43.

The vertical and horizontal beam pointing and position errors are evaluated at the BDU exit for every pulse of light generated by the laser. In total there are four independent sensor measurements.

1. Vertical pointing error
2. Horizontal point error
3. Vertical position error
4. Horizontal position error The BAM 38 (a Stabilization Metrology Module, "SMM") as shown in detail in FIG. 10B contains the sensors and associated optics needed to measure the pointing, position, end energy of the beam at the exit of the BDU (the entrance of the scanner.) Most of the beam energy passes through module 38 for delivery to the scanner, while a small fraction is diverted for the various measurements;

Pulse-to-pulse evaluation of beam pointing and position errors

Vertical and horizontal pointing is measured by putting far-field images on linear photodiode array (PDA) elements, such the S903 NMOS Linear Image Sensors offered by Hamamatsu Corporation with offices in Bridgewater, N.J.

Vertical and horizontal position is measured by putting reduced images of the beam near the BDU exit on linear PDA elements.

Beam energy measurement

The energy of the beam delivered by the BDU to the scanner is measured with calibrated photo-cell circuit.

Signals from the sensor in the Stabilization Metrology Module ("SMM") are sent through electrical connectors to the Stabilization Controller 39.

A Brewster window 60 allows 95% of the beam energy to pass on to the scanner, deflecting 5% into the body of module 38 for use by the beam metrology sensors. The light deflected by the main Brewster window for metrology is split again by another Brewster window 62; the deflected light, which has the same polarization mix as the light sent to the scanner, is focused by converging lens 64 on a photo-cell energy sensor 66.

The remainder of the light not deflected by the PDM Brewster window 62 is distributed among four linear PDA sensors 68A, B, C and D for measuring vertical and horizontal beam position and pointing. To measure position, two beams split off by a wedge 69A are sent through a converging lens to form images of the beam on two of the PDA sensors 68A and 68B. The lens and path lengths are such that the images formed are ½ scale images of the cross-section of the beam at the main Brewster window. The two PDA sensors are oriented at 90° to one another so that one measures the intensity profile of the beam in the vertical direction, and the other measures the intensity profile in the horizontal direction. Changes in the position of the beam at the Brewster window thus produce shifts in the reduced profile images on the sensors.

The light not deflected for the position sensors is passed through another converging lens 69C and wedge 69B so as to form spots on the remaining two PDA sensors 68C and 68D which are also oriented at 90° to one another. In this case, the PDS sensors lie in the focal plane of the lens 69C, so that changes in the pointing angle of the beam produce shifts in the positions of the spots on the sensors.

Mechanical shields 70A and 7B are placed in front of all the PDA sensors to ensure that they detect only the intended light intensity distributions.

Finally, a beam dump 72 dissipates any remaining light energy. This beam dump is removable to expose a window that may be used for diagnostics.

Because of the large range of delivered light intensity, a variable attenuator 74 is used upstream of the PDA elements to prevent them from saturating. The variable attenuator is a motorized device that places various neutral density filters in the beam path, for example a version of a motorized flipper model 8892 offered by New Focus with offices in San Jose, Calif. The variable attenuator comprises an energy sensor and a feedback circuit and is motorized to automatically adjust the light intensity arriving at the PDA elements. The attenuator setting is adjusted by feeding the energy sensor data to the stabilization controller. An algorithm on the stabilization controller adjusts the attenuator setting based on the energy sensor reading. In one embodiment, only one filter is used. When the energy setting is above a pre-specified threshold, the filter is placed in the beam path to attenuate the energy of the beam. When the light energy drops below the pre-specified threshold, the filter is removed from the path. In other embodiments, several filters may be required depending on the intensity range of the light and sensor electronics dynamic range.

FIGS. 10C and 10D1-3 illustrate the signal processing performed to generate pointing error measurements from the PDA detectors. Metrology in module 38 places the vertical and horizontal far field spots on PDA elements. FIG. 10C illustrates a situation where the metrology rotates one reflection of the beam so that both the vertical and horizontal spots are placed on the same PDA element.

Pointing errors are defined from target locations defined at the exit of module 38. In other words, the laser user dictates where it wants the beam leaving module 38. Module 38 is a compact, light weight unit that can readily be mounted at the beam entrance to scanner 2. Total module size and weight can be kept to within 50×25×15 cm and about 15 kg.

To compute pointing errors, a reference location on the PDA elements is specified. The corresponding reference points on the PDA elements are defined with respect to the scanner specified reference location. Namely, the metrology inside the module 38 is aligned so that zero pointing error corresponds to the center of the flit field spot falling at the reference pixel location. On FIG. 10C the reference pixel locations are denoted by $r_v$ and $r_h$ for the vertical and horizontal fringes respectively.

The position of the far field fringes with respect to the reference location on the PDA elements reflects the pointing angle of the beam as it leaves the BDU. Likewise, the relative position of the image profiles with respect to the reference location on the PDA elements reflects the position of the beam leaving module 38. The position of a far field spot or profile on a PDA shall be defined in terms of threshold crossings. (Alternately, the position could be defined in terms of the location of the centroid of the intensity distribution.) For each pulse, the first and last pixels to exceed the threshold value (e.g. $1/e^2$ of the maximum) are found, and the threshold crossing itself is determined by interpolation with the neighboring pixels as illustrated in FIGS. 10D1, 2 and 3. The midpoint between the threshold crossing is taken to be the center of the fringe ($C_v$ and $C_h$ representing the vertical and horizontal center) and the error signal is the distance between the center of the fringe and the reference locations, (i.e., $r_v$ and $r_h$). For example, the vertical pointing error is directly proportional to the distance between rv and cv as shown in FIG. 10C.

Test Results

Figure 10E:
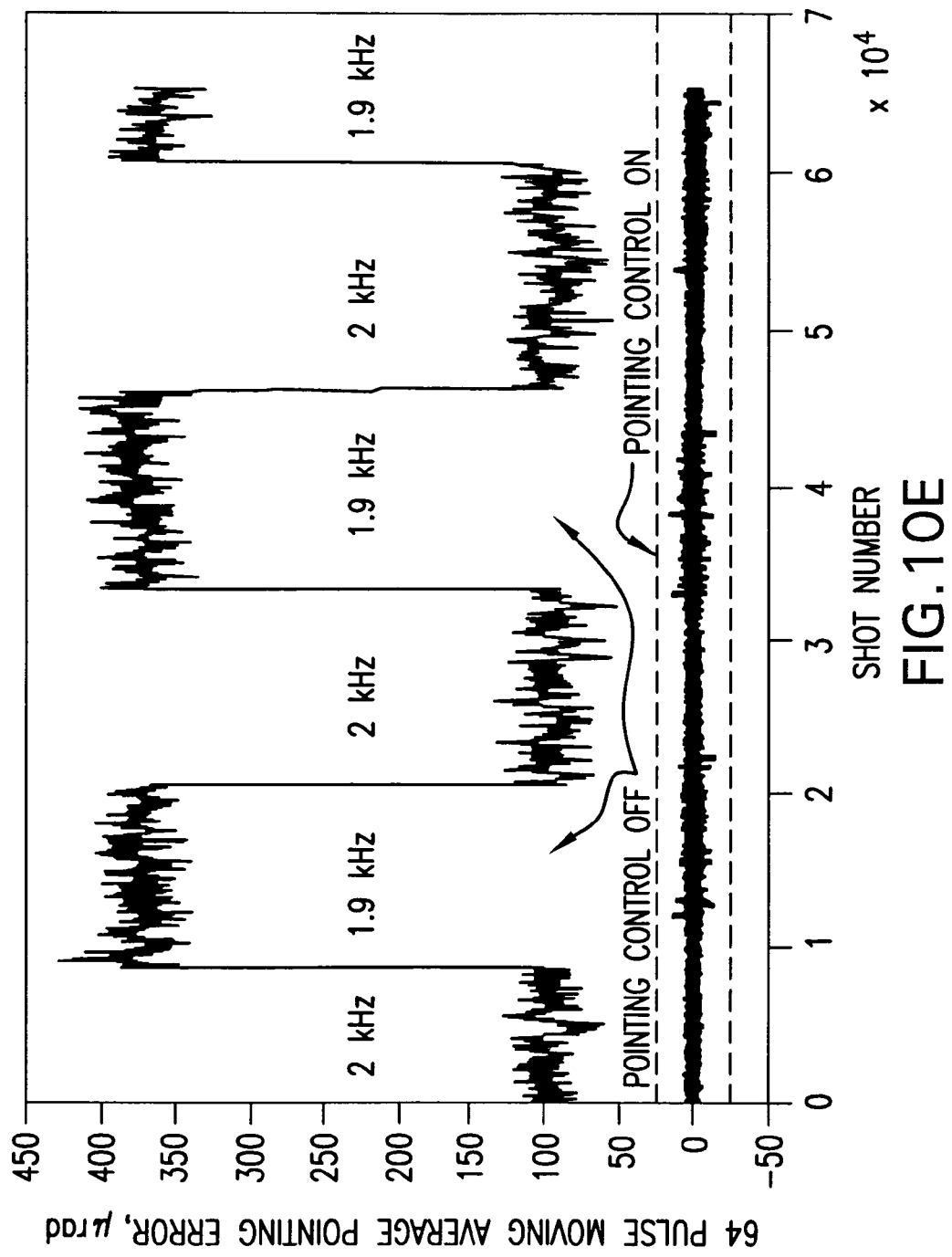
FIGS. 10E, F, G and H show test charts demonstrating performance of a beam pointing control system.
Figure 10F:
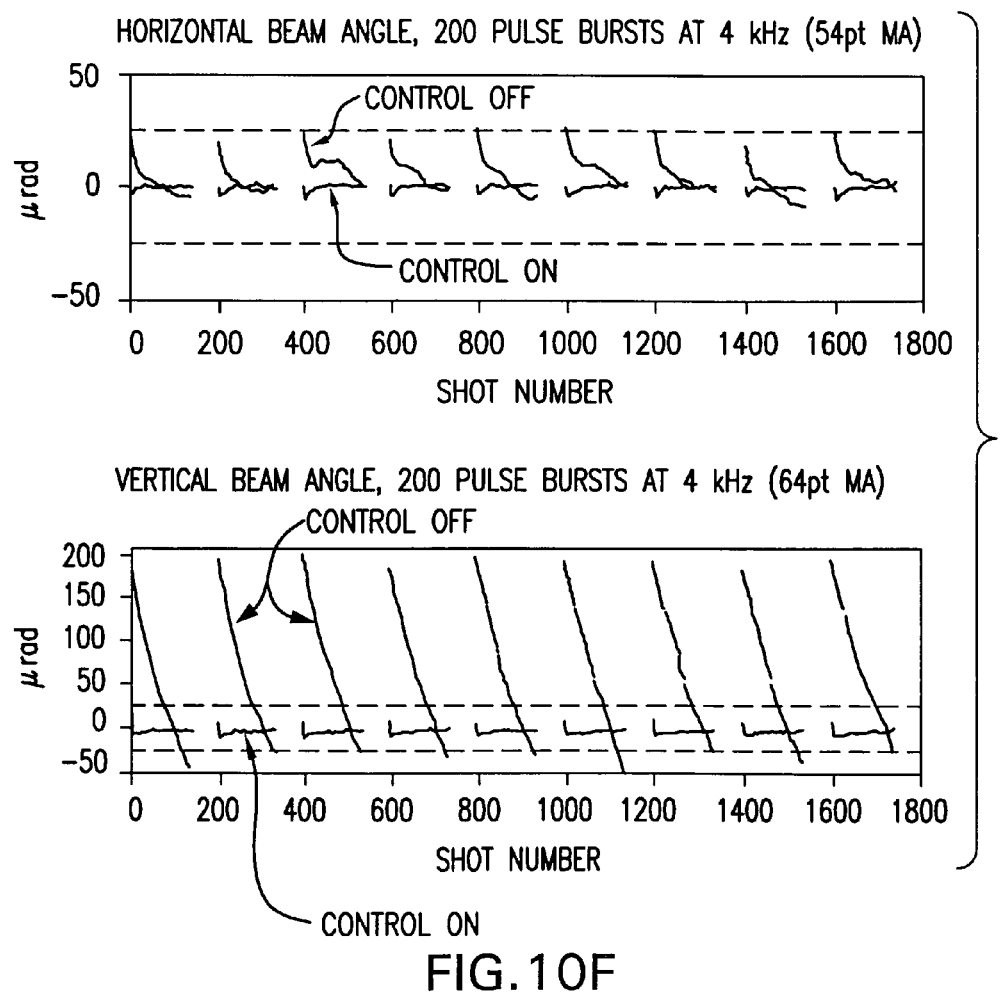

A prototype BDU system was actually built and tested by Applicants. Test results at 2 KHz and 4 KHz are shown in FIGS. 10E and 10F with the pointing control on and pointing control off. In the open loop the beam stabilization system is off, and the steering mirrors are fixed. The beam from the laser propagates directly to the scanner without correction. The open loop errors are exactly the pointing and position errors generated by the laser. The closed loop behavior indicates the performance achieved when the beam stabilization system is running.

FIG. 10E illustrates the vertical pointing performance achieved in Applicants' KrF experiments. Applicants plotted the moving average of the vertical beam angle measured with and without the active stabilization control as the repetition rate is changed. The reader should note that the changes in beam angle offset that accompany a change in repetition rate are eliminated, as is the variation in angle that occurs over hundreds or thousands of shots at a constant repetition rate.

FIG. 10F shows moving averages of horizontal and vertical beam angles controlled simultaneously for 200 pulse bursts of pulses with 0.5 second intervals between bursts. As shown in FIG. 10F the vertical beam angle error is reduced more than a factor of 10.

Figure 10G:
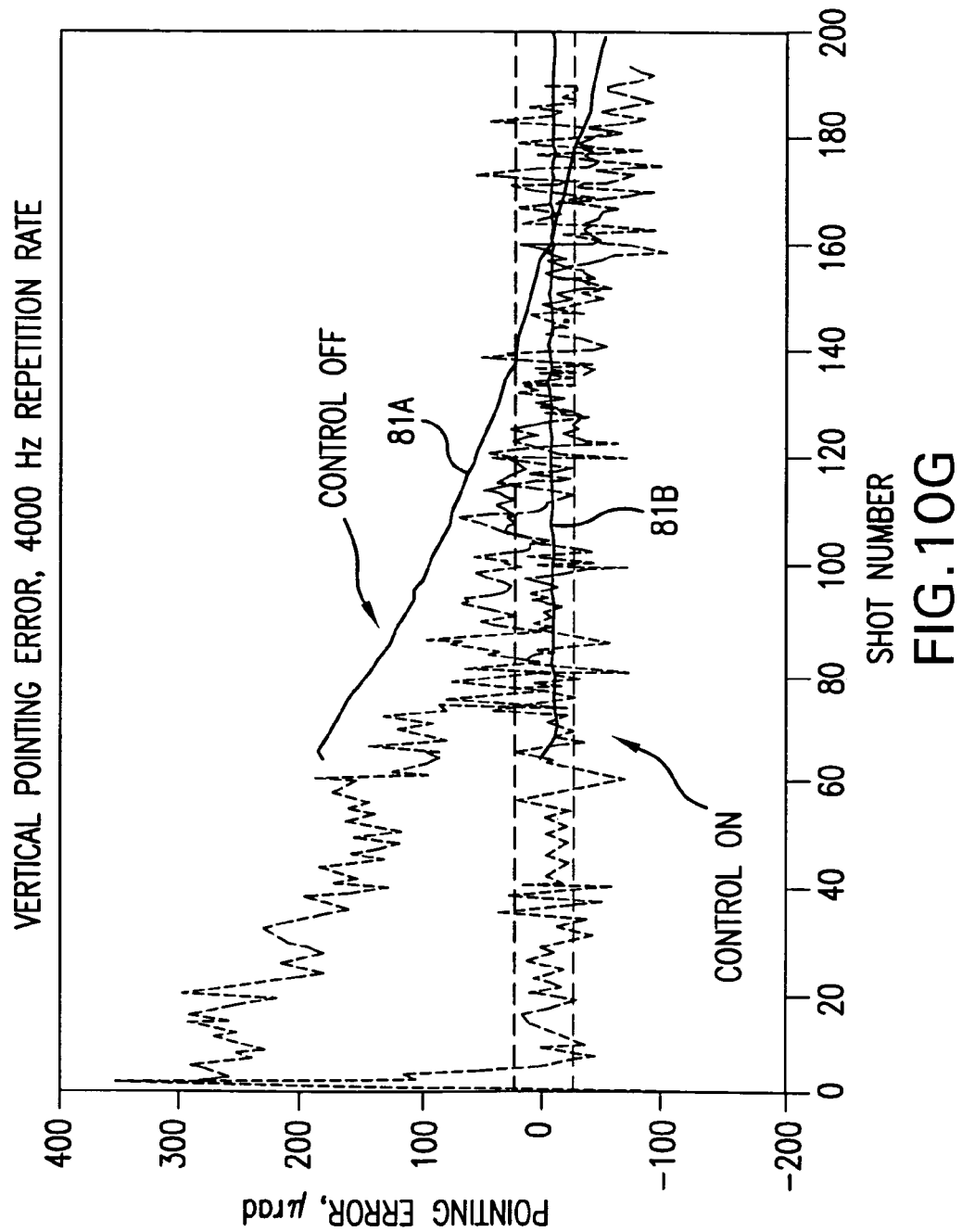

In FIG. 10G the actual measured angle for each shot in a burst is presented. The pointing angle change at the beginning of a burst is the same in both cases; but when the sensor measures a significant angle error, the controller determines the proper command to send to the actuator, which quickly corrects the beam angle to near zero. The result is a moving average performance as shown by dark lines 81A and 81B that is greatly reduced from the uncontrolled case.

Figure 10H:
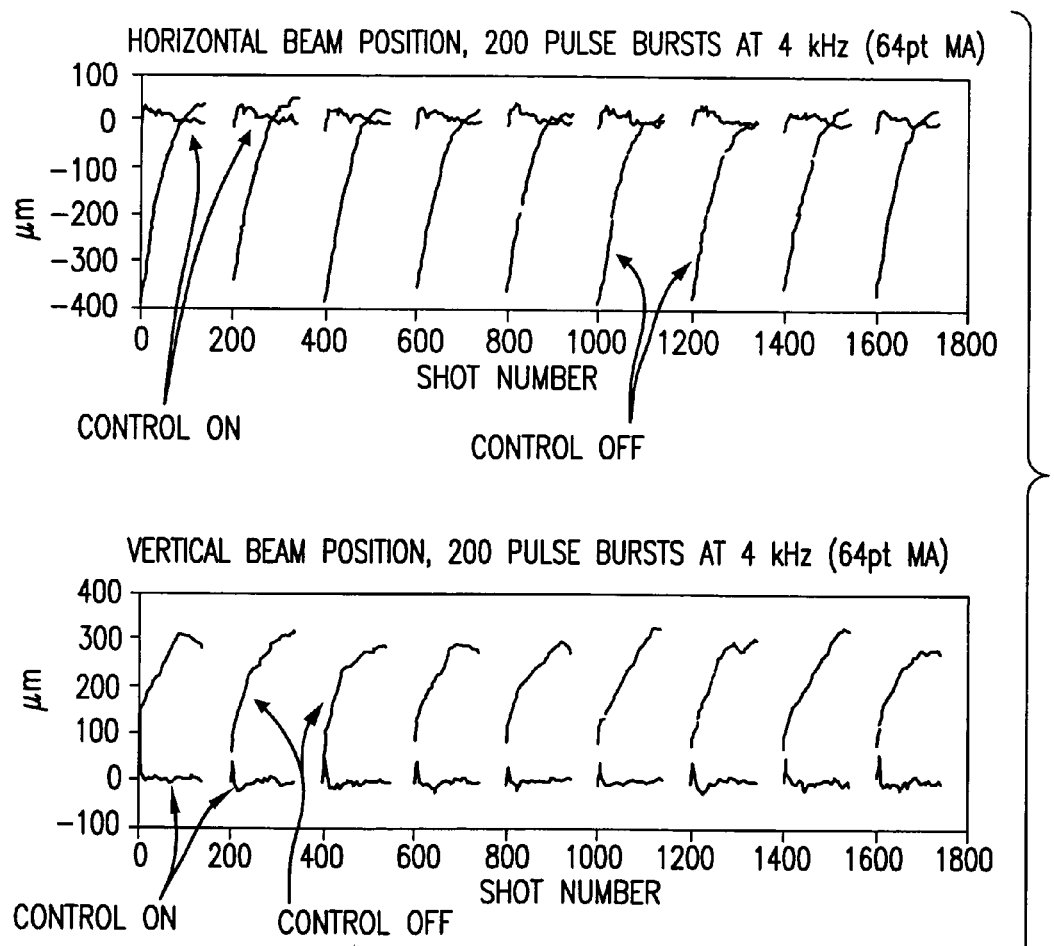

In FIG. 10H the same laser is used with the sensor equipment arranged to measure beam position rather than beam angle.

Fixed Energy Output

Figure 5:
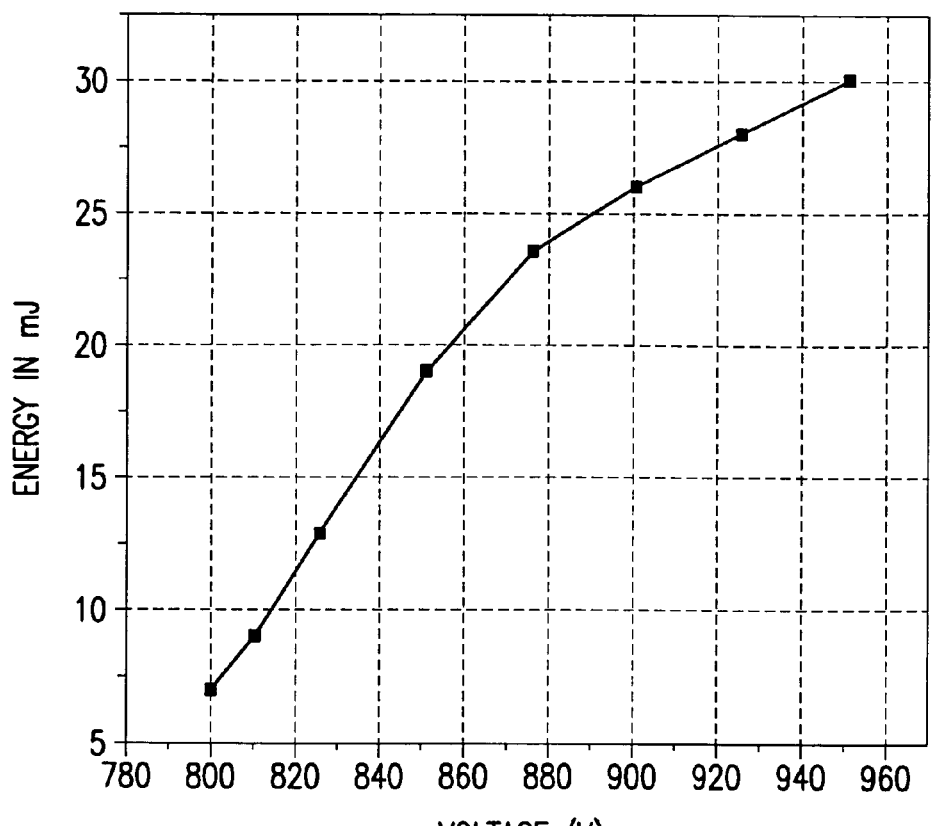
FIG. 5 is a graph of pulse energy versus charging voltage.

In general all optics in the beam path from the gain medium to the silicon wafer degrade over time generally as a function of intensity of the light in each pulse and the number of pulses. However, because of major improvements over the past few years that degradation is slow and is typically measured in billions of pulses. Still, the degradation is significant since, at 4000 Hz, a round-the-clock operation at a 15 percent duty factor, a lithography system will accumulate a billion pulses in a about three weeks. For this reason maintaining constant beam quality can be a challenge. In the past this effort to maintain consistent beam quality over the life of the components of the lithography system has been complicated by the fact that laser beam quality for most laser control functions was measured at the output of the laser system, just downstream from the output coupler. The present invention greatly moderates this problem by providing direct pulse-to-pulse feedback control at the input port of the scanner machine and by supplying the beam delivery unit as a part of the laser system. In this preferred embodiment the beam delivery unit is combined with the above described MOPA system which produces approximately twice the pulse energy as the current state-of-the-art lithography light sources with a reduction in energy intensity and with substantial improvements in beam quality. Therefore, with this arrangement the present invention provides illumination meeting the requirements of the operator of the stepper machine with beam quality and intensity unchanged over the lifetime of the lithography system despite substantial degradation of optical components throughout the length of the beam path. This can be accomplished by intentionally operating the laser system to provide a desired nominal performance at all stages of equipment life. Techniques for intentionally decreasing pulse energy include the usual technique of reducing discharge voltage but also reducing gas pressure or fluorine concentration. Beam attenuation is another possibility. This means that in the early stages of equipment life when all components are new, the laser may be operated so as to produce illumination with less than optimum quality and intensity, but quality and intensity values can be maintained constant (if desired) throughout the life of the lithography system. This approach can substantially increase the useful life not only of the very expensive laser system but also the much more expensive stepper machine. FIG. 5 is a plot of charging voltage vs. pulse energy output for a prototype MOPA laser system built and tested by Applicants. This chart shows that the laser system output can be varied between about 7 mJ to 30 mJ merely by changing the charging voltage. For example, if a nominal operating parameter is 15 mJ, the graph in FIG. 5 demonstrates that there is plenty of excess capacity in the laser to compensate for optics degradation over a long equipment lifetime. Since the MOPA output in this embodiment is 30 mJ per pulse compared to present state-of-the-art laser systems with output of 10 mJ, major lifetime improvements are expected using the above-described plan.

BDU-Part of Laser

Another advantage of providing the laser beam at the entrance port of the scanner is that the beam delivery unit now becomes the responsibility of the laser supplier for not only design and manufacture but also for pro-active preventative maintenance so as to minimize downtime and increase system availability.

Various Laser-BDU-Scanner Configuration

Another advantage is that the beam delivery unit can be designed as part of the laser system to suit the location of the laser with respect to the lithography machine. FIG. 1 shows a typical configuration but most lithography installations are unique and many other configurations are expected to be utilized. Some of the various possible laser—BDU—scanner configurations are shown in FIGS. 4A, 4B, 4C and 4D.

Attenuator

In a preferred embodiment a special attenuator is included in the beam delivery unit which provides controlled attenuation of the beam anywhere within a range of 3 percent transmission to 90 percent transmission. The attenuator could be located anywhere convenient in the beam delivery unit 6. Preferably it is provided as a modular unit which can be bolted in place in the purged beam line.

Figure 17A:
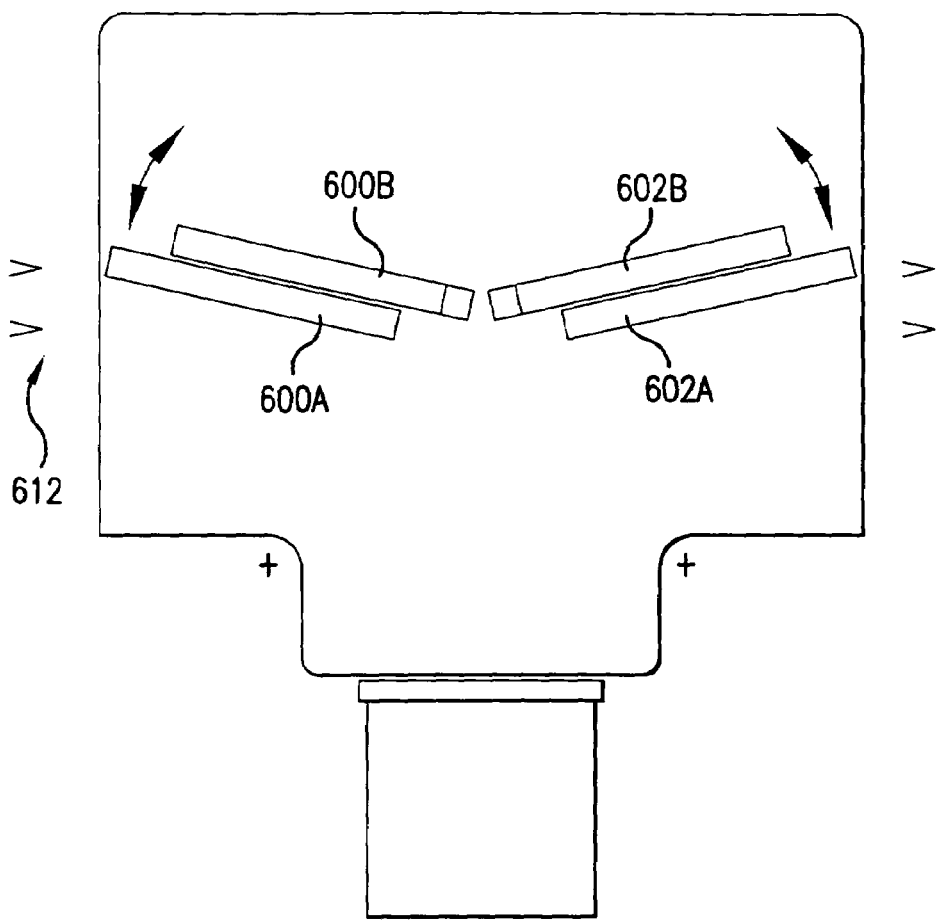
FIGS. 17A, B and C show features of a variable beam attenuator.
Figure 17C:
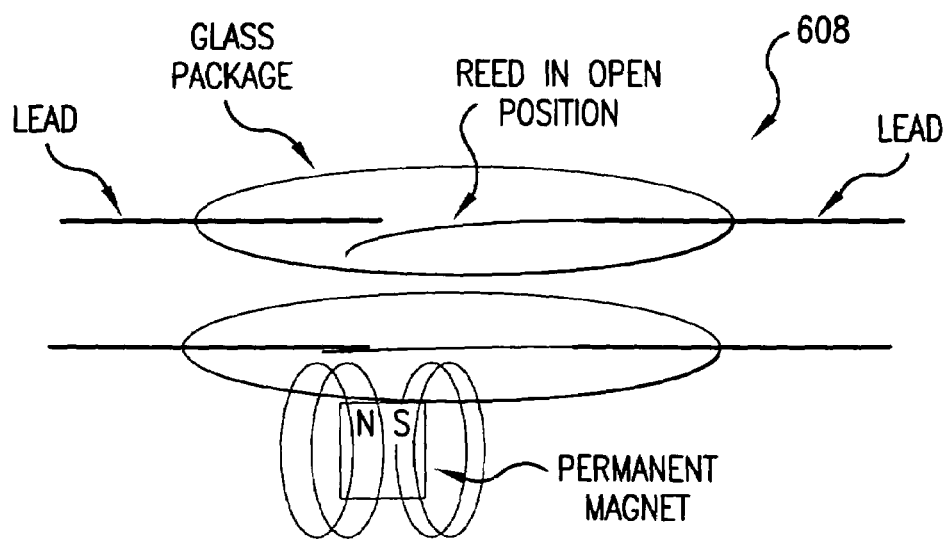
Figure 17B:
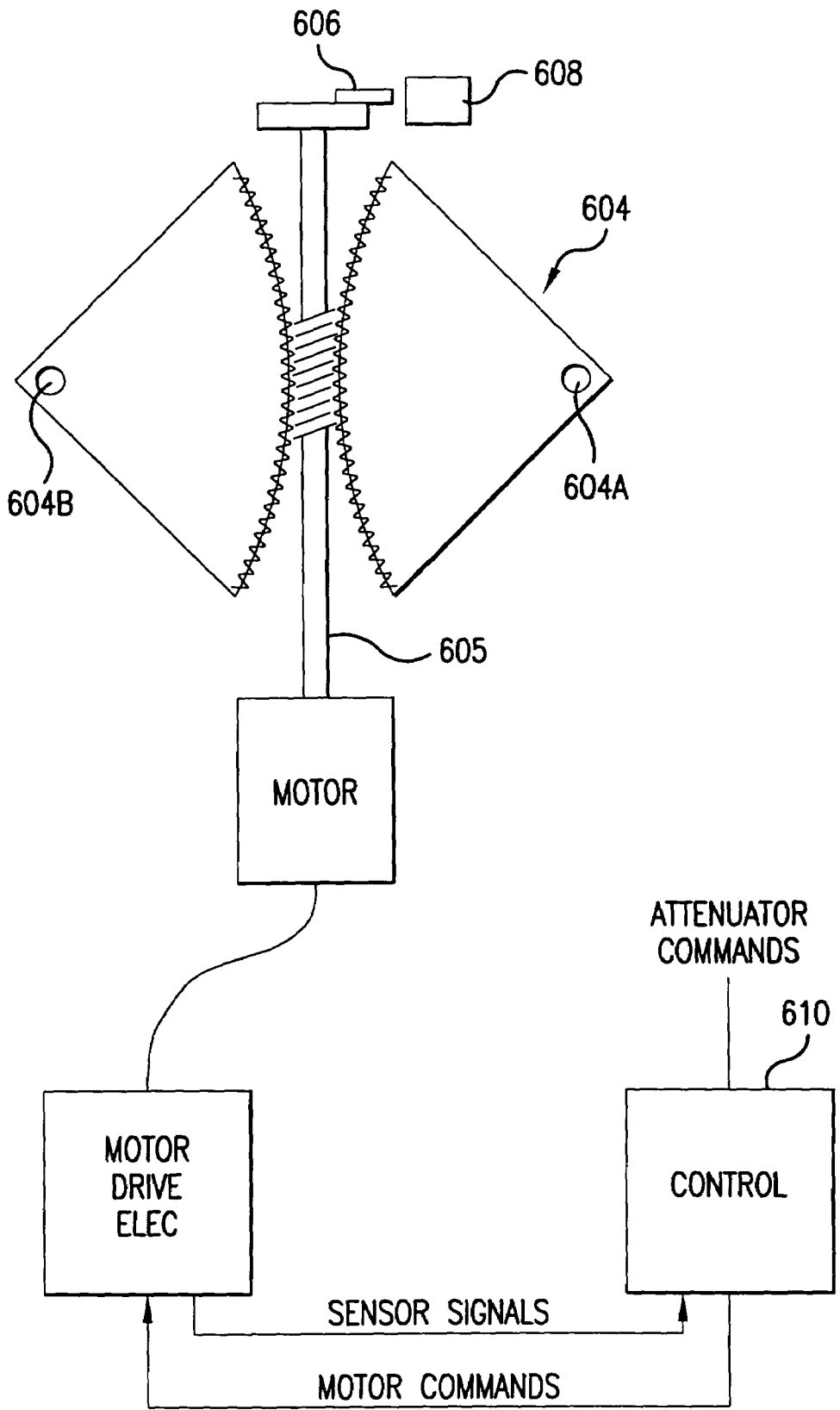

The attenuator unit is comprised of two sets of two wedges 600A, 600B, 602A and 602B as shown in FIG. 17A which are pivoted in opposite directions with a worm gear arrangement as shown at 604 in FIG. 17B. The wedge sets are mounted on shafts 604A and 604B. A magnet 606 attached to worm shalt 605 causes reed switch 608 to close once on each revolution of shaft 605 as shown in FIG. 17C so that a signal is sent to control unit 610 so that the radial positions of the wedge sets 600A and B and 602A and B are known.

Light enters from the left side of the FIG. 17A as shown at 612 and hits the first set of wedges 600A and B. Depending on the angle of incidence on the surface, light is partially reflected and partially transmitted off each surface. Thus, the first wedge reduces the amount of light transmitted and also bends the transmitted beam. The second wedge, while also further reducing the amount of transmitted light, corrects the pointing of the beam due to its equal and opposite wedge angle with respect to the first wedge. At this point, the exiting beam is much weaker, shifted with respect to the entering beam, and parallel to it. The second set of wedges 602A and B performs an equal and opposite geometric operation to the beam, thus ensuring that it exits parallel to and in line with the entering beam.

The concept relies on the matching of the wedge angles in each pair of wedges to avoid beam pointing shifts at the output, and relies on equal and opposite angles between the two wedge assemblies to avoid position shifts.

The total transmitted power is reduced due to the deflection of large part of the beam; when the incident angle of the first surface of the wedges is equal to the Brewster angle for the particular wavelength of light and the particular material chosen for the wedges, then most of the light (a total of over 92% of the power) is transmitted through the attenuator assembly. When the incident angle is shallower, the output beam power can be regulated, by changing the incident angle, the exit beam power can be reduced down to less than 3% of the incoming beam power.

A second effect of this design relates to the polarization of the output beam. Due to the fact that the wedge assemblies are aligned with one orientation of the beam, but are angled with respect to the other, the s- and p-polarizations of the incoming beam are affected differently by this assembly. Through correct alignment of the device, the effect can be a cleanup of the polarization. For example, typical Excimer Laser beams are up to about 98% p-polarized, and it is desirable to have this polarization number as high as possible after the attenuator system. With the design presented above, the p-polarized component of the beam is preserved, while the s-polarized component is reduced, leading to a net effect of increasing the p-polarization of the output beam.

Positioning of BDU Optical Modules

Traditional optical alignment techniques for aligning optical components within optical modules involve sighting directly down the optical path, using an optical telescope or similar tool to align the components. Applicants have developed a technique that allows optical components to be aligned without breaking into the beam path. The optical components within the optical modules are precisely aligned with respect to some reference points or targets on the outside surfaces of the module. Optical modules are fitted with reference targets and the optical modules are precisely positioned with an accuracy of about 0.25 mm according to a previously developed optics layout using a precision survey instrument such as a Total Station type survey instrument or other type of theodolites.

Visually accessible reference points on the modules must be precisely aligned to a known axis or other feature of the optical component or components within the module. If the optical path is contained within tubes, boxes or other geometry, then the reference points should lie on external surfaces of these containers. A Total Station transit (for example) can then be used to align the external reference points to some known design location, obtained from a model of the optical components. Three reference points are required to define the position and rotation of each optical module or other container of optical components.

Figure 12:
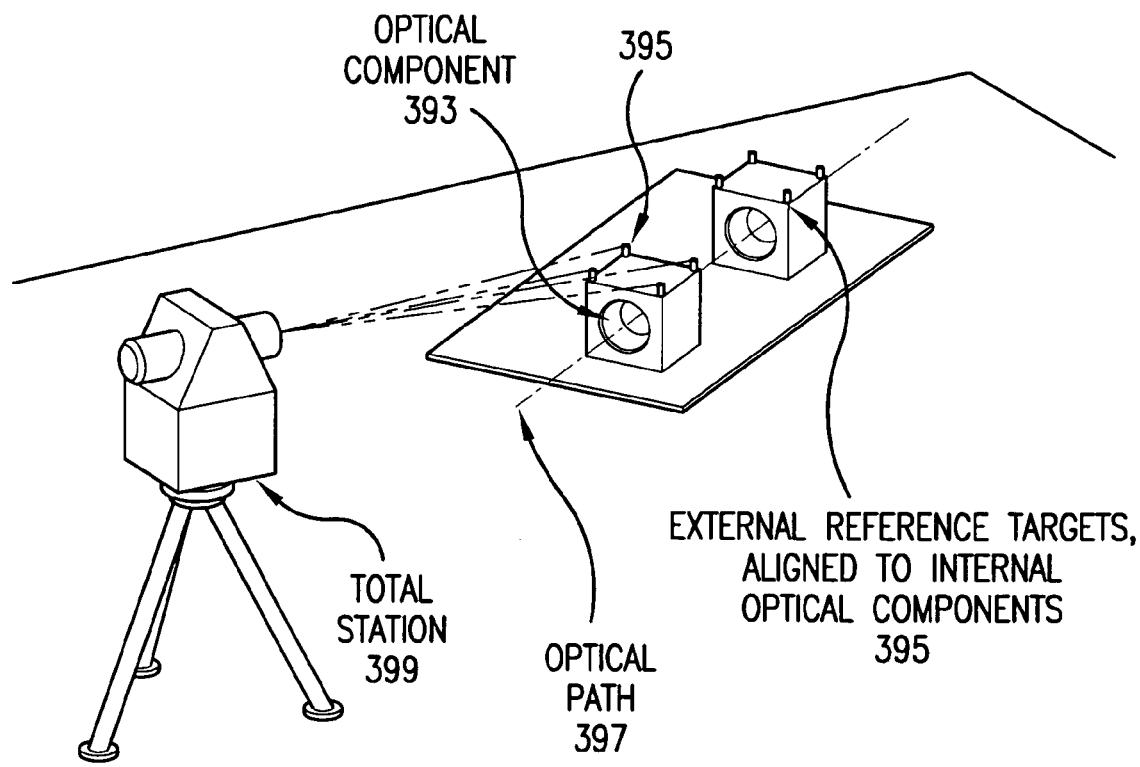
FIGS. 12, 12A, B, C, D, E and F show features of a module alignment technique.

See FIG. 12 as a general illustration of the concept. In this figure, a Total Station 399 is used to align a generic set of optical components (each housed in a separate container) along an optical path 397. Note that each of the external reference targets 395 on optical modules 393 must be pre-aligned to the internal optical components. Generally this is performed during the assembly of the components in the module.

Figure 12A:
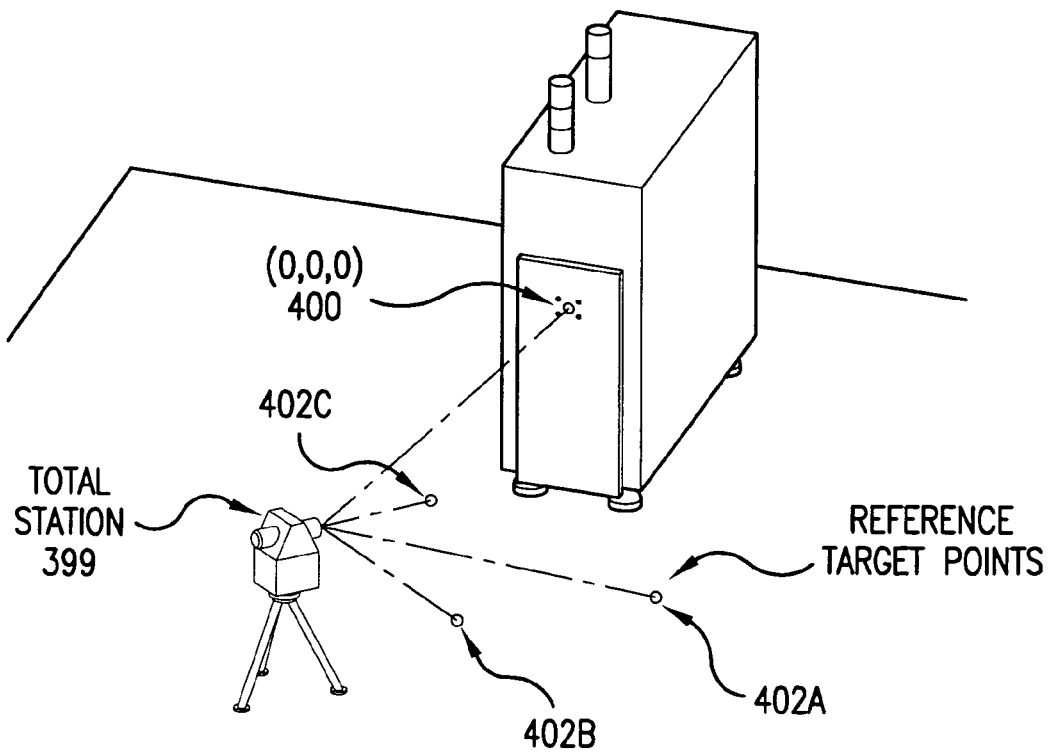
Figure 12B:
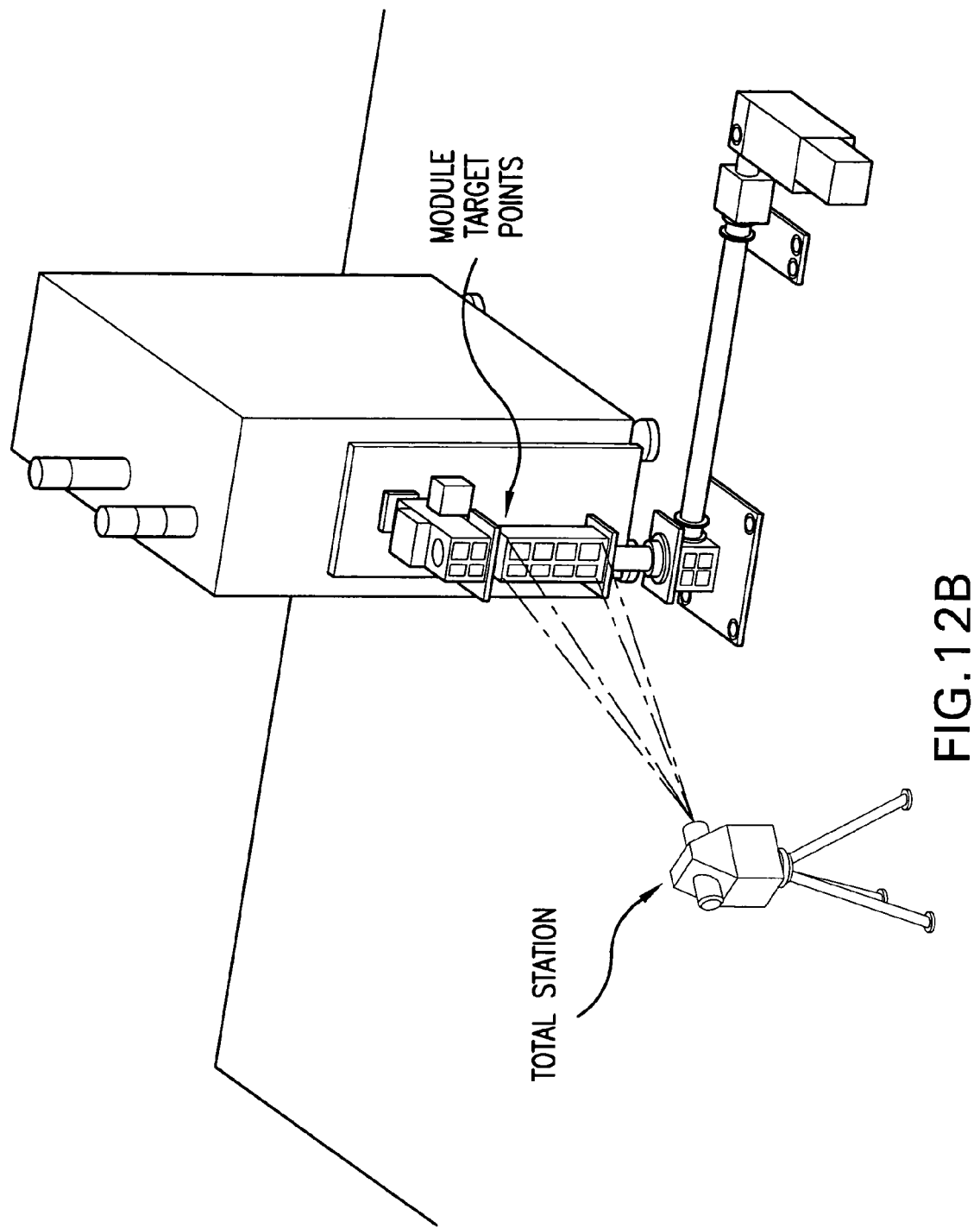

FIGS. 12 and 12A illustrate the methodology as applied on a preferred BDU. A summary of the methodology is as follows:

1. First, the Total Station 399 is used to locate the optical exit location of a laser. This location is recorded using the Total Station and defined as point (0,0,0) in a global coordinate system, as shown at 400 in FIG. 12A.
2. The locations of three or more fixed reference targets are located and measured using the Total Station. These fixed reference targets must be permanent immovable targets in the room (typically directly on a wall, floor or ceiling), as shown at 402A, 402B and 402C in FIG. 12A. Once the reference target locations are recorded, the Total Station can be moved and re-oriented as required.
3. The positions of target points on the modules requiring alignment are imported from a 3D CAD model of the system. The origin of the model (i.e. point (0,0,0)) should correspond to the optical exit location of the laser as defined in step 1.
4. The actual positions in space of the module target points are measured with the Total Station, as shown in FIG. 12B.
5. The measured position of each target point (from step 4) is compared to the design position of the corresponding point (from step 3) using the Total Station software.
6. Any difference between the measured and desired location is corrected by moving the module the distance indicated by the Total Station software.
7. Steps 4 through 6 are repeated until the module is aligned to within a pre-determined accuracy (typically 0.25 mm).

Figure 12C:
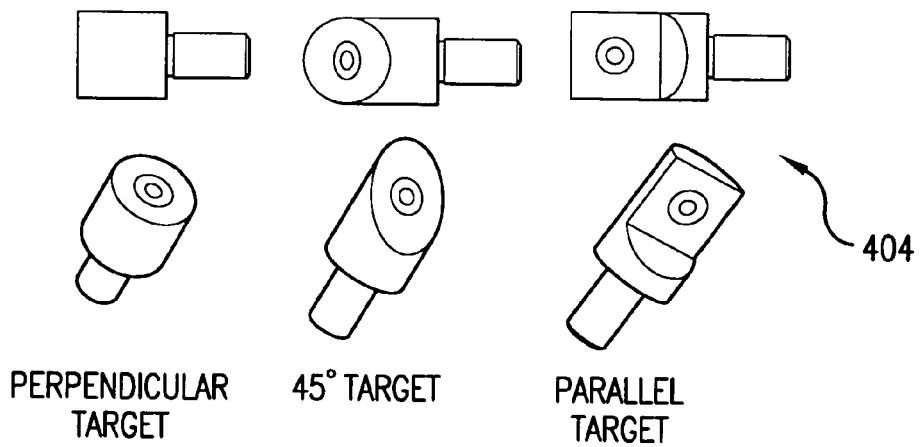
Figure 12D:
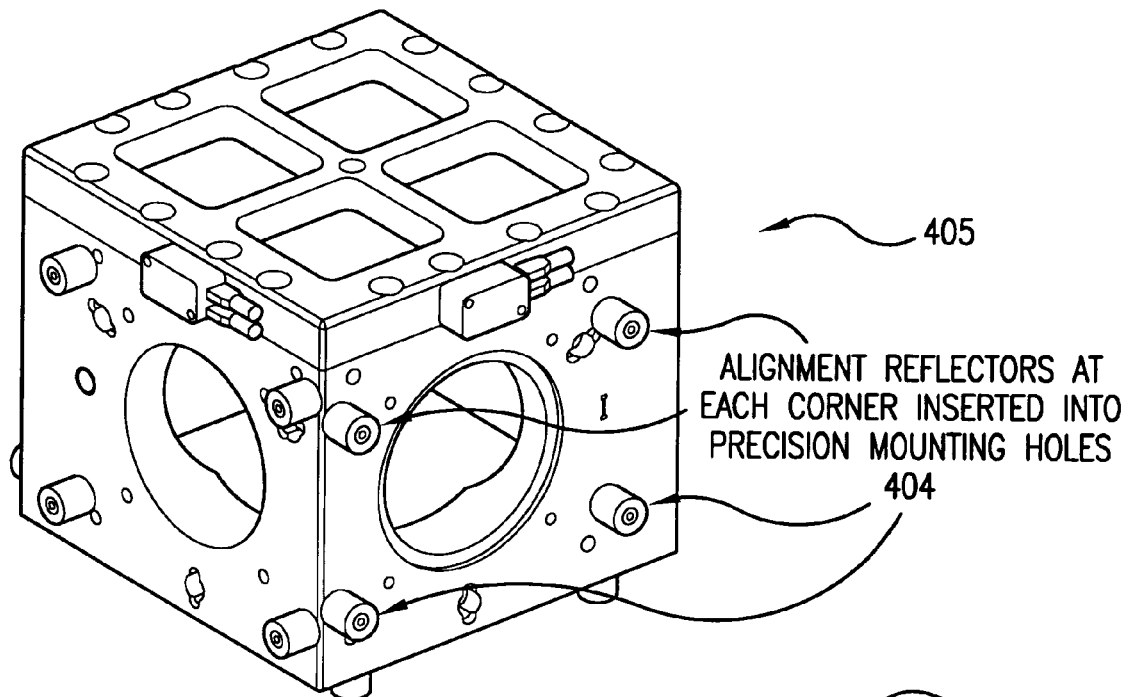

A number of tools used to perform the procedure above are shown in FIGS. 12C, 12D, 12E and 12F. FIG. 12C shows two views each of three precision mounting targets 404 used to align the modules. The targets are available from suppliers of survey equipment in these three configurations to allow viewing of the targets from various angles. The targets can be inserted in precision drilled reference holes on each module (preferably four or five holes are provided on each of four faces). FIG. 12D shows a set of the targets 404 inserted in the precision holes in module 405. A total of three target points are needed to align each module. The extra holes allow flexibility in target placement, as each of the three targets must be visible from the Total Station.

Figure 12E:
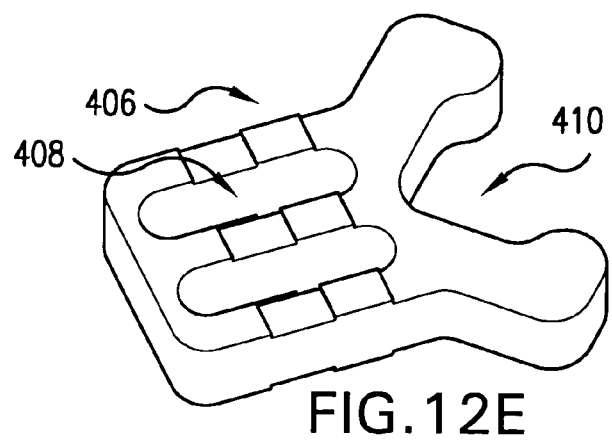
Figure 12F:
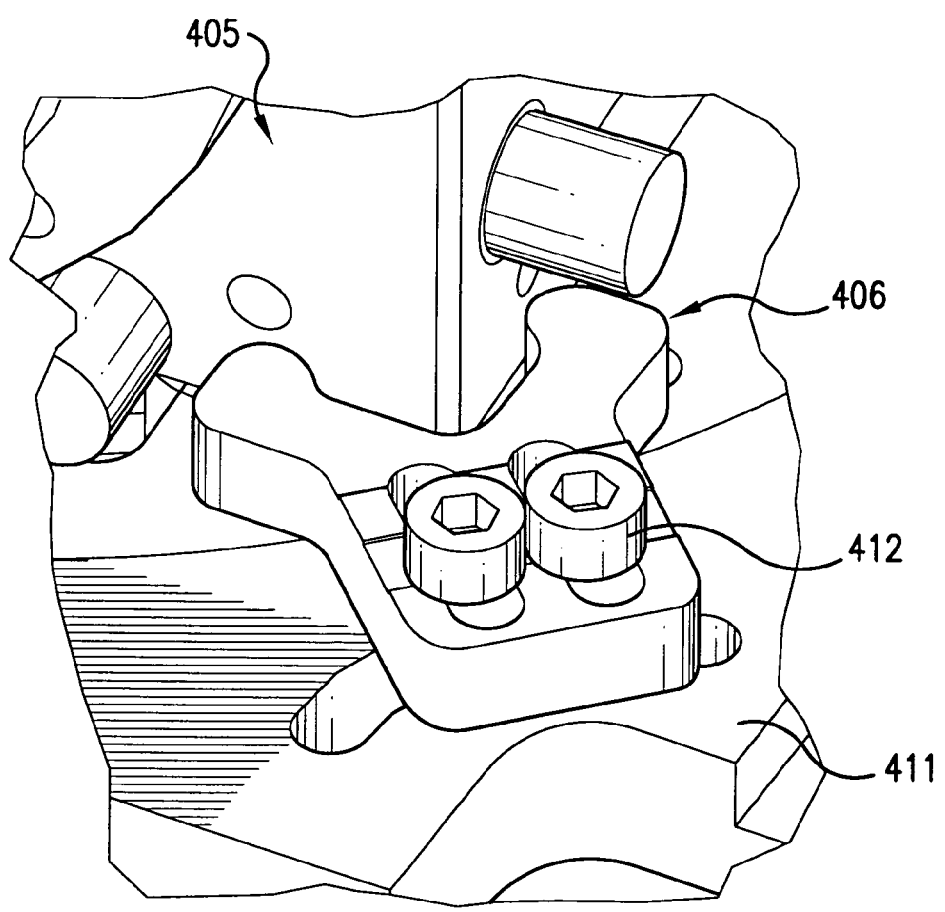
Figure 13A:
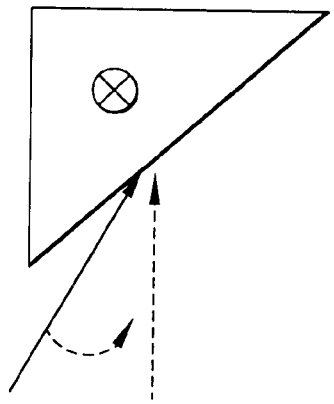
FIGS. 13A through 15C show components and features for controlling beam polarization.
Figure 13B:
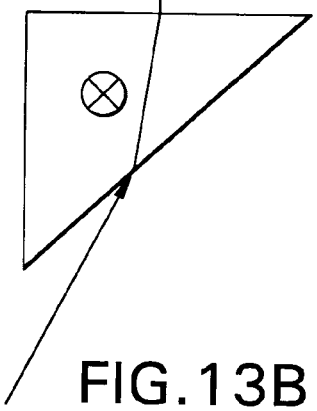
Figure 13C:
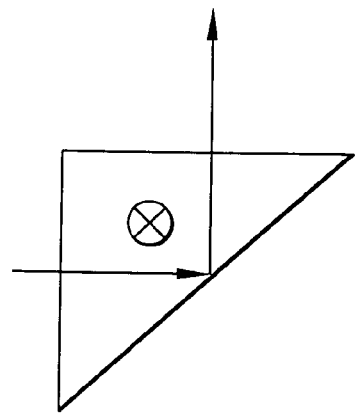
Figure 13D:
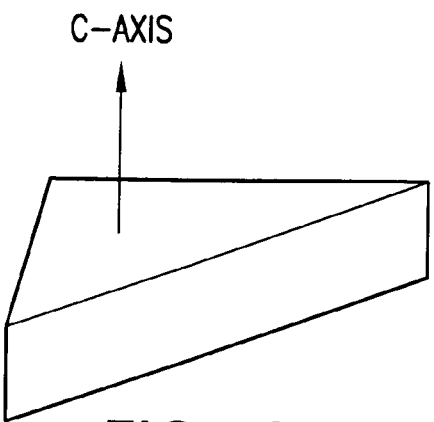
Figure 14A:
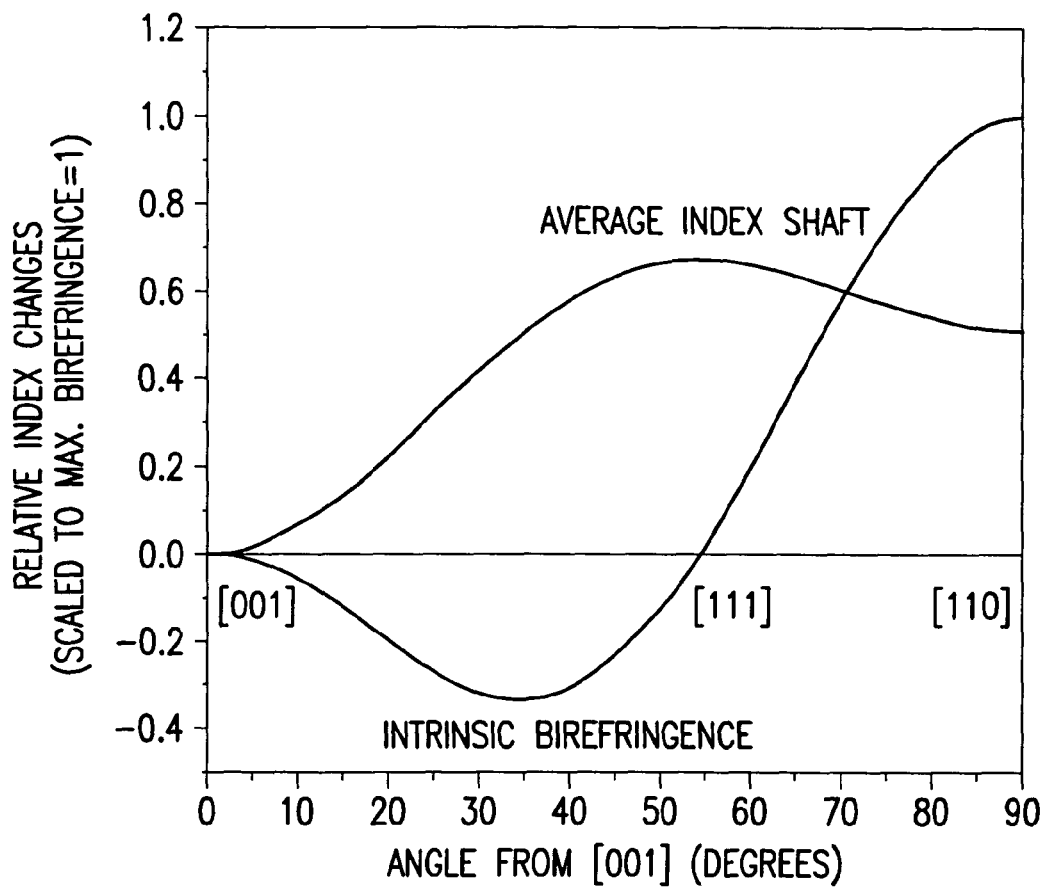
Figure 14C:
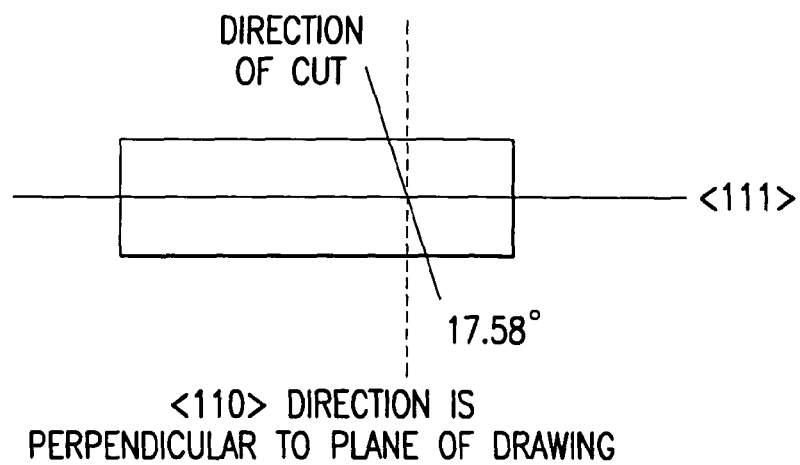
Figure 14B:
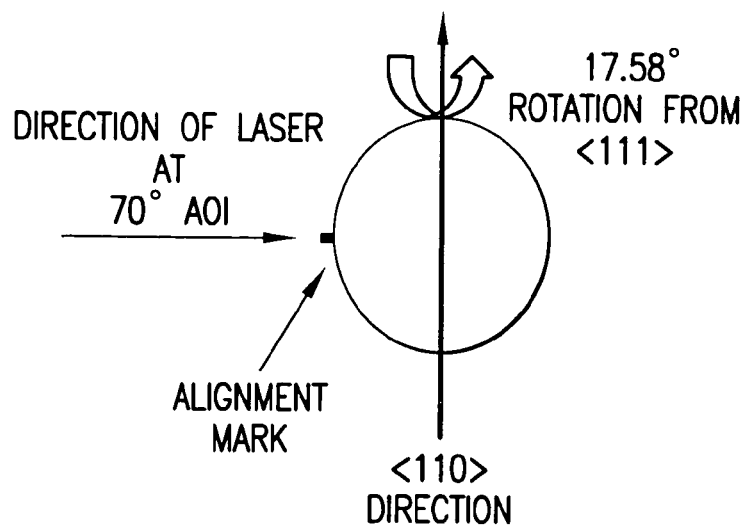
Figure 14D:
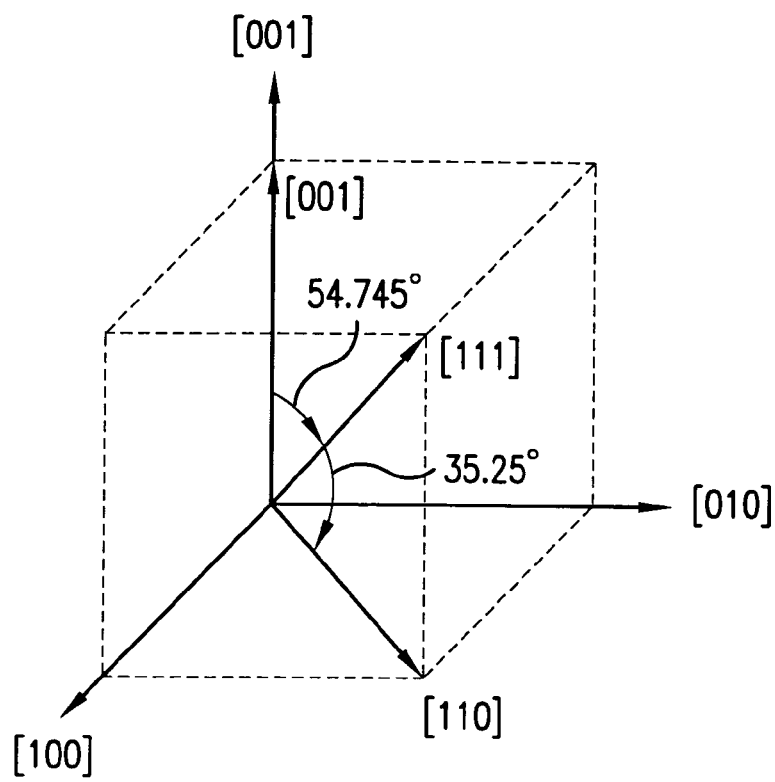
Figure 15A:
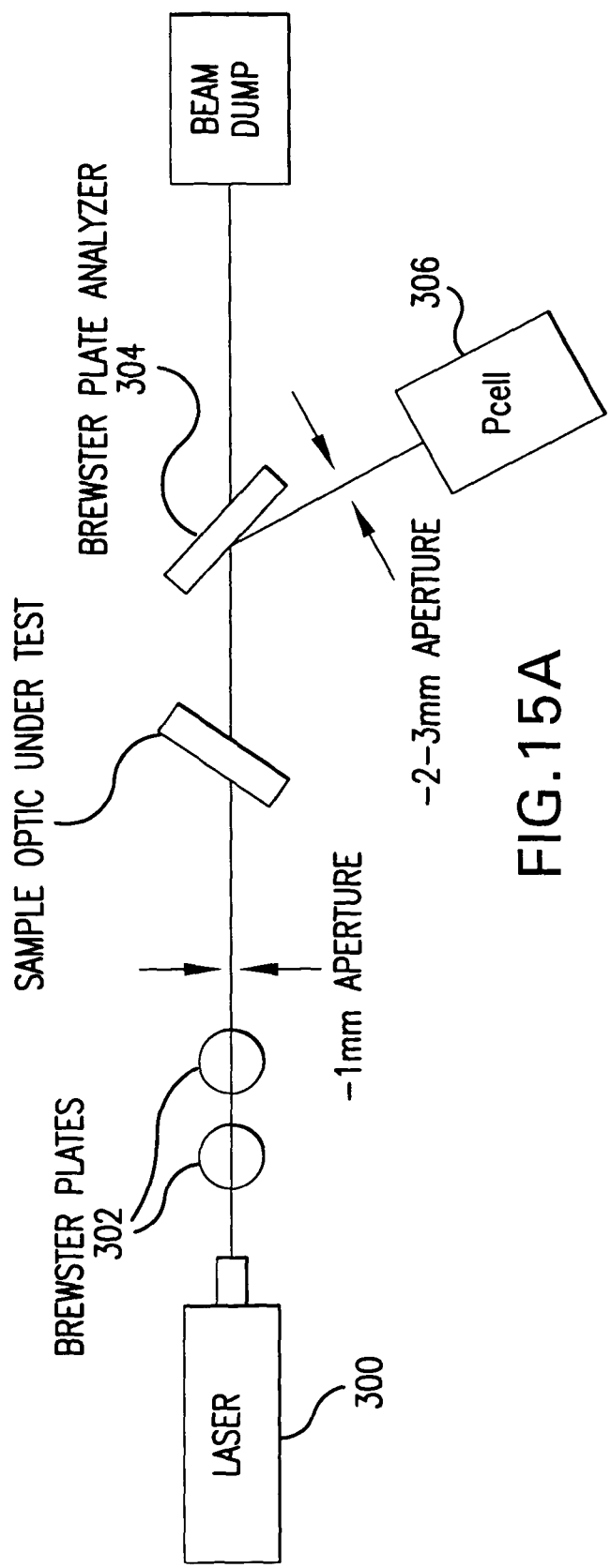
Figure 15B:
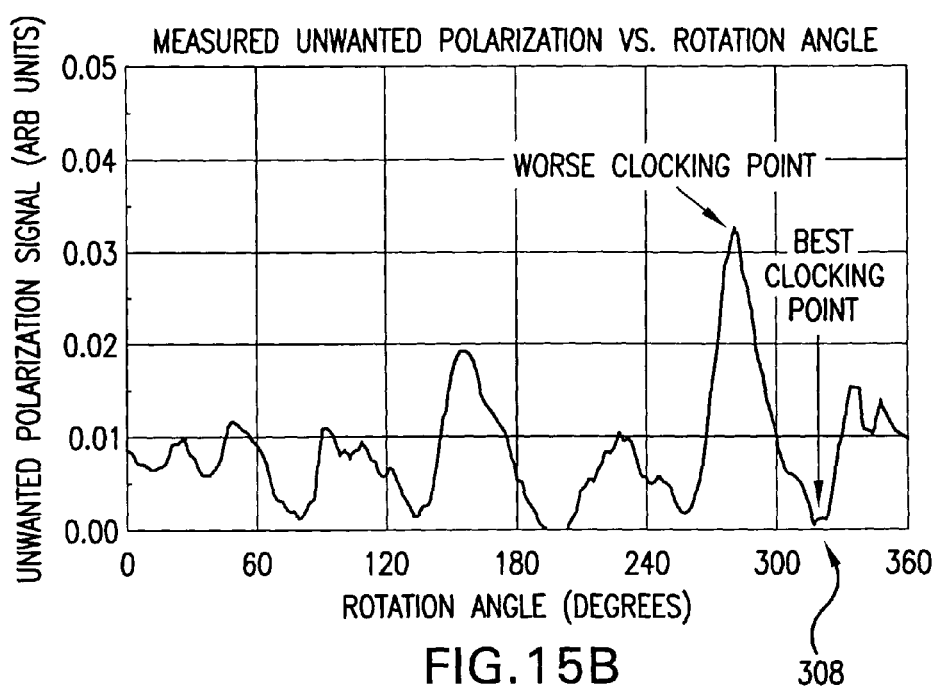
Figure 15C:
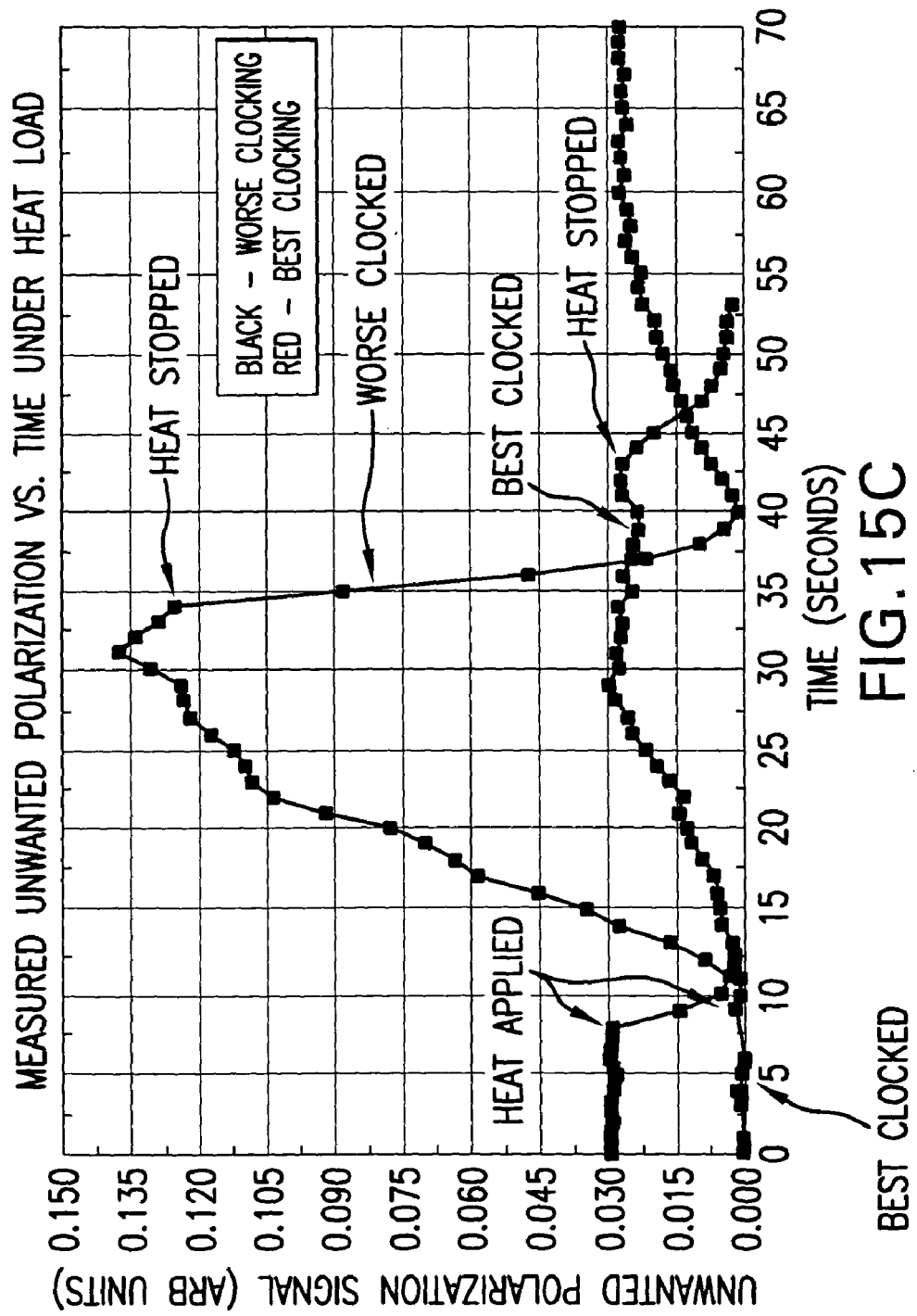
Figure 16A:
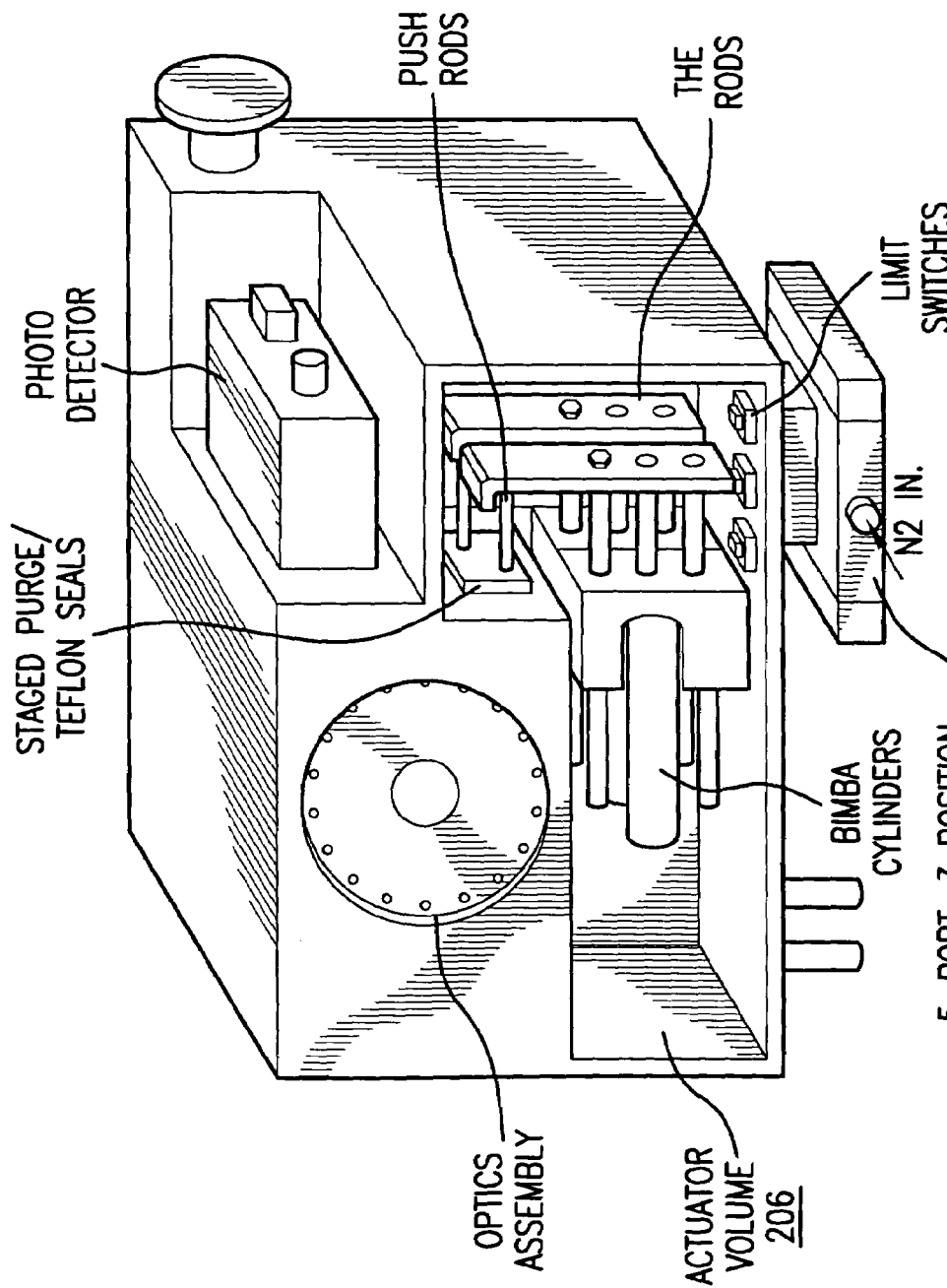
FIGS. 16A through 16I show features of a preferred shutter.
Figure 16B:
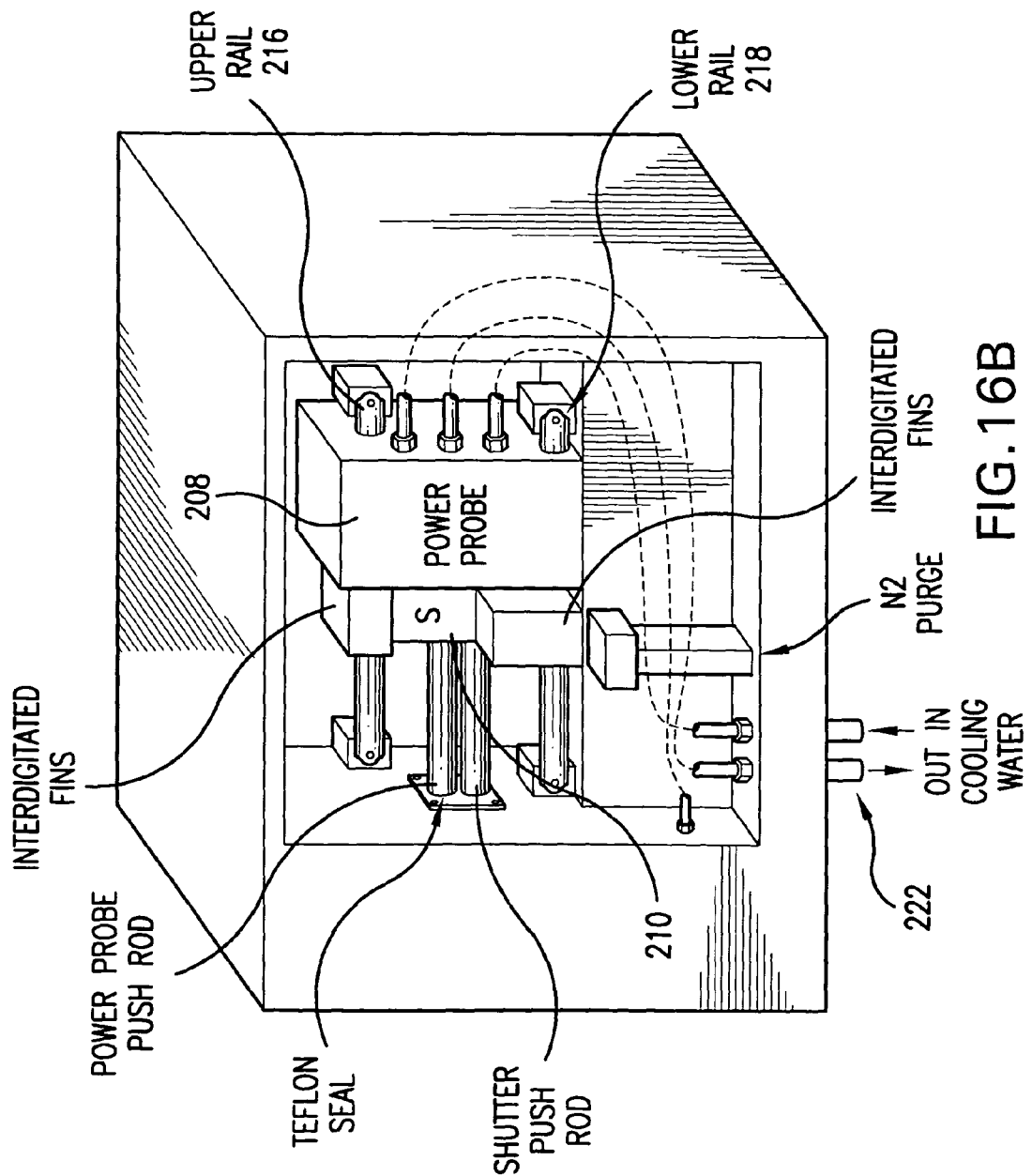
Figure 16C:
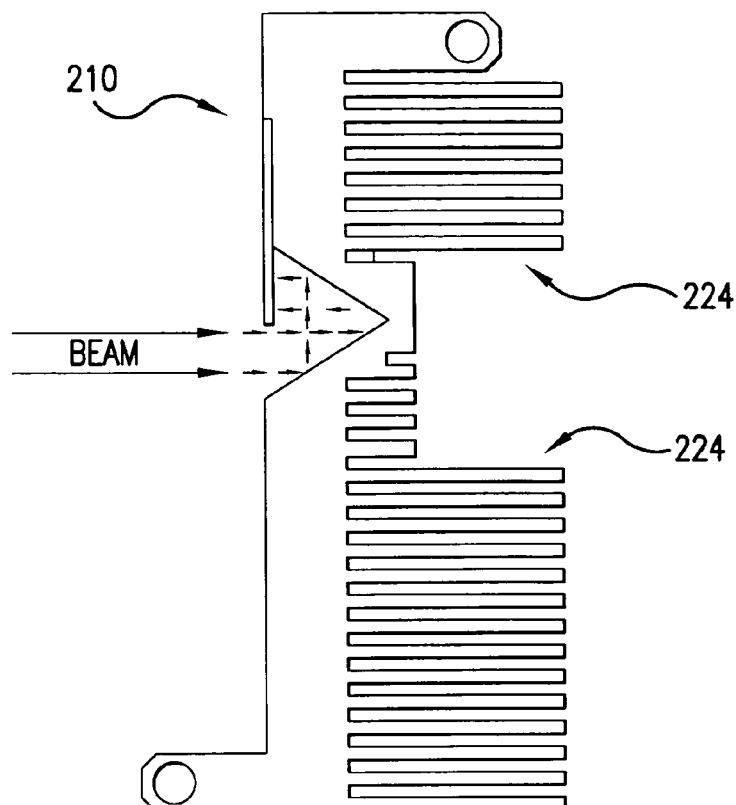
Figure 16D:
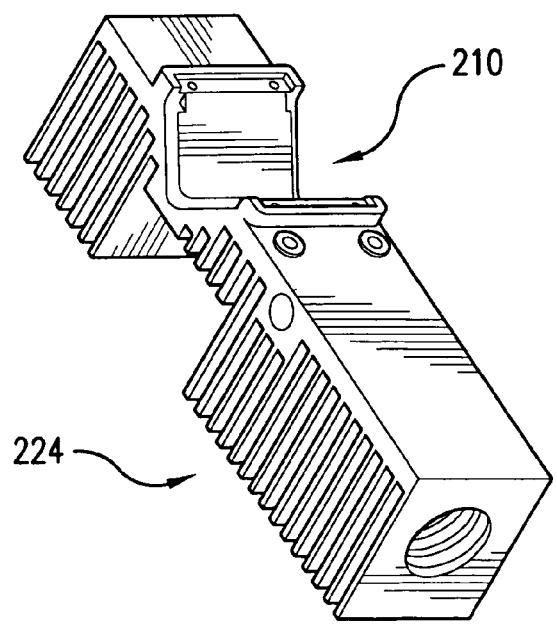
Figure 16E:
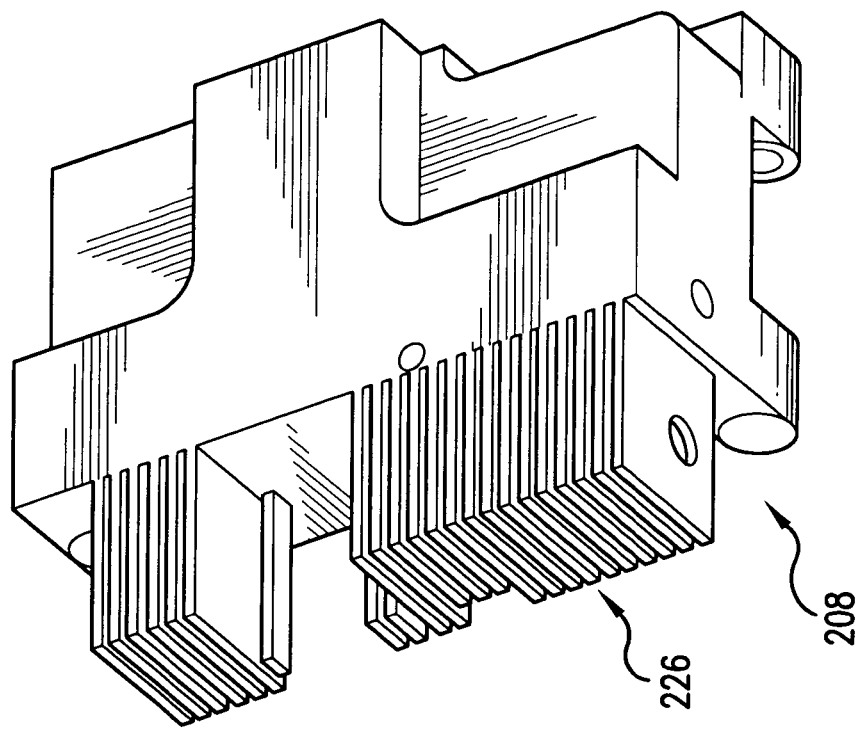
Figure 16F:
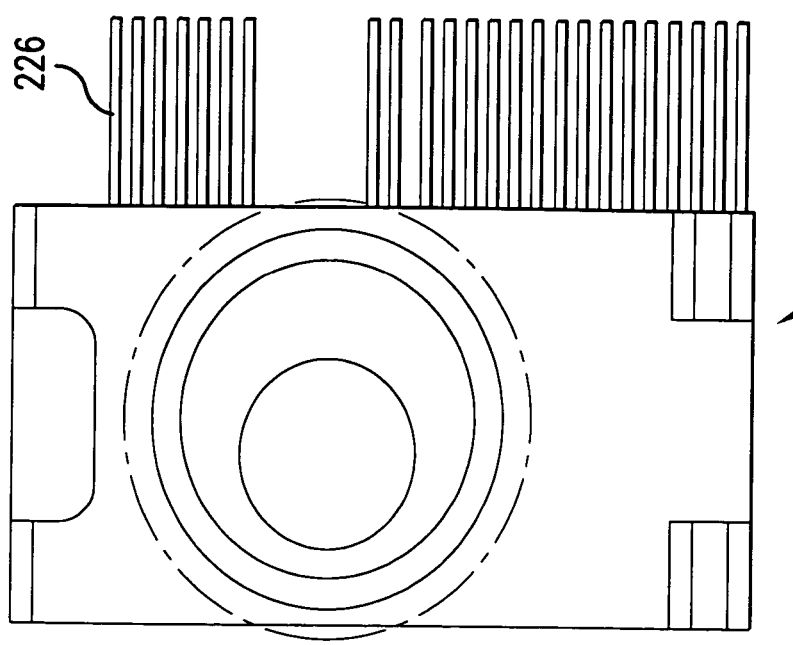
Figure 16G:
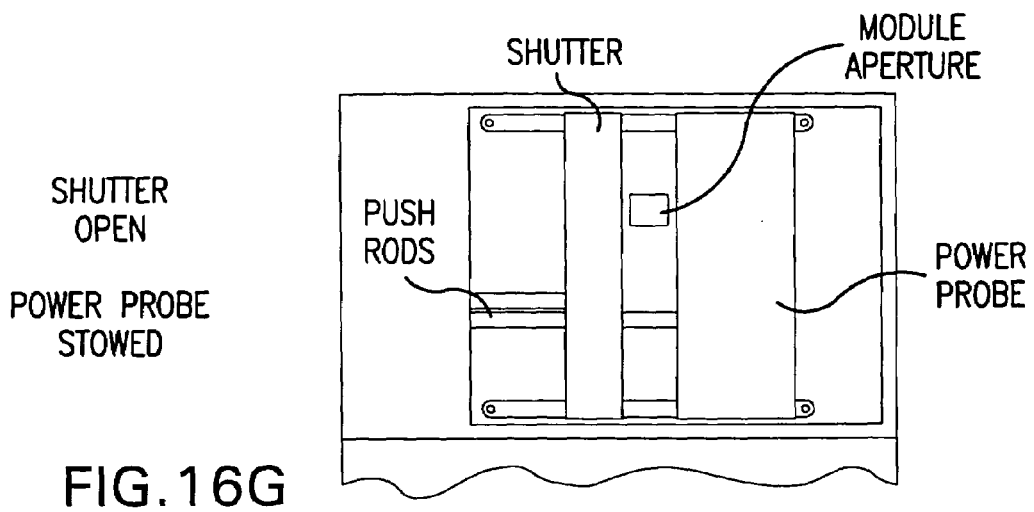
Figure 16H:
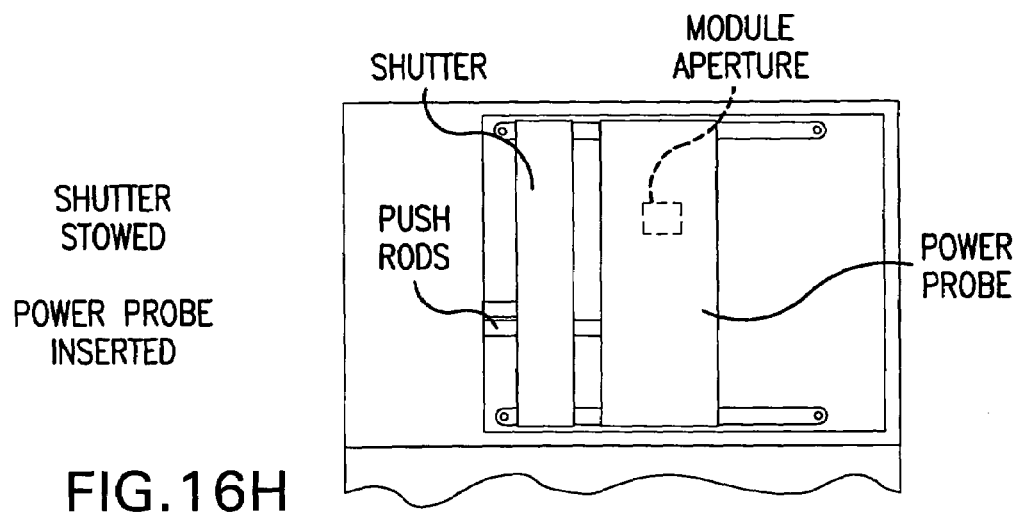
Figure 16I:
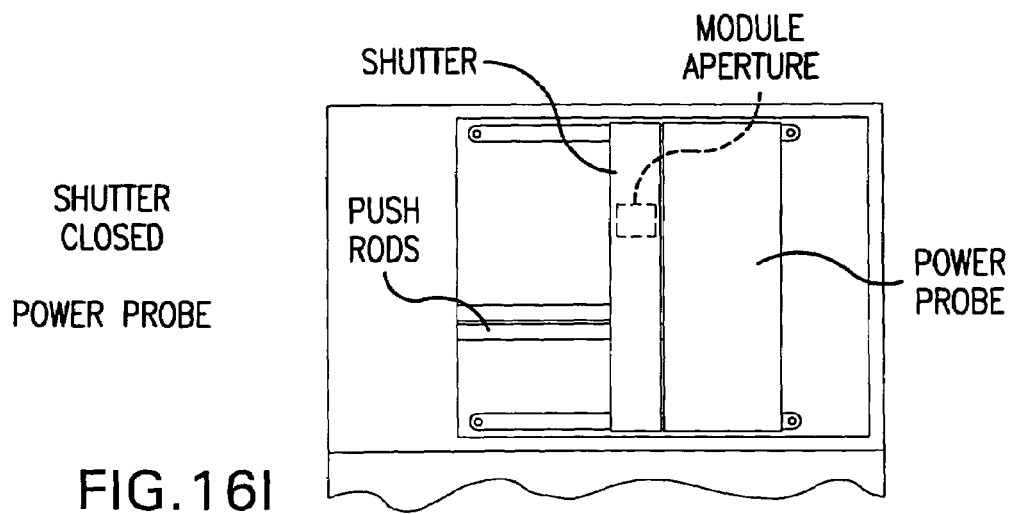

After a module 405 has been aligned, it may be necessary to remove the module for service or replacement. Rather than using the Total Station to re-align the module, a device that marks the position of the module is desirable. FIG. 12E shows a "Memory Device" 406 that is used to locate the position of a module alter it has been aligned. It is basically a metal part with two bolt slots 408 and a "c" shaped gap. The c-shaped gap is snugly fitted around a corner of an optics module and then the Memory Device is firmly bolted to an alignment plate 411 on which the optics module sets with bolts 412 as shown in FIG. 12F. By affixing two of the Memory Devices around each of two corners of a module, the location of the module is fully defined. If a module is removed for maintenance a replacement module having optical components located identically to the ones in the replaced module, the replacement module can be placed in the exact same position as that previously occupied by the replaced module without any manual alignment. In this case the alignment ranges of the automatic alignment components discussed above are large enough so that the system automatically completes the final steps of precise alignment.

Polarization Considerations

In the master oscillator 8 resonant cavity optical components including two windows and three prisms are oriented with surfaces oriented vertically providing several angles of incidence, with the developing laser beam, close to Brewster's angle. Therefore, beam 14A exiting the master oscillator 8 is strongly polarized with about 98 percent of the electric field component of the beam being in the horizontal direction and about 2 percent being in the vertical direction.

Figure 4D:
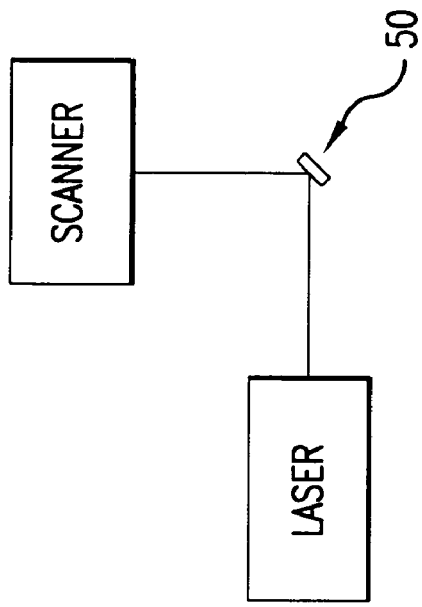
Figure 4C:
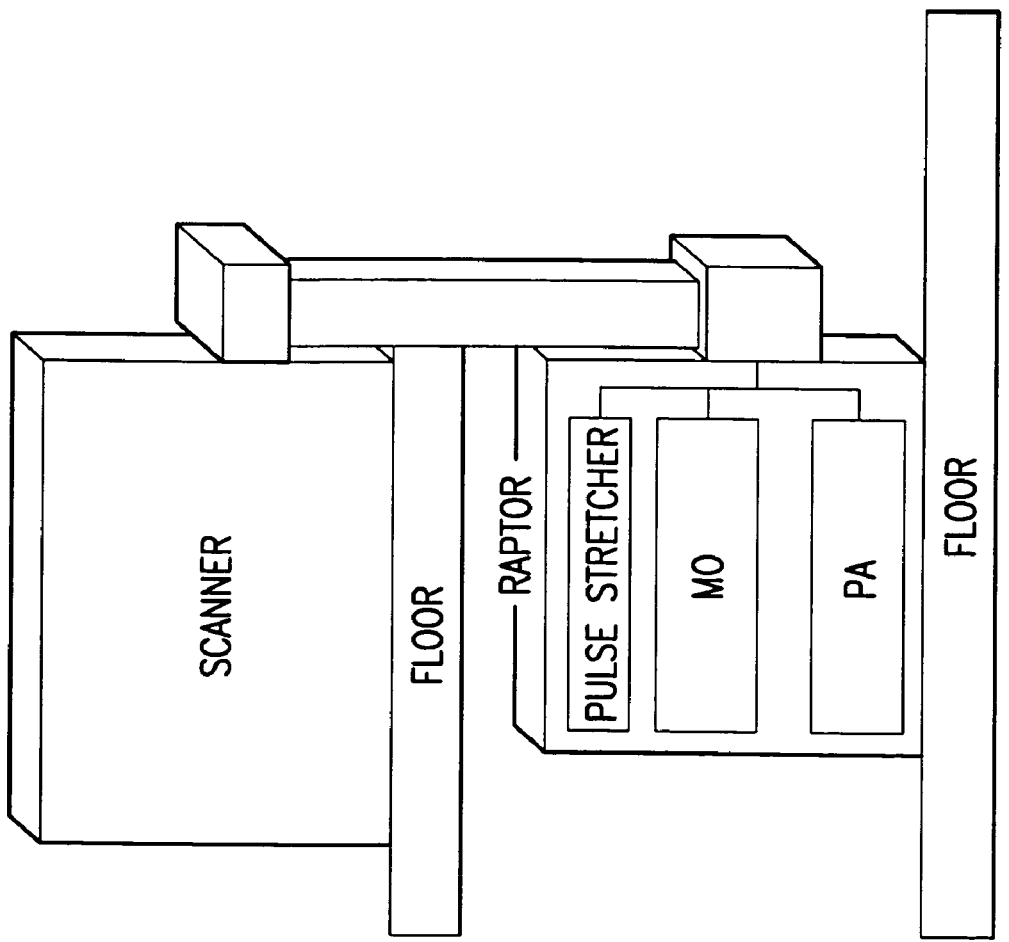
Figure 6:
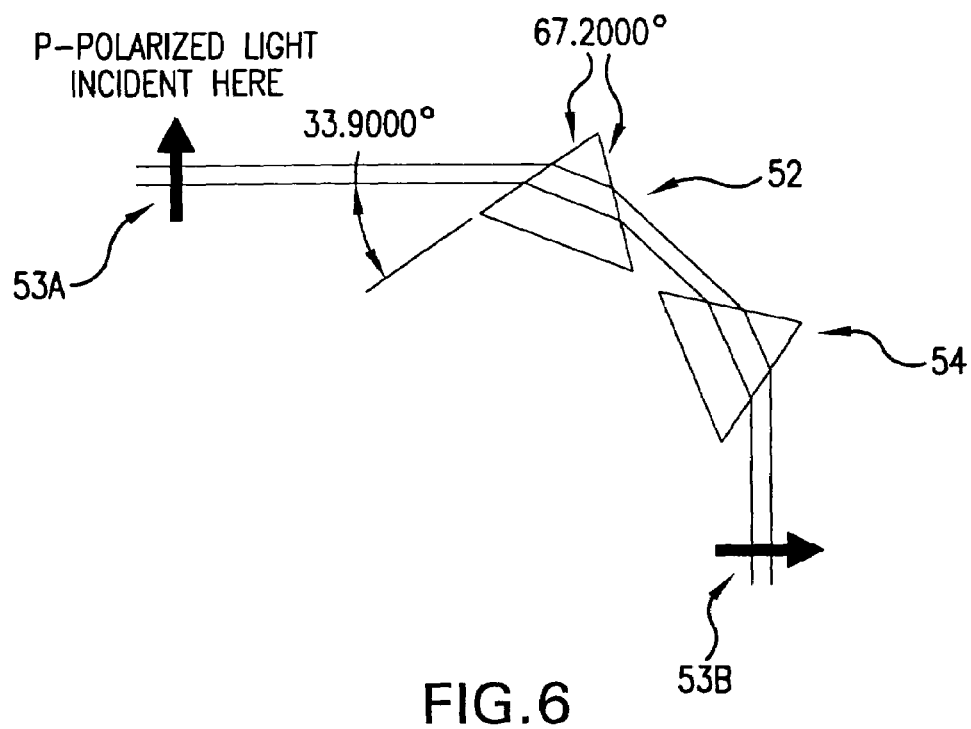
FIG. 6 shows a technique of turning a beam 90 degrees with prisms.

When using dielectric coated mirrors at 45 degrees for beam turning, it is important to take into consideration polarization effects because with these mirrors S-polarization is reflected nearly 97 percent whereas P-polarization is reflected only 90 to 92 percent. (P-polarization refers to the electric field component of the light which is in the plane defined by the beam direction and a line perpendicular to the optical surface at the intersection of the beam direction and the surface. S-Polarization refers to the direction of the electric components of the light in the plane of the surface and perpendicular to the P-polarization). Therefore, to maximize reflection from turning mirrors, it is important that the S-polarization direction corresponds to the polarization of the incoming beam. As the reader will note minors 40A and 40B are both oriented so that the S-polarization direction is horizontal corresponding to the electric field direction of about 98 percent of the light in output beam 14C; therefore reflection should be about 97 percent from these mirrors. The mirror shown in the BDU shown in FIGS. 4A, 4B and 4C are all properly for oriented maximum reflection of horizontally polarized light However, the mirror shown at 52 in FIG. 4D is oriented so that the P-polarization direction is in the direction of the electric field direction of 98 percent of the light in the beam so that reflection by this mirror would be only about 90 to 92 percent. In this ease Applicants preferred solution is to utilize two prisms to make the 90-degree beam turn at the 50 location in FIG. 4D. This technique is shown in FIG. 6. Two prisms 52 and 54 with an apex angle of 67.2-degrees (the angle is important) can change the angle of incidence by 90 degrees for the s-polarized light. The beam enters and exits the prism at Brewster angle, so there is no reflection at all of light in the horizontal direction. The portion of the beam polarized in the vertical direction would be mostly reflected by the first prism. The layout is done for 193 nm and CaF2 prisms. (Minor modifications would be needed for 248 nm or 157 nm). Since no coatings are involved, the lifetime of this assembly is very high.

As the horizontal polarized light passes through the two prisms at location 50 in FIG. 4D the direction of polarization of substantially all of the electric field components is reoriented from horizontal to vertical as indicated by arrows 53A and 53B as shown in FIG. 6.

Purge Shutters for Mirrors

Figure 7:
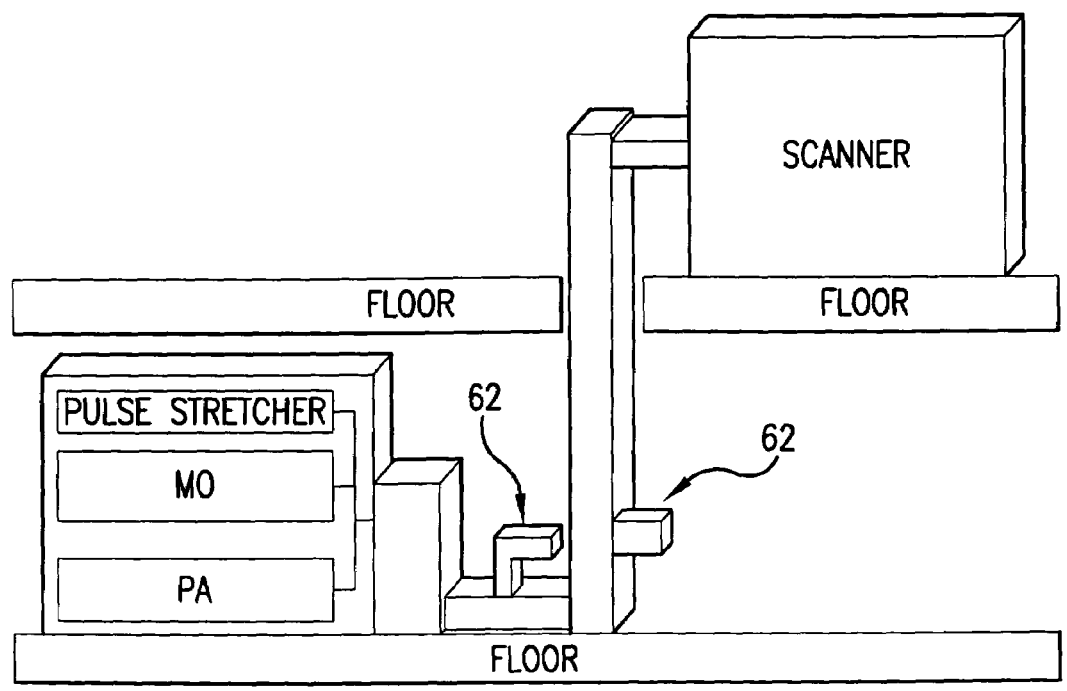
FIG. 7 shows a laser light source with beam delivery to a scanner.

The BDU volume could be large, as much as 200 liters and must be purged with high purity $N_2$. This purging process may take several hours to get to the free ppm level of oxygen and other organics. During the first installation of the BDU to the scanner, this purge time is acceptable, but is considered very long during normal operation. Assume that a mirror, such as mirror 60 in FIG. 4A needs service. This may entail dismantling the mirror from BDU which could expose the BDU to air. Hence, what could be a brief service procedure (replacing the minor) turns Into a very long purge procedure. To avoid substantial delays associated with a long purge period to restore the quality of the beam path in the BDU, BDU shutter units 62 are added on both sides of each mirror in the BDU as shown in FIG. 7 for mirror 60.

Here, In the BDU are located several inserts where service shutters may be inserted to isolate the other regions in a BDU. These shutters are normally not inserted during operation. For example, as shown in FIG. 7, two shutters are slid around mirror 40A that needs to be isolated and the rest of the BDU and then the mirror itself is replaced. After that, this exposed region is now purged with $N_2$ for a few minutes. The purging interval is much shorter now due to the fact that the volume exposed to air is much smaller than the total volume of the BDU. Preferably during the servicing purging continues in all regions of the beam path other than that between the shutters.

Beam Path Purge

In this preferred embodiment all portions of the beam path outside the laser chambers are purged with $N_2$, with two exceptions: (1) The line narrowing package and the portion of the path between laser chamber 8C and the LNP is purged with helium and (2) the etalon chambers in the LAM, SAM and BAM for measuring wavelength and bandwidth are sealed chambers. FIG. 1 shows a purge gas supply at 42 but the purge lines are not shown. Excellent examples of purged beam paths are described in detail in U.S. patent application Ser. No. 10/000,991 which is incorporated by reference herein. This technique includes metal bellows and easy sealing vacuum quality seals at interfaces between the vibrating chambers and the sensitive laser optics and vacuum quality seals at interface between all separate modules permitting quick separation of the modules to permit fast module removal for maintenance or for service. FIGS. 8A through B show drawings of preferred easy sealing bellows seals units with parts 93A, B and C useful for making connection for components in the beam path from the LNP to the scanner. Either of the clamps shown in FIGS. 8C and 8E can be used to clamp parts 93A and 93B together with the Un coated metal C-seal sandwiched in between. FIG. 8D shows a cut-away of the assembled seal unit. The seals in the seal units are metal "C" seals preferably with a tin contain layer. The metal seals do not deteriorate or allow out gas contamination under ultraviolet irradiator.

Beam Path Monitor

Preferably monitors are provided to assure the quality of the laser beam path since contamination of the path with absorbers such as oxygen can substantially affect beam quality and pulse energy. Preferably several purge paths will be provided. Flow monitors can be used to monitor purge flow; however, other monitors may also be provided such as $O_2$ monitors which are commercially available from several suppliers.

Another beam path quality monitor includes an acoustic monitor utilizing a electret electronic microphone available from suppliers such as Audio Products with offices In Dayton, Ohio. This type of monitor is described in U.S. Pat. No. 10/000,991 which is incorporated by reference herein. In preferred embodiments these monitors are used to provide signals which may be used by the lithography operator to delay fabrication after a shutdown until the beam path purge has sufficiently cleared the beam path of contamination.

Beam Profile Flipping

For integrated circuit fabrication coherence of the laser beam is undesirable. Excimer laser beams characteristically have poor coherence which is one of the many reasons why this light source is good for integrated circuit fabrication. However, as other aspects of the beam quality continue to get better, even the poor coherence of the laser beams from these lasers may not be poor enough. If that turns out to be the case a coherence scrambler can be added. It could be added at several places in the beam path. A good place for it would be anywhere in the beam delivery unit.

Figure 9:
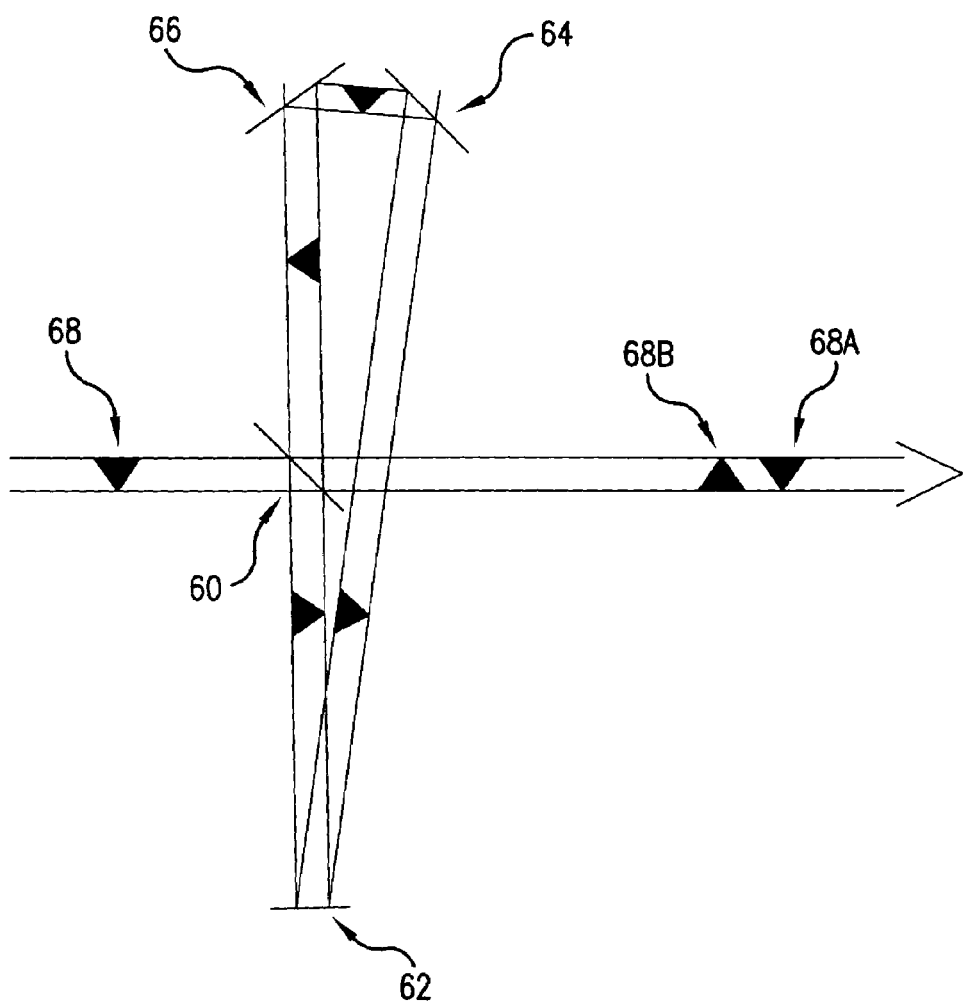
FIG. 9 demonstrates a feature of a preferred pulse stretcher.

FIG. 9 shows an example of a beam profile flipping coherence scrambler. This is produced with a 60 percent beam splitter 60 and three maximum reflection mirrors 62, 64, and 66. This arrangement segregates the pulse into segments in a manner similar to the pulse stretcher discussed above. But with this configuration the profile of each segment is flipped with respect to the preceding segment. In the FIG. 9 example the profile of the incoming pulse 68 is represented with a triangle with a point at the bottom. The first segment, 40% of the pulse intensity passes through with the same profile as shown at 68A. The reflected portion suffers reflection at each of the minors and 60 percent of it is reflected from beam splitter 60 that segment has a profile shown at 68B which is flipped with respect to profile 68A. As subsequent segments pass through the coherence scrambler their profiles are each flipped with respect to the preceding segment. Thus, the net profile of the beam will be scrambled and more importantly any coherence will also be scrambled. The reader should note that in this embodiment there will be no significant pulse stretching unless the legs are long enough to provide significant delays of the segments following the first one. Since we have already stretch the pulse as described above the legs here could be very short such as a few inches in which case the segments will overlap each other.

Pulse Energy Detection at Wafer Plane

In preferred embodiments of the present invention as shown in FIG. 1 a pulse energy detector 44 is provided at wafer plane 46 in the scanner. Pulse energy signals this detector may be used in a feed back loop to control the energy output of the laser directly. Alternatively, the signals may be used for the purpose of determining pulse energy parameters as measured at the BAM or the SAM which will provide the illumination needed at the wafer plane.

Optics Monitor

Preferred embodiments of the present invention produce pulse energies approximately twice as large or greater than state-of-the-art lithography lasers currently in use. Repetition rates are at least as great or greater than this state-of the-art-lasers. These pulse energies and repetition rates pose potential danger to optical components such as mirrors, lenses and prism used in the laser system and downstream of the laser. When and if these components fail they adversely affect beam quality. However, with many optical components in the beam, finding the deteriorated optic may be difficult. A preferred solution to this issue is to attach a thermocouple to the optical components to permit easy monitoring of the temperature of the component.

The signals from the thermocouple may be read periodically by a data acquisition computer which may be programmed to provide a warning if temperatures exceed a predetermined threshold. A preferred technique for monitoring mirrors is to attach the thermocouple to the back of the mirror with solder or an eproxi. The thermocouple may be attached to the edge of lenses and prisms or to the lens or prism mounts.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam.

Prototype Beam Delivery Unit

Figure 11B:
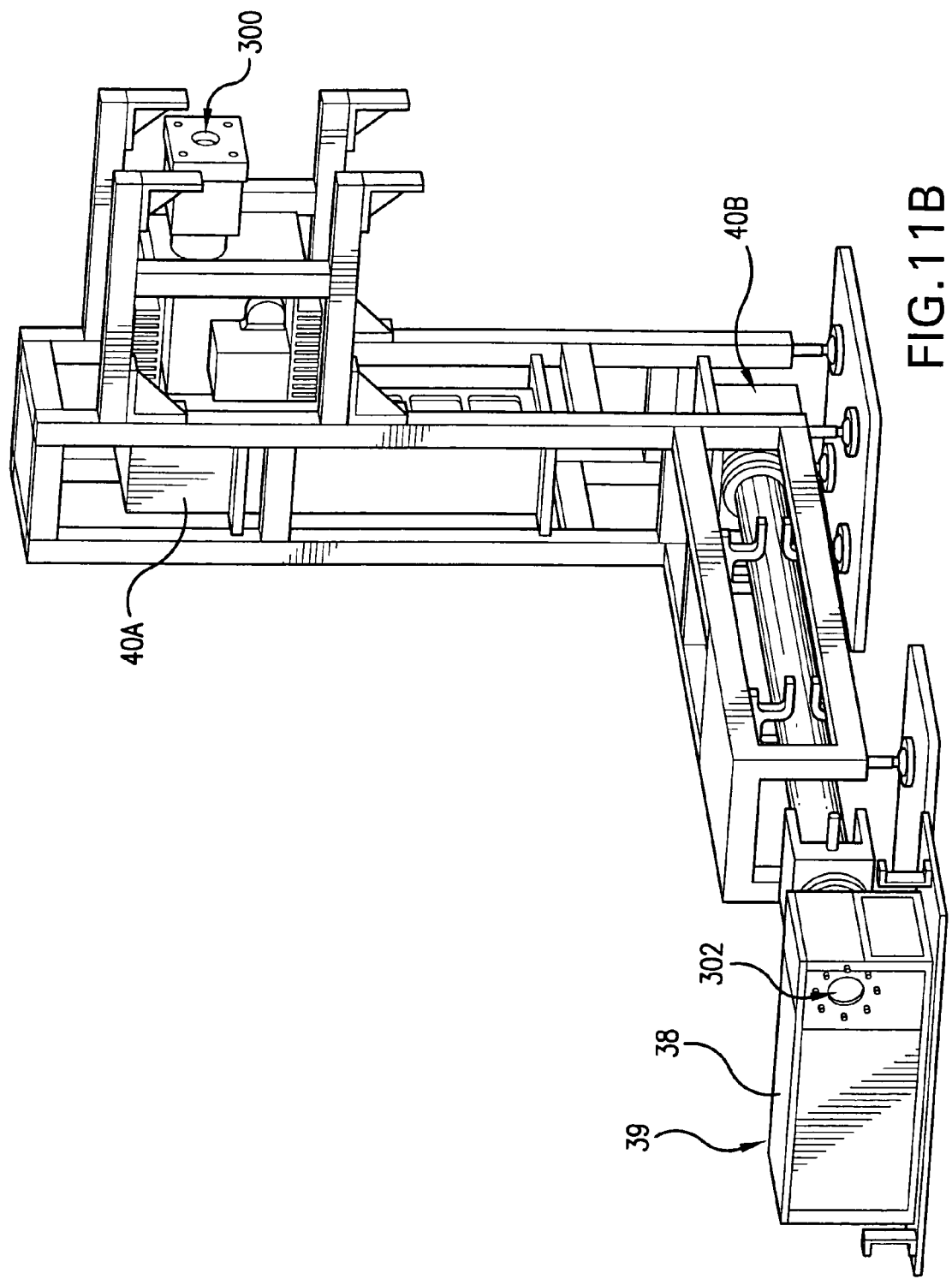

A production ready prototype beam delivery unit built and tested by Applicants is shown in FIG. 11A. The output of a laser system enters the BDU at location shown at 300 and the BDU delivers the beam to a stepper machine at location shown at 302 FIG. 11B. The beam path is completely enclosed and is purged with nitrogen. The unit includes metrology module 38 and two high speed precision turning minors located at 40A and 40B. Beam stabilization controller is shown at 39. Another view of the prototype unit is shown in FIG. 11B.

Figure 11E:
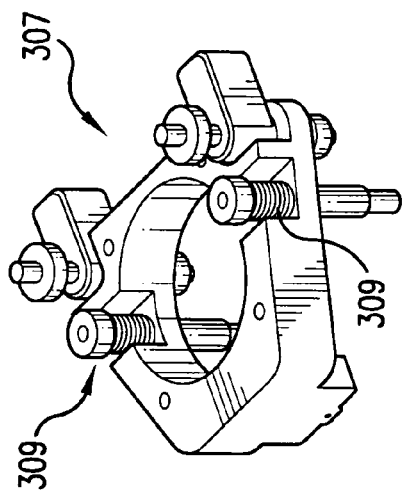
Figure 11D:
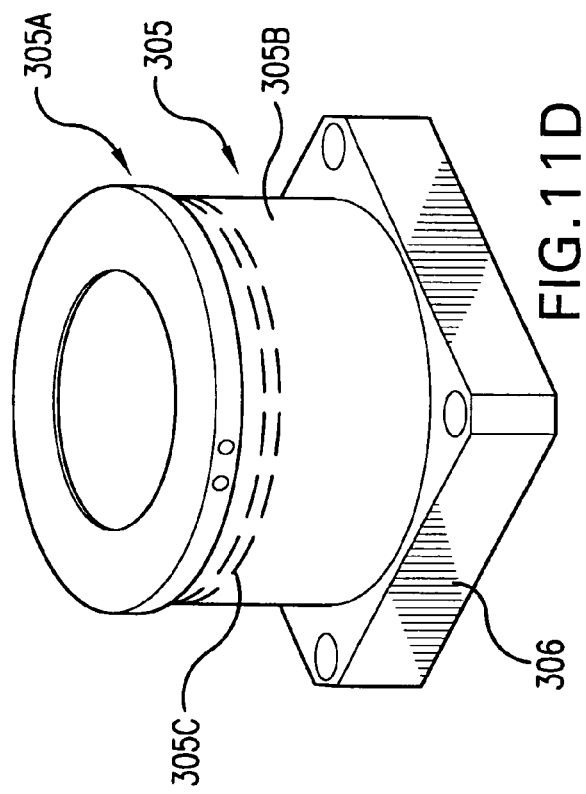
Figure 11C:
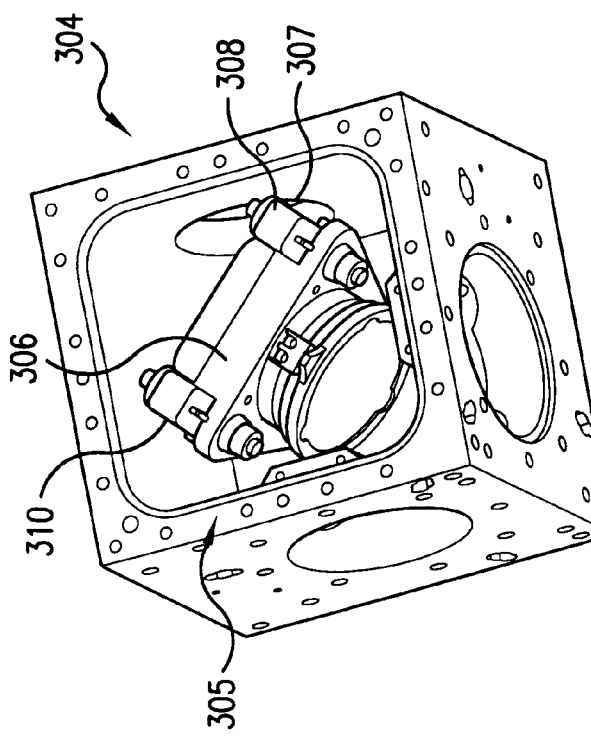

One of the two high speed precision turning mirrors is shown in FIG. 11C. A cut-a-way of this mirror unit is shown at 304. This mirror includes a very fast two-axis piezoelectric driver fast steering mirror 305 with a one milliradian range. Mirror 305 and the base 306 on which it operates is driven by pico motor steering unit 307 comprised of two pico motors 308 and 310 and a pivoting ball joint (not shown). The pico motor steering unit provides a tip-tilt turning range of 9 milliradians.

FIG. 11D is a drawing of the piezo driver unit 305A for driving fast steering mirror 305. The driver unit is comprised of four piezoelectric drive units mounted inside metal casing 305B. A flecture feature 305C cut in the walls of casing 305B permits tightly controlled precise pivoting of the mirror unit for mirror 305.

Figure 11F:
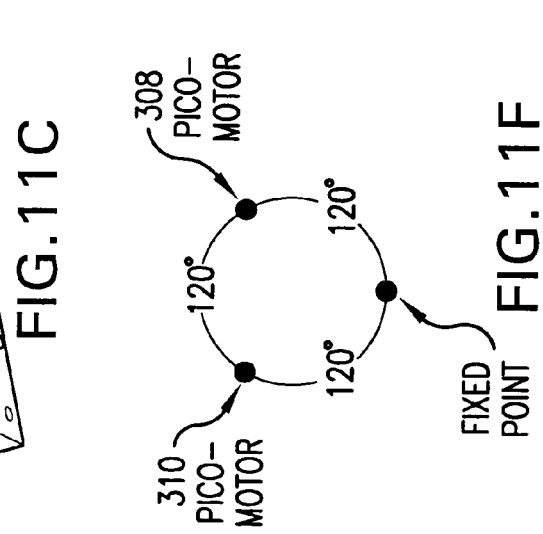

FIG. 11E shows pico motor steering unit 307 and FIG. 11F shows how the two pico motors pivot the unit to provide tip and tilt. The motors operate against spring units 309. Fast steering mirror 305 fits in the circular cavity in unit 307. Fast steering units drivers as shown in FIG. 11C are available from suppliers such as Polytec PI, Inc. with offices in Alburn, Mass.

Figure 11G:
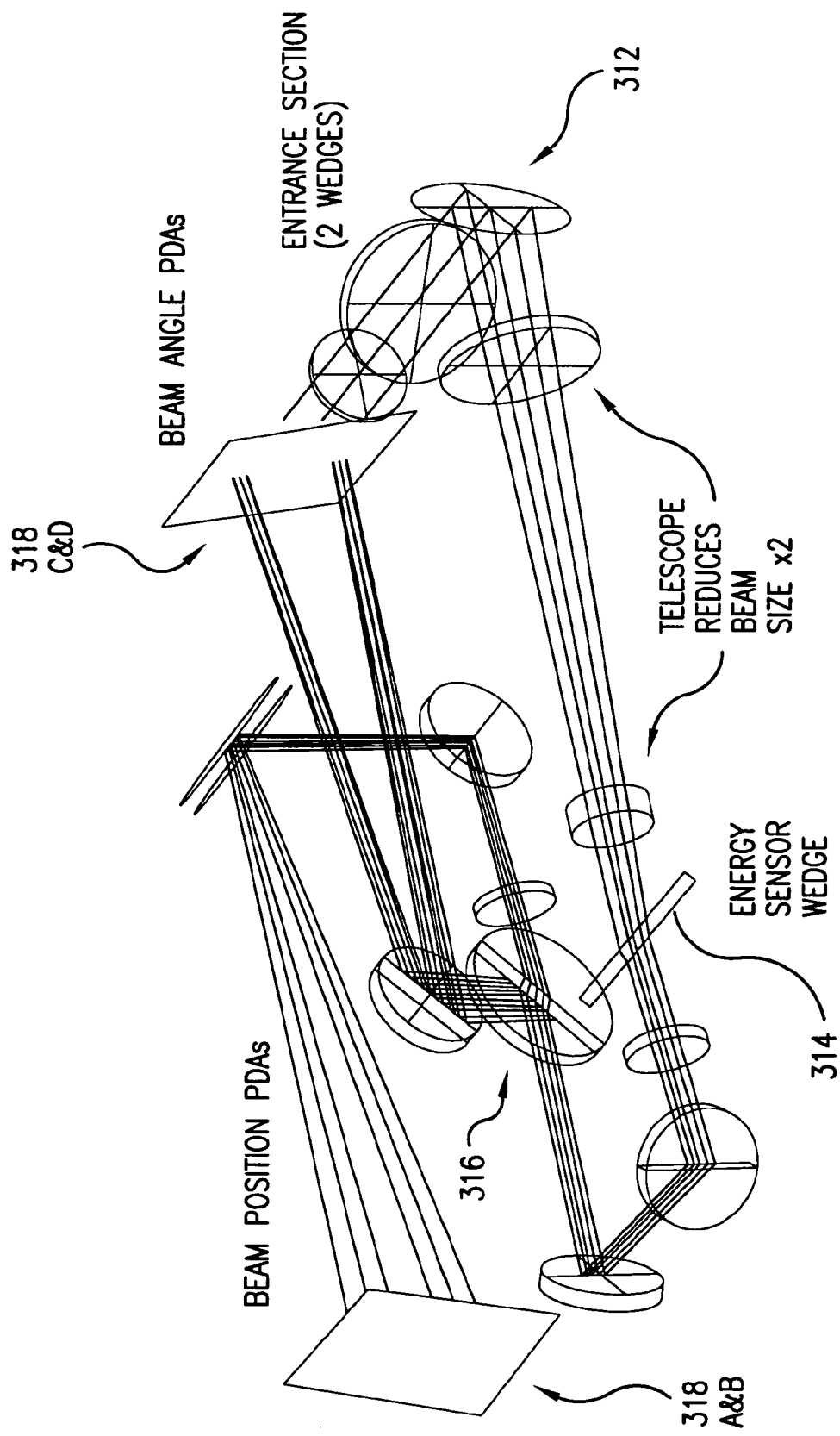
Figure 11H:
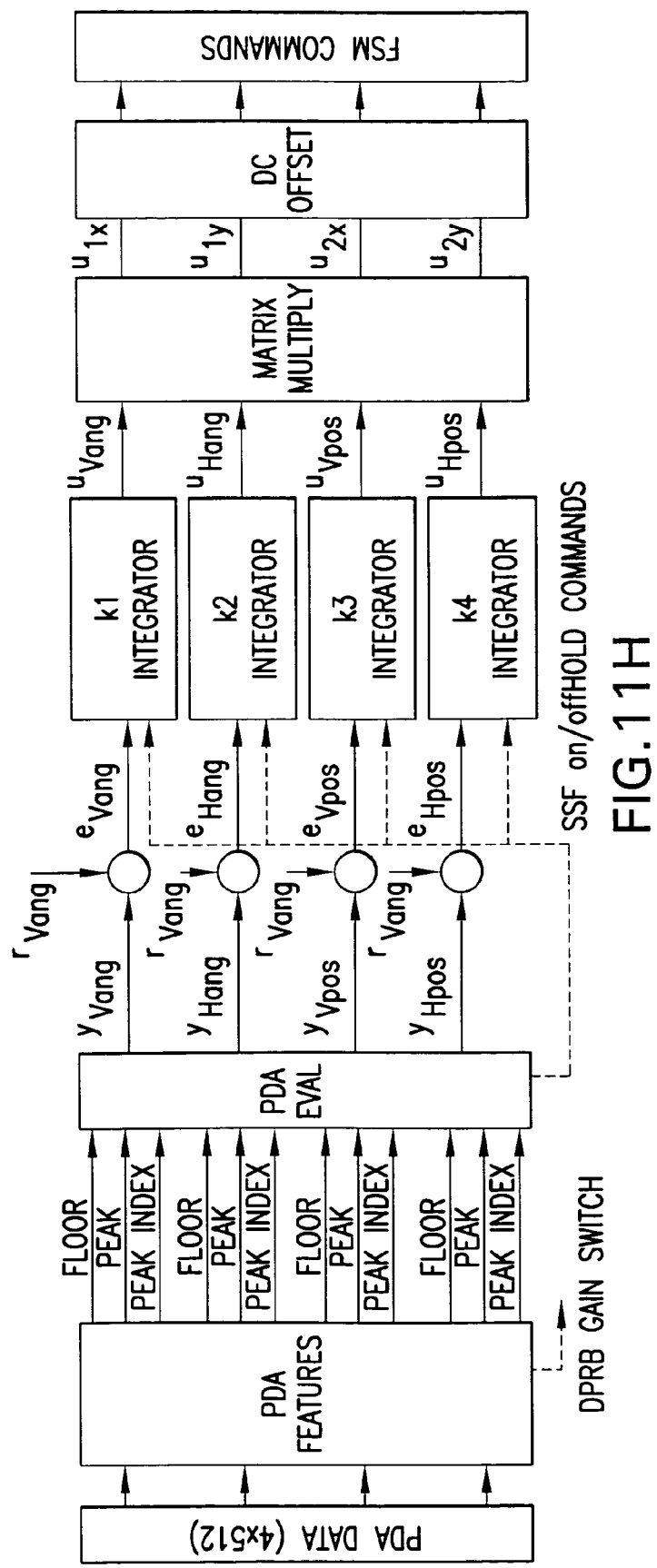
Figure 11I:
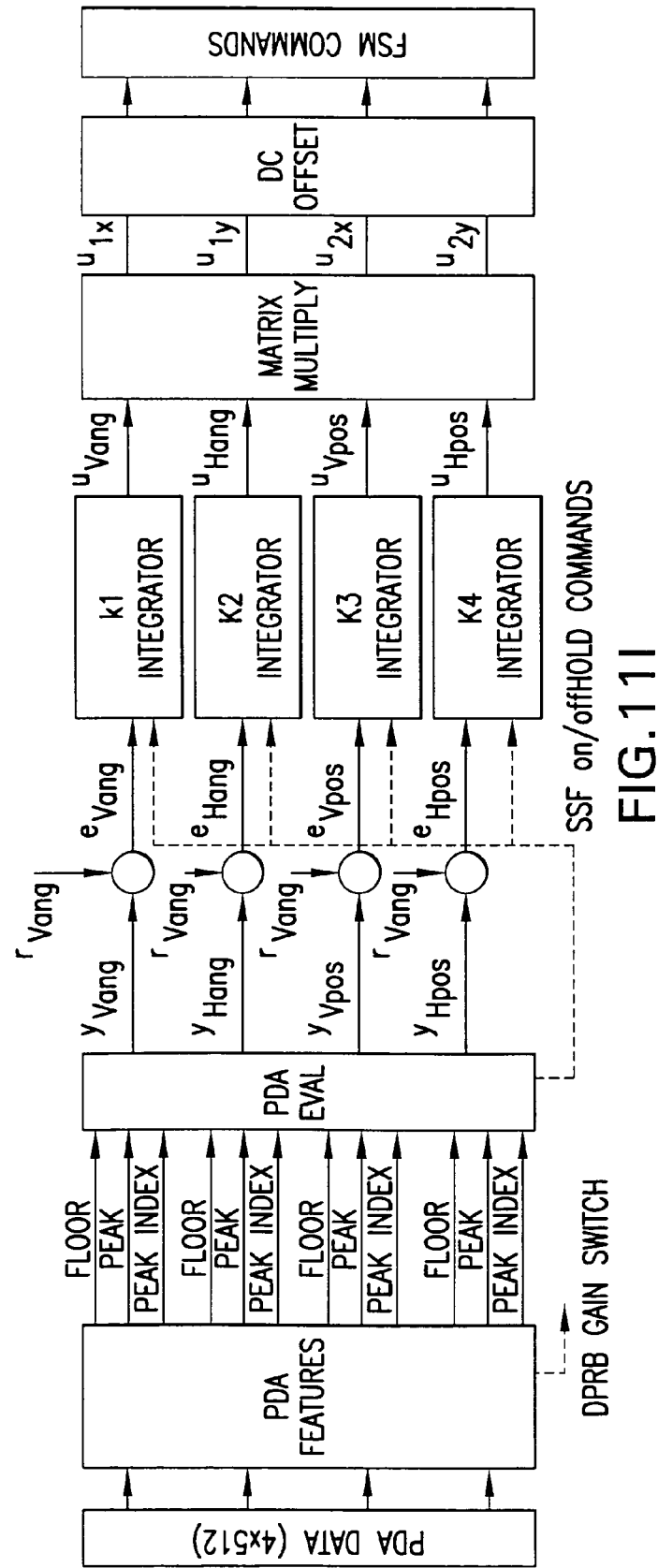
Figure 11J:
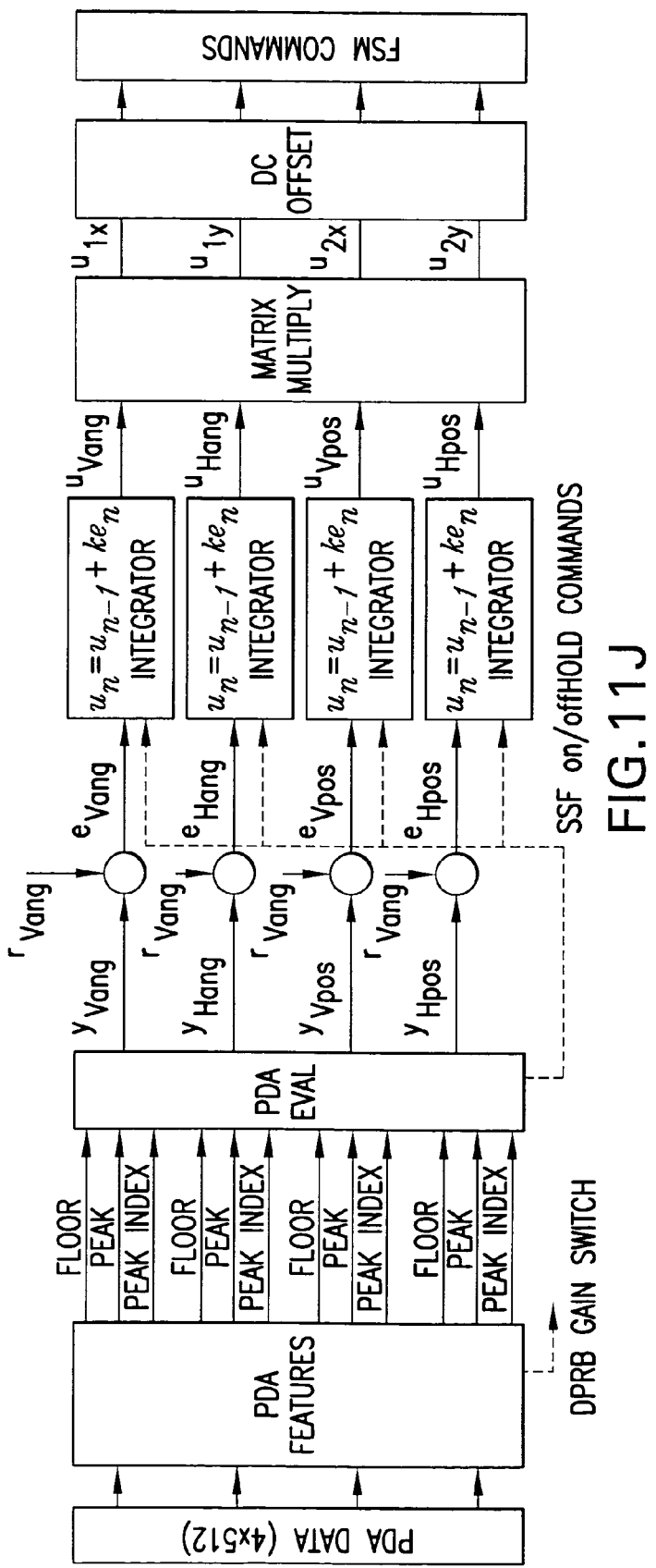

The beam positions and beam directions are monitored by stabilization module 38 at the input port of the stepper machine. Four 512-pixel photodiode arrays are used to monitor the horizontal angle, vertical angle, horizontal position and vertical position. As shown in FIG. 11G, a portion of the laser beam is picked off at 312, reduced in size, split into four separate beams using wedge 314 and beam splitter 316 and then directed to the four photo diode arrays 318A-D. The technique for monitoring the beam position and direction is described above in the section entitled Beam Pointing Control. FIGS. 11H, I and J demonstrate a preferred algorithm for controlling mirrors 40A and 40B based on data collected by the stabilization module 38.

In this preferred algorithm the turning mirror 40A is used to control beam position at the output of the beam delivery unit and turning mirror 40B is used to control the beam angle at the output.

The fast steering mirror provides fast response and the pico motor unit controls long term drift and provides correction when optics are realigned.

Test Data

Figure 11L:
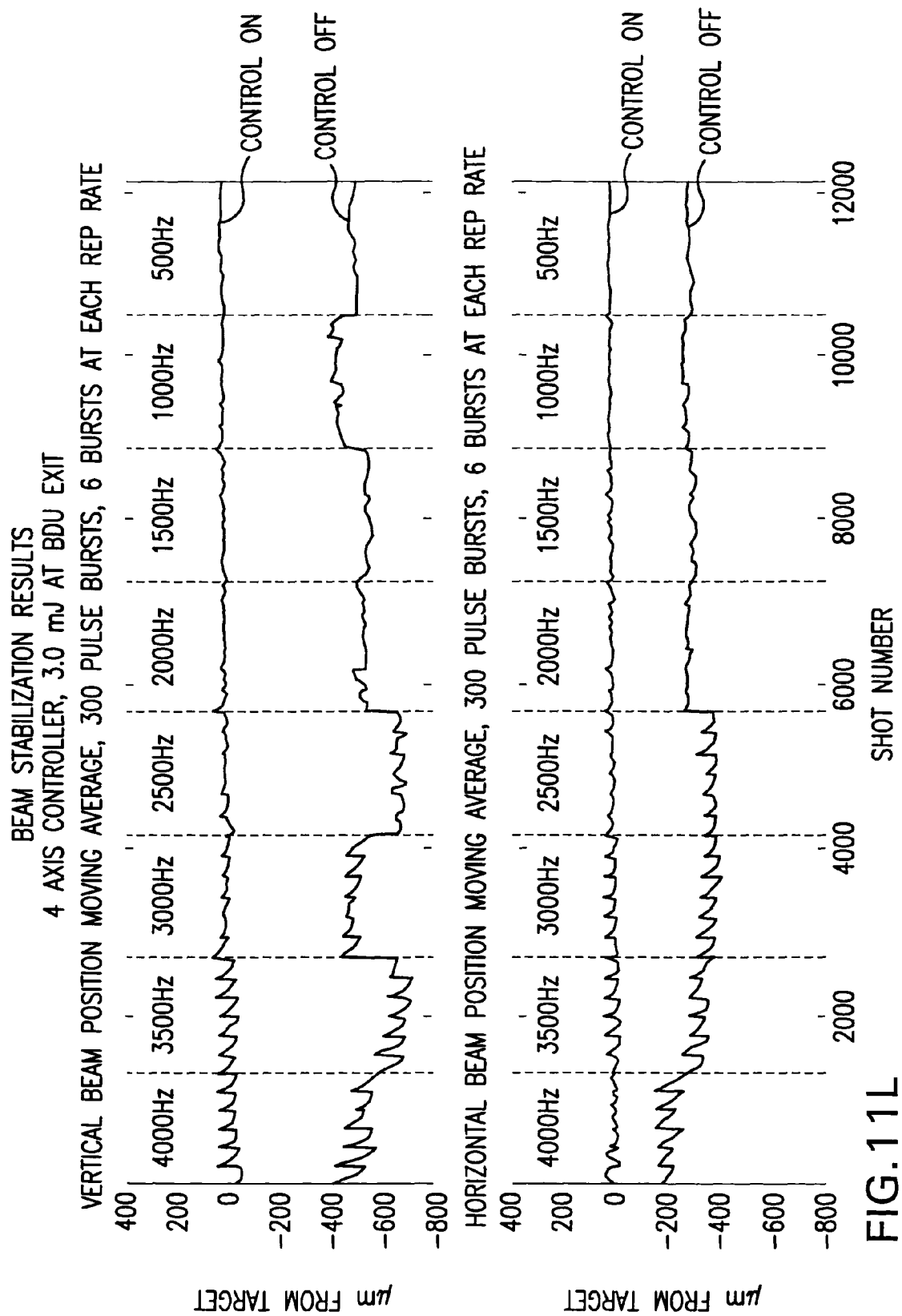
Figure 11M:
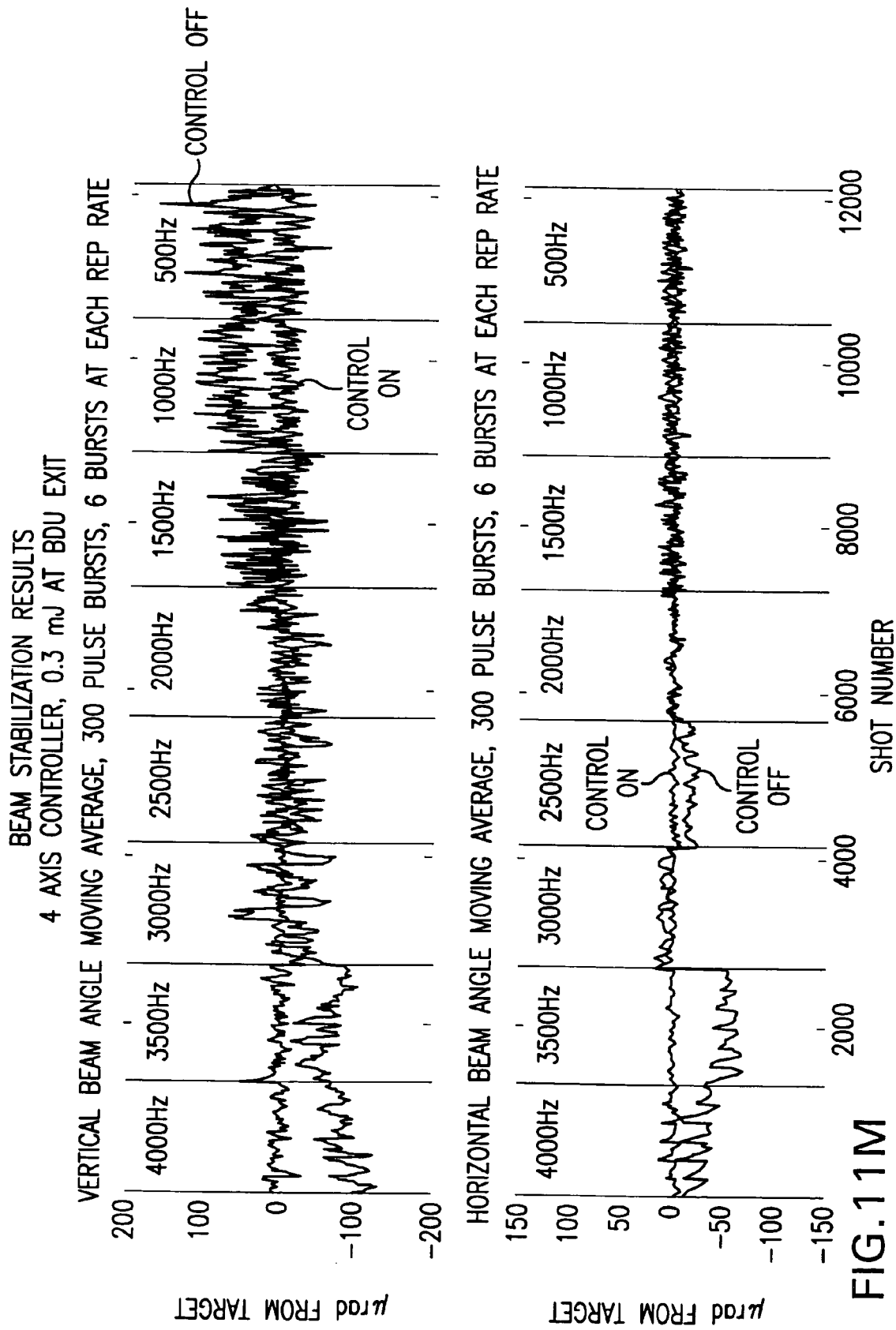
Figure 11N:
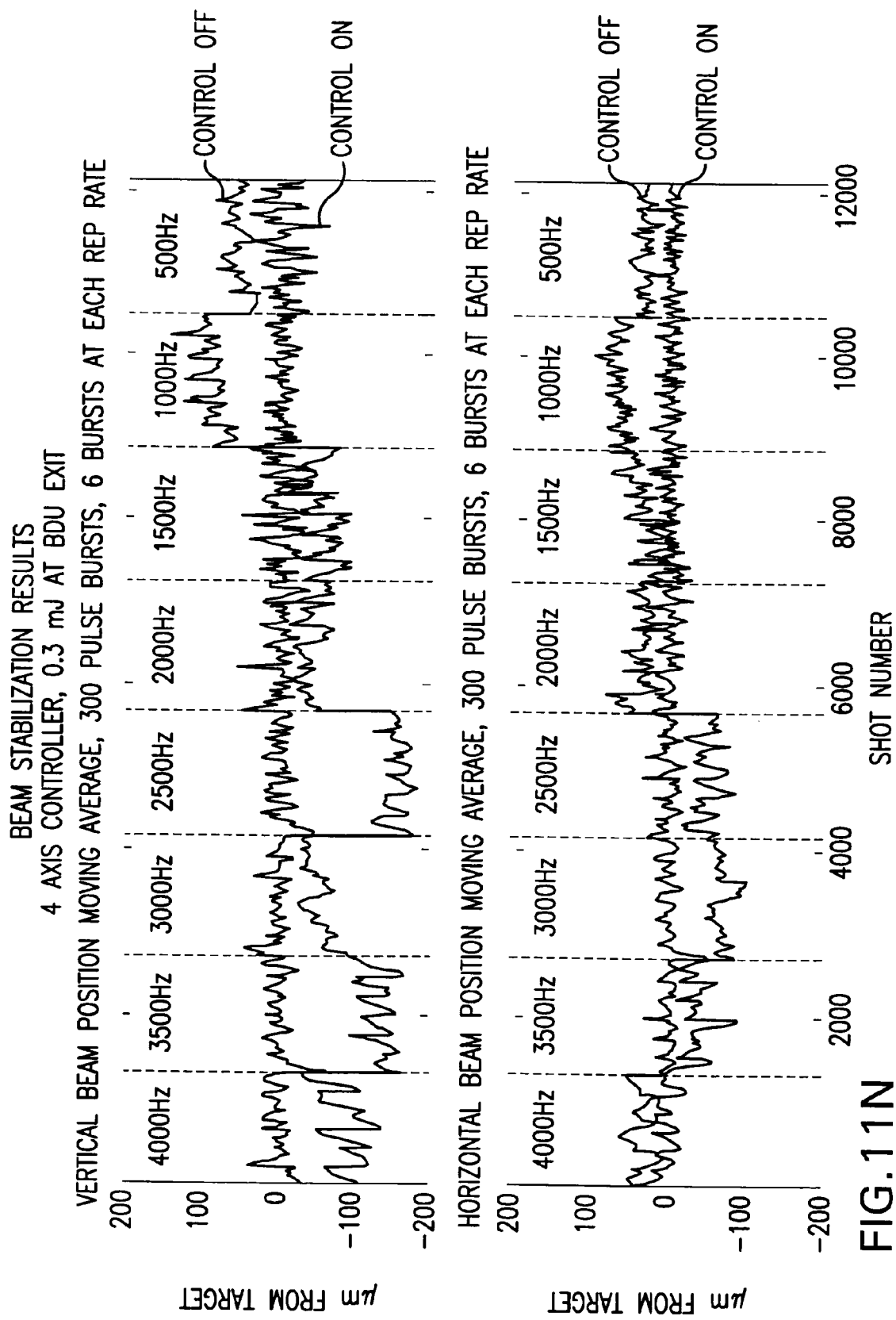
Figure 110:
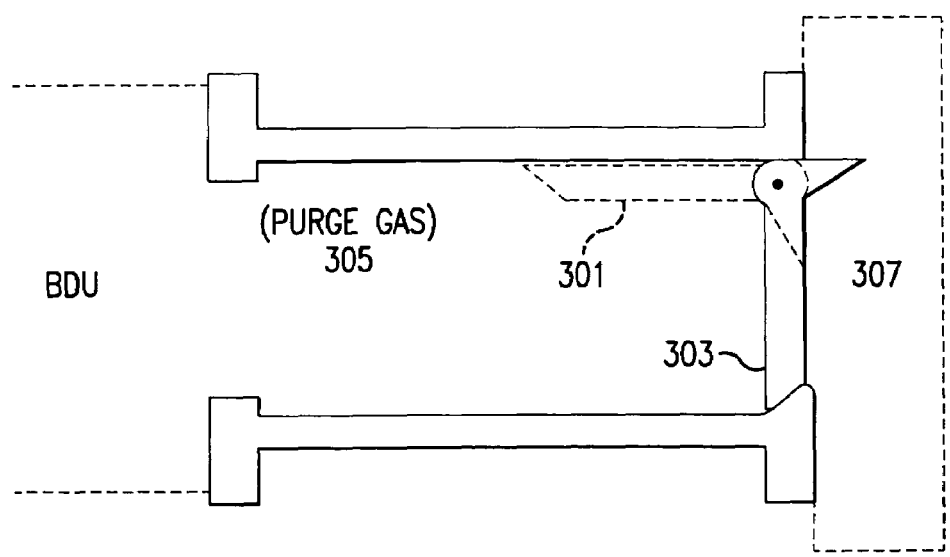

Actual test data showing the excellent performance of this beam delivery unit is shown in FIGS. 11K, 11L, 11M, 11N. FIG. 11K shows angle control with the control on and off. FIG. 11L shows position control. FIG. 11M shows angle control at low output energy and FIG. 11N shows position control at low output energy. In all cases the controlled values are maintained on target well within specifications shown by dashed lines, whereas the uncontrolled values are typically out of specifications.

Various modifications may be made to the present invention without altering its scope. Those skilled in the art will recognize many other possible variations.

For example, although the invention, including the utilization of a beam delivery unit, is described using a MOPA laser configuration, a single chamber laser system such as described in U.S. Pat. No. 6,730,261 could be utilized. For lithography either ArF, KrF or $F_2$ systems could be utilized. This invention may also be applied to uses other than lithography in which other ultraviolet wavelength may be more appropriate. An important improvement here is the addition of equipment to a laser system to deliver an ultraviolet laser beam having desire beam qualities to an input port of a equipment needing an ultraviolet laser light source. Various feedback control arrangements other than those referred to herein could be used.

The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many other laser layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers.

It may be desirable to include additional special features to protect optics from damage due to the high intensity laser pulses. Some of these features (including the addition of $F_2$ or an $F_2$ containing substance in the purge volumes) are described in detail in the parent applications referred to in the first sentence of this application.

Accordingly, the above disclosure is not intended to be limiting and the scope of the invention, should be determined by the appended claims and their legal equivalents.

We claim:

1. A beam delivery unit for directing a laser light beam optical output of a laser light source to a light input location on a laser light using station, comprising:
   A. a beam delivery unit comprising a beam path enclosure structure providing a laser beam path from a beam delivery unit input positioned at the optical output of the laser light source and a beam delivery unit output at the light input location on the laser light using station;
   B. a laser light beam attenuator means positioned in the beam delivery unit between the beam delivery unit input and the beam delivery unit output for attenuating the amount of laser light transmitted through the laser light attenuator, the light beam attenuator means comprising two partial light transmitting means.

2. The apparatus of claim 1, further comprising:
   A. a first light transmitting means is adjustably positioned in the path of the laser light beam to change the angle of incidence of the laser light beam on the first partial light transmitting means, and positioned to transmit a first selected portion of the laser light beam responsive to the angle of incidence of the laser light beam on the first partial light transmitting means; and,
   B. a second partial light transmitting means is adjustably positioned in the path of the laser light transmitted through the first partial light transmitting means and positioned to transmit a second selected portion of the light in the laser light beam and to realign the laser light beam.

3. The apparatus of claim 2, further comprising a positioning means for adjusting the position of the angle of incidence of the laser light beam on each of the first and second pair of partial light transmitting means.

4. The apparatus of claim 3, further comprising the positioning means included means for positioning the first and second partial light transmitting means equal an opposite angles of incidence of the laser light beam.

5. A method of operating a beam delivery unit to direct a laser light beam optical output of a laser light source to a light input location on a laser light using station, comprising:
   A. positioning a beam delivery unit comprising a beam path enclosure structure providing a laser beam path from a beam delivery unit input at the optical output of the laser light source and a beam delivery unit output at the light input location on the laser light using station;
   B. attenuating the amount of laser light reaching the beam delivery output by a preselected amount using a laser light beam attenuator positioned in the beam delivery unit between the beam deliver unit input and the beam delivery unit output, using two partial light transmitting elements.

6. The method of claim 5, further comprising:
   A. positioning a first partial light transmitting element in the path of the laser light beam to change the angle of incidence of the laser light beam on the partial light transmitting element, and to transmit a first selected portion of the laser light beam responsive to the angle of incidence of the laser light beam on the first partial light transmitting element; and,
   B. positioning a second partial light transmitting element in the path of the laser light transmitted through the first partial light transmitting element to transmit a second selected portion of the light in the laser light beam and to realign the laser light beam.

7. The method of claim 6, further comprising adjusting the position of the angle of incidence of the laser light beam on each of the first and second pair of partial light transmitting elements simultaneously.

8. The method of claim 7, further comprising positioning the first and second partial light transmitting elements with equal an opposite angles of incidence of die laser light beam.

* * * * *

UNITED STATES PATENT AND TRADEMARK OFFICE
CERTIFICATE OF CORRECTION

PATENT NO. : 7,230,964 B2
APPLICATION NO. : 10/425361
DATED : June 12, 2007
INVENTOR(S) : Das et al.

Page 1 of 1

It is certified that error appears in the above-identified patent and that said Letters Patent is hereby corrected as shown below:

Title page Item (75) Inventors: delete the name "Plash" and add the name --Palash--.

Signed and Sealed this

Twenty-seventh Day of May, 2008

JON W. DUDAS
*Director of the United States Patent and Trademark Office*